United States Patent
Yamazaki et al.

(10) Patent No.: US 10,181,424 B2
(45) Date of Patent: Jan. 15, 2019

(54) PEELING METHOD AND MANUFACTURING METHOD OF FLEXIBLE DEVICE

(71) Applicant: Semiconductor Energy Laboratory Co., Ltd., Atsugi-shi, Kanagawa-ken (JP)

(72) Inventors: Shunpei Yamazaki, Setagaya (JP); Masataka Sato, Tochigi (JP); Masakatsu Ohno, Utsunomiya (JP); Seiji Yasumoto, Tochigi (JP); Hiroki Adachi, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/477,528

(22) Filed: Apr. 3, 2017

(65) Prior Publication Data

US 2017/0294463 A1 Oct. 12, 2017

(30) Foreign Application Priority Data

Apr. 12, 2016 (JP) .................................. 2016-079826
Apr. 19, 2016 (JP) .................................. 2016-083657

(51) Int. Cl.
*H01L 21/00* (2006.01)
*H01L 21/78* (2006.01)
(Continued)

(52) U.S. Cl.
CPC .... *H01L 21/7806* (2013.01); *H01L 21/02172* (2013.01); *H01L 21/02345* (2013.01);
(Continued)

(58) Field of Classification Search
CPC ......... H01L 21/02488; H01L 21/02554; H01L 21/84; H01L 21/02422; H01L 21/02345;
(Continued)

(56) References Cited

U.S. PATENT DOCUMENTS

| 5,917,221 A | 6/1999 | Takemura |
| 6,198,133 B1 | 3/2001 | Yamazaki et al. |

(Continued)

FOREIGN PATENT DOCUMENTS

| JP | 2008-159935 A | 7/2008 |
| JP | 2010-206040 A | 9/2010 |

(Continued)

*Primary Examiner* — Shouxiang Hu
(74) *Attorney, Agent, or Firm* — Robinson Intellectual Property Law Office; Eric J. Robinson

(57) ABSTRACT

A peeling method at low cost with high mass productivity is provided. An oxide layer is formed over a formation substrate, a first layer is formed over the oxide layer using a photosensitive material, an opening is formed in a portion of the first layer that overlaps with the oxide layer by a photolithography method and the first layer is heated to form a resin layer having an opening, a transistor including an oxide semiconductor in a channel formation region is formed over the resin layer, a conductive layer is formed to overlap with the opening of the resin layer and the oxide layer, the oxide layer is irradiated with light using a laser, and the transistor and the formation substrate are separated from each other.

28 Claims, 27 Drawing Sheets

(51) Int. Cl.
*H01L 21/02* (2006.01)
*H01L 21/47* (2006.01)
*H01L 21/84* (2006.01)
*H01L 21/683* (2006.01)
*H01L 27/12* (2006.01)
*H01L 29/786* (2006.01)
*H01L 27/32* (2006.01)
*H01L 51/00* (2006.01)

(52) U.S. Cl.
CPC .. *H01L 21/02422* (2013.01); *H01L 21/02488* (2013.01); *H01L 21/47* (2013.01); *H01L 21/6835* (2013.01); *H01L 21/84* (2013.01); *H01L 27/124* (2013.01); *H01L 27/1218* (2013.01); *H01L 27/1225* (2013.01); *H01L 27/1266* (2013.01); *H01L 29/7869* (2013.01); *H01L 29/78603* (2013.01); *H01L 27/3262* (2013.01); *H01L 27/3276* (2013.01); *H01L 29/78648* (2013.01); *H01L 51/0097* (2013.01); *H01L 2221/6835* (2013.01); *H01L 2221/68386* (2013.01); *H01L 2227/326* (2013.01)

(58) Field of Classification Search
CPC ............... H01L 21/02172; H01L 21/47; H01L 21/7806; H01L 27/1266; H01L 27/1225; H01L 27/124; H01L 29/7869; H01L 21/6835; H01L 27/1218; H01L 29/78603; H01L 29/78648; H01L 2221/6835; H01L 2221/68386; H01L 27/3262; H01L 2227/326; H01L 27/3276

See application file for complete search history.

(56) References Cited

U.S. PATENT DOCUMENTS

| | | | |
|---|---|---|---|
| 6,700,631 | B1 | 3/2004 | Inoue et al. |
| 7,485,511 | B2 | 2/2009 | Yamada et al. |
| 7,728,326 | B2 | 6/2010 | Yamazaki et al. |
| 7,785,938 | B2 * | 8/2010 | Yamaguchi ......... H01L 21/8221 257/E23.016 |
| 8,435,870 | B2 * | 5/2013 | Mikami .............. H01L 25/0657 257/E21.09 |
| 8,664,658 | B2 | 3/2014 | Yoneda |
| 8,956,891 | B2 | 2/2015 | Chida |
| 2004/0212012 | A1 | 10/2004 | Yamazaki et al. |
| 2004/0232413 | A1 * | 11/2004 | Yamazaki ........... H01L 27/1214 257/43 |
| 2005/0045729 | A1 * | 3/2005 | Yamazaki .......... G06K 19/0704 235/492 |
| 2007/0048970 | A1 | 3/2007 | Suzuki et al. |
| 2012/0273834 | A1 * | 11/2012 | Hatano ................ H01L 51/003 257/99 |
| 2014/0234664 | A1 | 8/2014 | Yasumoto et al. |
| 2014/0339517 | A1 | 11/2014 | Park et al. |
| 2014/0346473 | A1 | 11/2014 | Park et al. |
| 2015/0151531 | A1 | 6/2015 | Ohno |
| 2017/0309731 | A1 | 10/2017 | Yamazaki et al. |

FOREIGN PATENT DOCUMENTS

| | | |
|---|---|---|
| JP | 2015-072361 | 4/2015 |
| JP | 2015-223823 | 12/2015 |
| KR | 2008-0004231 A | 1/2008 |

* cited by examiner

PEELING METHOD AND MANUFACTURING METHOD OF FLEXIBLE DEVICE

BACKGROUND OF THE INVENTION

1. Field of the Invention

One embodiment of the present invention relates to a peeling method and a manufacturing method of a flexible device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

Note that in this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

2. Description of the Related Art

Display devices using organic electroluminescent (EL) elements or liquid crystal elements have been known. Examples of the display device also include a light-emitting device provided with a light-emitting element such as a light-emitting diode (LED), and electronic paper performing display with an electrophoretic method or the like.

The organic EL element generally has a structure in which a layer containing a light-emitting organic compound is provided between a pair of electrodes. When voltage is applied to this element, light emission can be obtained from the light-emitting organic compound. With the use of such an organic EL element, thin, lightweight, high-contrast, and low-power-consumption display devices can be achieved.

In addition, by forming a semiconductor element such as a transistor and a display element such as the organic EL element over a flexible substrate (film), a flexible display device can be provided.

Patent Document 1 discloses a method for manufacturing a flexible display device by irradiating a supporting substrate provided with a heat-resistant resin layer and electronic elements with laser light through a sacrificial layer and peeling the heat-resistant resin layer from a glass substrate.

REFERENCE

Patent Document

[Patent Document 1] Japanese Published Patent Application No. 2015-223823

SUMMARY OF THE INVENTION

An object of one embodiment of the present invention is to provide a novel peeling method. Another object of one embodiment of the present invention is to provide a peeling method at low cost with high mass productivity. Another object of one embodiment of the present invention is to perform peeling using a large-sized substrate.

An object of one embodiment of the present invention is to provide a manufacturing method of a novel flexible device. Another object of one embodiment of the present invention is to provide a highly reliable flexible device. Another object of one embodiment of the present invention is to manufacture a flexible device at low temperatures. Another object of one embodiment of the present invention is to provide a manufacturing method of a flexible device with a simplified manufacturing process. Another object of one embodiment of the present invention is to provide a manufacturing method of a flexible device at low cost with high mass productivity. Another object of one embodiment of the present invention is to manufacture a flexible device using a large-sized substrate.

Note that the descriptions of these objects do not disturb the existence of other objects. One embodiment of the present invention does not necessarily achieve all the objects. Other objects can be derived from the description of the specification, the drawings, and the claims.

(1) One embodiment of the present invention is a peeling method including a step of forming an oxide layer over a formation substrate, a step of forming a first layer over the oxide layer using a photosensitive material, a step of forming an opening in a portion of the first layer that overlaps with the oxide layer by a photolithography method to form a resin layer having an opening, a step of forming a transistor including an oxide semiconductor in a channel formation region over the resin layer, a step of forming a conductive layer to overlap with the opening of the resin layer and the oxide layer, a step of irradiating the oxide layer with light using a laser, and a step of separating the transistor and the formation substrate from each other.

(2) Another embodiment of the present invention is a peeling method including a step of forming an island-shaped oxide layer over a formation substrate, a step of forming a first layer over the formation substrate and the oxide layer using a photosensitive material, a step of forming an opening in a portion of the first layer that overlaps with the oxide layer by a photolithography method to form a resin layer having an opening, a step of forming a transistor including an oxide semiconductor in a channel formation region over the resin layer, a step of forming a conductive layer to overlap with the opening of the resin layer and the oxide layer, a step of irradiating the oxide layer and the resin layer with light using a laser, and a step of separating the transistor and the formation substrate from each other.

In each of the above embodiments (1) and (2), an oxide semiconductor layer or an oxide conductive layer is preferably formed as the oxide layer. The oxide layer preferably has a function of releasing oxygen. Specifically, the oxide layer preferably has a function of releasing oxygen by irradiation with light.

In each of the above embodiments (1) and (2), the first layer is preferably formed using a thermosetting material.

In each of the above embodiments (1) and (2), the first layer is preferably formed to have a thickness greater than or equal to 0.1 μm and less than or equal to 3 μm. In the above embodiment (2), the resin layer is preferably formed to have a thickness greater than a thickness of the oxide layer and less than or equal to 3 μm.

In each of the above embodiments (1) and (2), an oxide layer containing indium, zinc, and any one of aluminum, gallium, yttrium, and tin is preferably formed as the oxide semiconductor layer or the oxide conductive layer.

In each of the above embodiments (1) and (2), a linear laser is preferably used as the laser.

In each of the above embodiments (1) and (2), the conductive layer is preferably formed using the same material and the same fabrication step as an electrode included in the transistor.

In each of the above embodiments (1) and (2), the first layer is preferably formed using a solution having a viscosity of greater than or equal to 5 cP and less than 100 cP.

In each of the above embodiments (1) and (2), the first layer is preferably formed with a spin coater.

In each of the above embodiments (1) and (2), it is preferable that the resin layer be formed by heating the first layer at a first temperature and the transistor be formed at a temperature lower than the first temperature.

In each of the above embodiments (1) and (2), the oxide layer is preferably irradiated with light from the formation substrate side using the laser.

In the above embodiment (2), after the oxide layer is formed, plasma treatment is preferably performed on the oxide layer using a gas containing one or more kinds selected from a rare gas, hydrogen, boron, phosphorus, and nitrogen.

Another embodiment of the present invention is a method for manufacturing a flexible device including a step of exposing the conductive layer by separating the transistor and the formation substrate from each other using the peeling method of the above embodiment (1) or (2), and a step of electrically connecting the conductive layer and a circuit board to each other through the opening of the resin layer.

Another embodiment of the present invention is a method for manufacturing a flexible device including a step of exposing the oxide layer by separating the transistor and the formation substrate from each other using the peeling method of the above embodiment (1), a step of exposing the conductive layer by removing the oxide layer by etching, and a step of electrically connecting the conductive layer and a circuit board to each other through the opening of the resin layer.

Another embodiment of the present invention is a method for manufacturing a flexible device including a step of exposing the oxide layer by separating the transistor and the formation substrate from each other using the peeling method of the above embodiment (2), and a step of electrically connecting the oxide layer and a circuit board to each other.

One embodiment of the present invention can provide a novel peeling method. One embodiment of the present invention can provide a peeling method at low cost with high mass productivity. One embodiment of the present invention can perform peeling using a large-sized substrate.

One embodiment of the present invention can provide a manufacturing method of a novel flexible device. One embodiment of the present invention can provide a highly reliable flexible device. One embodiment of the present invention can manufacture a flexible device at low temperatures. One embodiment of the present invention can provide a manufacturing method of a flexible device with a simplified manufacturing process. One embodiment of the present invention can provide a manufacturing method of a flexible device at low cost with high mass productivity. One embodiment of the present invention can manufacture a flexible device using a large-sized substrate.

Note that the descriptions of these effects do not disturb the existence of other effects. One embodiment of the present invention does not necessarily achieve all the effects.

Other effects can be derived from the description of the specification, the drawings, and the claims.

DETAILED DESCRIPTION OF THE INVENTION

Figure 1A:
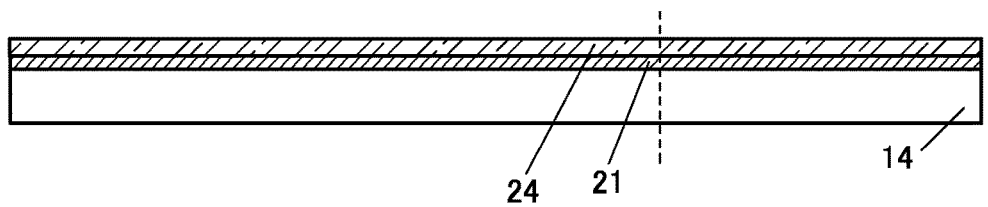
FIGS. 1A to 1E illustrate an example of a manufacturing method of a flexible device.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatch pattern is used for portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". The term "insulating film" can be changed into the term "insulating layer".

Embodiment 1

In this embodiment, a peeling method and a manufacturing method of a flexible device of embodiments of the present invention will be described.

One embodiment of the present invention is a peeling method including a step of forming an oxide layer over a formation substrate, a step of forming a first layer having a thickness greater than or equal to 0.1 μm and less than or equal to 3 μm over the oxide layer using a photosensitive and thermosetting material, a step of forming an opening in a portion of the first layer that overlaps with the oxide layer by a photolithography method and heating the first layer to form a resin layer having an opening, a step of forming a transistor including an oxide semiconductor in a channel formation region over the resin layer, a step of forming a conductive layer to overlap with the opening of the resin layer and the oxide layer, a step of irradiating the oxide layer with light using a laser, and a step of separating the transistor and the formation substrate from each other.

In one embodiment of the present invention, the oxide layer is irradiated with light using a laser. When the oxide layer is heated by absorbing light, oxygen is released in some cases. For example, oxygen might be released in a gaseous state. Oxygen in a gaseous state can form a bubble-form region (or a brittle region or a region with a void) in the oxide layer or on the surface of the oxide layer.

The oxide layer is irradiated with light to release oxygen therefrom. This reduces the adhesion between the oxide layer and the layer in contact with the oxide layer and separation can be performed at the interface between the two layers. Alternatively, by releasing oxygen from the oxide layer, the oxide layer itself is damaged so that separation can be performed in the oxide layer.

In one embodiment of the present invention, an oxide semiconductor is used for the channel formation region of the transistor. With the use of an oxide semiconductor, the maximum process temperature can be lower than that of the case of using low-temperature polysilicon (LTPS).

In the case of using LTPS for the channel formation region of the transistor, the resin layer is required to have heat resistance because a temperature of approximately 500° C. to 550° C. is applied. The resin layer is required to have a larger thickness to relieve the damage in a laser crystallization step.

In contrast, the transistor formed using an oxide semiconductor can be formed at a temperature lower than or equal to 350° C., or even lower than or equal to 300° C. Thus, the resin layer is not required to have high heat resistance. Accordingly, the heat resistant temperature of the resin layer can be low, and the material can be selected from a wide range. Furthermore, the transistor formed using an oxide semiconductor does not need a laser crystallization step; thus, the resin layer can be thinned. Since the resin layer is not required to have high heat resistance and can be thinned, the manufacturing cost of a device can be significantly reduced. An oxide semiconductor is preferably used, in which case the steps can be simplified as compared with the case of using LTPS.

In one embodiment of the present invention, the transistor or the like is formed at a temperature lower than or equal to the allowable temperature limit of the resin layer. Here, the heat resistance of the resin layer can be measured by, for example, a weight loss percentage due to heat, specifically, the 5% weight loss temperature. The 5% weight loss temperature of the resin layer can be lower than or equal to 450° C., lower than or equal to 400° C., lower than 400° C., or lower than 350° C., for example. For example, the transistor is formed at a temperature lower than or equal to 350° C., or even lower than or equal to 300° C.

In one embodiment of the present invention, irradiation with laser light is performed with a linear laser. A laser apparatus used in a manufacturing line for LTPS or the like can be effectively used. The linear laser condenses laser light in a long rectangular shape (the laser light is shaped into a linear laser beam) so that the oxide layer is irradiated with light.

In one embodiment of the present invention, the resin layer is formed using a photosensitive material. With the photosensitive material, a resin layer with a desired shape can be easily formed. For example, an opening can be easily formed in the resin layer.

For example, by forming the opening in the resin layer and disposing a conductive layer to cover the opening and by separating the conductive layer from the formation substrate, an electrode part of which is exposed (also referred to as a rear electrode or a through electrode) can be formed. The electrode can be used as an external connection terminal.

In this embodiment, an example in which the external connection terminal is electrically connected to a circuit board such as a flexible printed circuit (FPC) through the opening formed in the resin layer is shown.

A flexible device can be manufactured using a peeling method of one embodiment of the present invention. A flexible device of one embodiment of the present invention and a manufacturing method thereof will be specifically described below with reference to FIGS. 1A to 1E, FIGS. 2A to 2D, FIGS. 3A and 3B, FIGS. 4A to 4C, FIG. 5, and FIGS. 6A to 6C. Here, an example in which a display device including a transistor and an organic EL element (also referred to as an active matrix organic EL display device) is fabricated as the flexible device will be described. By using a flexible material for a substrate, the display device can be a foldable organic EL display device.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used.

As the thermal CVD method, for example, a metal organic chemical vapor deposition (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a doctor knife, a slit coater, a roll coater, a curtain coater, or a knife coater.

When thin films included in the display device are processed, a lithography method or the like can be used for the processing. Alternatively, island-shaped thin films may be formed by a film formation method using a blocking mask. A nanoimprinting method, a sandblasting method, a lift-off method, or the like may be used for the processing of thin films. Examples of a photolithography method include a method in which a resist mask is formed over a thin film to be processed, the thin film is processed by etching or the like, and the resist mask is removed, and a method in which a photosensitive thin film is formed, exposed to light, and developed to be processed into a desired shape.

In the case of using light in a lithography method, as light used for exposure, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

Manufacturing Method Example 1A

First, an oxide layer 21 is formed over a formation substrate 14 (FIG. 1A).

The formation substrate 14 has rigidity high enough for easy transfer and has resistance to heat applied in the fabrication process. Examples of a material that can be used for the formation substrate 14 include glass, quartz, ceramics, sapphire, a resin, a semiconductor, a metal, and an alloy. Examples of the glass include alkali-free glass, barium borosilicate glass, and aluminoborosilicate glass.

The oxide layer 21 preferably has a function of releasing oxygen when the oxide layer 21 generates heat by absorbing light.

As the oxide layer 21, an oxide layer from which oxygen is released by heating can be used, for example. Examples of the oxide layer include an oxide insulating film, an oxide conductive film (including an oxide semiconductor film having an impurity state), and an oxide semiconductor film. In particular, an oxide semiconductor film and an oxide conductive film are preferred because they have a narrower band gap and are more likely to absorb light than an oxide insulating film such as a silicon oxide film.

For the oxide layer 21, for example, an oxide semiconductor that can be used for a semiconductor layer of a transistor, an oxide conductor that can be used for a conductive layer of a transistor, and an oxide insulator that can be used for an insulating layer of a transistor can be used.

For the oxide layer 21, for example, an In-M-Zn-based oxide film (M is Al, Ga, Y, or Sn) can be used. It is particularly preferable to use an In—Ga—Zn-based oxide film.

Alternatively, an oxide conductive film such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO to which gallium is added, or ITO containing silicon may be used.

An oxide semiconductor is a semiconductor material whose resistance can be controlled by oxygen vacancies in the film of the semiconductor material and/or the concentration of impurities such as hydrogen or water in the film of the semiconductor material. Thus, the resistivity of the oxide semiconductor layer can be controlled by selecting treatment for increasing oxygen vacancies and/or impurity concentration on the oxide semiconductor layer or treatment for reducing oxygen vacancies and/or impurity concentration on the oxide semiconductor layer.

Note that such an oxide conductive layer formed using an oxide semiconductor layer can be referred to as an oxide semiconductor layer having a high carrier density and a low resistance, an oxide semiconductor layer having conductivity, or an oxide semiconductor layer having high conductivity.

The oxide layer 21 can be formed by a plasma CVD method, a sputtering method, or the like under an atmosphere containing oxygen, for example. Alternatively, oxygen ions may be implanted after the formation. In particular, in the case where an oxide semiconductor film is used, a sputtering method under an atmosphere containing oxygen is preferable. After the oxide layer 21 is formed, heat treatment may be performed under an atmosphere containing oxygen in order that the oxide layer 21 contains oxygen.

The thickness of the oxide layer 21 is preferably greater than or equal to 1 nm and less than or equal to 200 nm and further preferably greater than or equal to 5 nm and less than or equal to 100 nm.

Next, a first layer 24 is formed using a photosensitive and thermosetting material (FIG. 1A).

Specifically, the photosensitive and thermosetting material is deposited to a thickness greater than or equal to 0.1 µm and less than or equal to 3 µm.

Figure 1B:
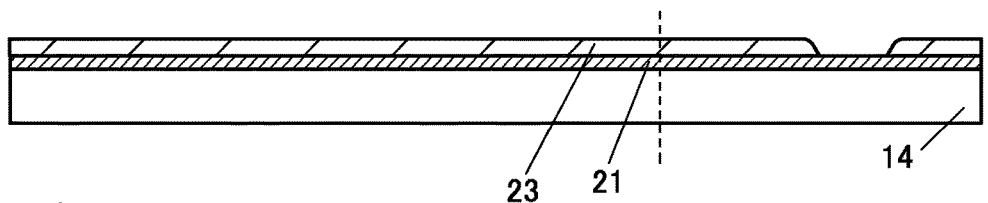

Since the first layer 24 is formed using the photosensitive material in one embodiment of the present invention, part of the first layer 24 can be removed by a photolithography method. Specifically, after the material is deposited, heat treatment (also referred to as pre-baking) for removing a solvent is performed, and then light exposure is performed using a photomask. Next, development is performed, whereby an unnecessary portion can be removed. Then, the first layer 24 processed into a desired shape is heated (heating is also referred to as post-baking) so that the resin layer 23 is formed (FIG. 1B). FIG. 1B illustrates an example in which an opening that reaches the oxide layer 21 is provided in the resin layer 23.

By heating, released gas components (e.g., hydrogen and/or water) in the resin layer 23 can be reduced. It is particularly preferable that heating be performed at a temperature higher than or equal to the formation temperature of each layer formed over the resin layer 23. For example, in the case where the formation temperature of the transistor is below 350° C., the film to be the resin layer 23 is preferably heated at a temperature higher than or equal to 350° C. and lower than or equal to 450° C., further preferably higher than or equal to 350° C. and lower than or equal to 400° C., still further preferably higher than or equal to 350° C. and lower than 400° C., and yet still further preferably higher than or equal to 350° C. and lower than 375° C. Thus, a gas released from the resin layer 23 in the fabrication process of the transistor can be significantly reduced.

In the post-baking, heating is preferably performed at a temperature at which oxygen is less likely to be released from the oxide layer 21. Accordingly, a defect such as peeling of the oxide layer 21 before irradiation with laser light can be prevented and thus a decrease in yield can be suppressed. Note that the steps performed before the oxide layer 21 is irradiated with laser light, which will be described later, are preferably performed at a temperature at which oxygen is less likely to be released from the oxide layer 21.

The resin layer 23 has flexibility. The formation substrate 14 has lower flexibility than the resin layer 23 does.

The resin layer 23 (first layer 24) is preferably formed using a photosensitive polyimide resin (also referred to as a PSPI).

Examples of the photosensitive and thermosetting material which can be used to form the resin layer 23 (first layer 24) include an acrylic resin, an epoxy resin, a polyamide resin, a polyimide-amide resin, a siloxane resin, a benzocyclobutene-based resin, and a phenol resin.

The resin layer 23 (first layer 24) is preferably formed with a spin coater. By a spin coating method, a thin film can be uniformly formed over a large-sized substrate.

The resin layer 23 (first layer 24) is preferably formed using a solution having a viscosity of greater than or equal to 5 cP and less than 500 cP, further preferably greater than or equal to 5 cP and less than 100 cP, and still further preferably greater than or equal to 10 cP and less than or equal to 50 cP. As the viscosity of the solution is lower, application is performed more easily. As the viscosity of the solution is lower, inclusion of air bubbles can be reduced more; thus, a high-quality film can be formed.

The resin layer 23 preferably has a thickness greater than or equal to 0.01 μm and less than 10 μm, further preferably greater than or equal to 0.1 μm and less than or equal to 5 μm, still further preferably greater than or equal to 0.1 μm and less than or equal to 3 μm, and yet still further preferably greater than or equal to 0.5 μm and less than or equal to 1 μm. With a solution having low viscosity, the resin layer 23 having a small thickness can be easily formed. By forming the resin layer 23 thin, the display device can be fabricated at low cost. The display device can be light-weight and thin. The display device can have higher flexibility. The thickness of the resin layer 23 is not limited thereto, and may be greater than or equal to 10 μm. For example, the resin layer 23 may have a thickness greater than or equal to 10 μm and less than or equal to 200 μm. The resin layer 23 having a thickness greater than or equal to 10 μm is favorable because the rigidity of the display device can be increased.

The resin layer 23 (first layer 24) can be formed by dip coating, spray coating, ink jetting, dispensing, screen printing, or offset printing, or with a doctor knife, a slit coater, a roll coater, a curtain coater, or a knife coater.

The resin layer 23 preferably has a thermal expansion coefficient of greater than or equal to 0.1 ppm/° C. and less than or equal to 20 ppm/° C. and further preferably greater than or equal to 0.1 ppm/° C. and less than or equal to 10 ppm/° C. As the resin layer 23 has a lower thermal expansion coefficient, breakage of a transistor or the like which is caused owing to the heating can be further suppressed.

In the case where the resin layer 23 is positioned on the display surface side of the display device, the resin layer 23 preferably has a high visible-light transmitting property.

Figure 1C:
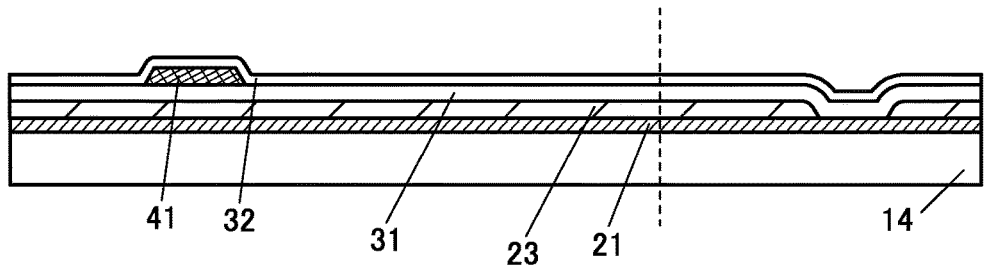

Next, an insulating layer 31 is formed over the resin layer 23 (FIG. 1C).

The insulating layer 31 is formed at a temperature lower than or equal to the allowable temperature limit of the resin layer 23. The insulating layer 31 is preferably formed at a temperature lower than or equal to the heating temperature in the above-described post-baking.

The insulating layer 31 can be used as a barrier layer that prevents diffusion of impurities contained in the resin layer 23 into a transistor and a display element formed later. For example, the insulating layer 31 preferably prevents moisture and the like contained in the resin layer 23 from diffusing into the transistor and the display element when the resin layer 23 is heated. Thus, the insulating layer 31 preferably has a high barrier property.

As the insulating layer 31, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. It is particularly preferable that a silicon nitride film be formed over the resin layer 23 and a silicon oxide film be formed over the silicon nitride film. An inorganic insulating film is preferably formed at high temperatures because the film can have higher density and a higher barrier property as the deposition temperature becomes higher.

In the case of using an inorganic insulating film for the insulating layer 31, the substrate temperature during the deposition is preferably higher than or equal to room temperature (25° C.) and lower than or equal to 350° C. and further preferably higher than or equal to 100° C. and lower than or equal to 300° C.

In the case where the resin layer 23 has an uneven surface, the insulating layer 31 preferably covers the unevenness. The insulating layer 31 may function as a planarization layer that fills the unevenness. It is preferable to use a stack including an organic insulating material and an inorganic insulating material for the insulating layer 31, for example. As the organic insulating material, the resin that can be used for the resin layer 23 can be used.

In the case of using an organic insulating film for the insulating layer 31, a temperature applied to the resin layer 23 at the formation of the insulating layer 31 is preferably higher than or equal to room temperature and lower than or equal to 350° C. and further preferably higher than or equal to room temperature and lower than or equal to 300° C.

Figure 1D:
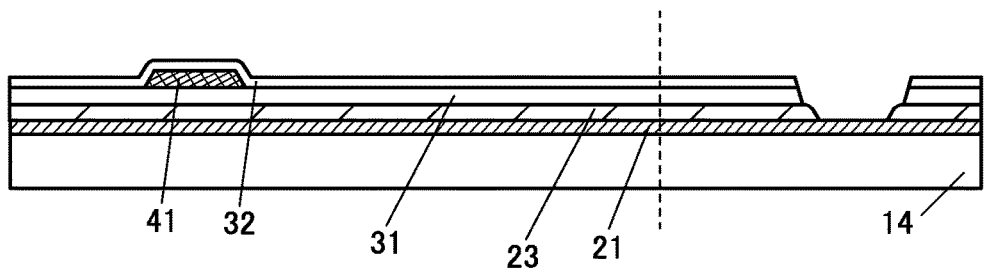
Figure 1E:
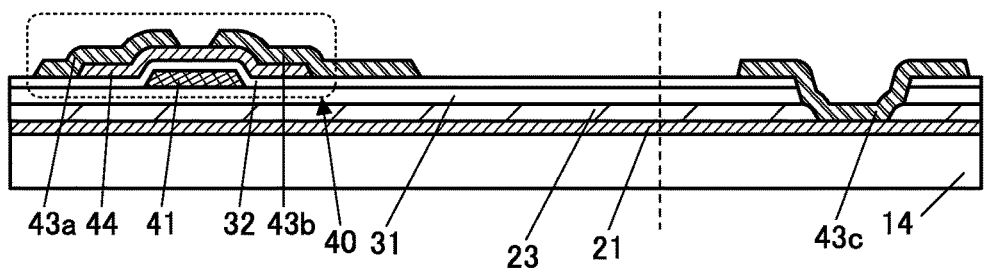

Next, a transistor 40 is formed over the insulating layer 31 (FIGS. 1C to 1E).

There is no particular limitation on the structure of the transistor in the display device. For example, a planar transistor, a staggered transistor, or an inverted staggered transistor may be used. A top-gate transistor or a bottom-gate transistor may be used. Gate electrodes may be provided above and below a channel.

Here, the case where a bottom-gate transistor including an oxide semiconductor layer 44 is formed as the transistor 40 is shown.

In one embodiment of the present invention, an oxide semiconductor is used as a semiconductor of a transistor. A semiconductor material having a wider bandgap and a lower carrier density than silicon is preferably used because an off-state current of the transistor can be reduced.

The transistor 40 is formed at a temperature lower than or equal to the allowable temperature limit of the resin layer 23. In addition, the transistor 40 is preferably formed at a temperature lower than or equal to the heating temperature in the above-described post-baking.

Specifically, first, a conductive layer 41 is formed over the insulating layer 31 (FIG. 1C). The conductive layer 41 can be formed in the following manner: a conductive film is formed, a resist mask is formed, the conductive film is etched, and the resist mask is removed.

The substrate temperature during the deposition of the conductive film is preferably higher than or equal to room temperature and lower than or equal to 350° C. and further preferably higher than or equal to room temperature and lower than or equal to 300° C.

The conductive layers included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO to which gallium is added, or indium tin oxide containing silicon may be used. Alternatively, a semiconductor such as an oxide semiconductor or polycrystalline silicon whose resistance is lowered by containing an impurity element, for example, or silicide such as nickel silicide may be used. A film including graphene may be used as well. The film including graphene can be formed, for example, by reducing a film containing graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

Next, an insulating layer 32 is formed (FIG. 1C). For the insulating layer 32, the description of the inorganic insulating film that can be used for the insulating layer 31 can be referred to.

Next, an opening of the insulating layer 31 and an opening of the insulating layer 32 are provided in a region overlapping with the opening of the resin layer 23 (FIG. 1D). Here, an example in which the openings of the insulating layer 31 and the insulating layer 32 are formed at a time is shown. The opening of the insulating layer 31 and the opening of the insulating layer 32 may be formed in separate steps. For example, the opening of the insulating layer 31 may be formed before the conductive layer 41 is formed. The oxide layer 21 is exposed by providing the openings.

Then, the oxide semiconductor layer 44 is formed (FIG. 1E). The oxide semiconductor layer 44 can be formed in the following manner: an oxide semiconductor film is formed, a resist mask is formed, the oxide semiconductor film is etched, and the resist mask is removed.

The substrate temperature during the deposition of the oxide semiconductor film is preferably lower than or equal to 350° C., further preferably higher than or equal to room temperature and lower than or equal to 200° C., and still further preferably higher than or equal to room temperature and lower than or equal to 130° C.

The oxide semiconductor film can be formed using one or both of an inert gas and an oxygen gas. Note that there is no particular limitation on the percentage of oxygen flow rate (partial pressure of oxygen) at the time of forming the oxide semiconductor film. To fabricate a transistor having high field-effect mobility, however, the percentage of oxygen flow rate (partial pressure of oxygen) at the time of forming the oxide semiconductor film is preferably higher than or equal to 0% and lower than or equal to 30%, further preferably higher than or equal to 5% and lower than or equal to 30%, and still further preferably higher than or equal to 7% and lower than or equal to 15%.

The oxide semiconductor film preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor preferably contains a stabilizer in addition to In, Zn, and M.

Examples of stabilizers are, in addition to the above-described metals that can be used as M, lanthanoids such as lanthanum, cerium, praseodymium, neodymium, samarium, europium, gadolinium, terbium, dysprosium, holmium, erbium, thulium, ytterbium, and lutetium.

As an oxide semiconductor, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components and there is no limitation on the ratio of In:Ga:Zn. Furthermore, a metal element in addition to In, Ga, and Zn may be contained.

The semiconductor layer and the conductive layer may include the same metal elements contained in the above oxides. The use of the same metal elements for the semiconductor layer and the conductive layer can reduce the manufacturing cost. For example, the use of metal oxide targets with the same metal composition can reduce the manufacturing cost. In addition, the same etching gas or the same etchant can be used in processing the semiconductor layer and the conductive layer. Note that even when the semiconductor layer and the conductive layer include the same metal elements, they have different compositions in some cases. For example, a metal element in a film is released during the fabrication process of the transistor and the capacitor, which might result in different metal compositions.

The energy gap of the oxide semiconductor is preferably 2 eV or more, further preferably 2.5 eV or more, and still further preferably 3 eV or more. The use of such an oxide semiconductor having a wide energy gap leads to a reduction in off-state current of a transistor.

In the case where the oxide semiconductor is an In-M-Zn-based oxide, it is preferable that the atomic ratio of metal elements of a sputtering target used to deposit a film of the In-M-Zn-base oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the formed semiconductor layer varies from the above atomic ratios of metal elements of the sputtering targets in a range of ±40%.

The oxide semiconductor film can be formed by a sputtering method. Alternatively, a PLD method, a PECVD method, a thermal CVD method, an ALD method, a vacuum evaporation method, or the like may be used.

Next, a conductive layer 43a, a conductive layer 43b, and a conductive layer 43c are formed (FIG. 1E). The conductive layers 43a, 43b, and 43c can be formed in the following manner: a conductive film is formed, a resist mask is formed, the conductive film is etched, and the resist mask is removed. The conductive layers 43a and 43b are connected to the oxide semiconductor layer 44. The conductive layer 43c is connected to the oxide layer 21 through the openings provided in the resin layer 23, the insulating layer 31, and the insulating layer 32.

Note that during the processing of the conductive layers 43a and 43b, the oxide semiconductor layer 44 might be partly etched to be thin in a region not covered by the resist mask.

The substrate temperature during the deposition of the conductive film is preferably higher than or equal to room temperature and lower than or equal to 350° C. and further preferably higher than or equal to room temperature and lower than or equal to 300° C.

In the above manner, the transistor 40 can be formed (FIG. 1E). In the transistor 40, part of the conductive layer 41 functions as a gate, part of the insulating layer 32 functions as a gate insulating layer, and the conductive layers 43a and 43b function as a source and a drain.

Figure 2A:
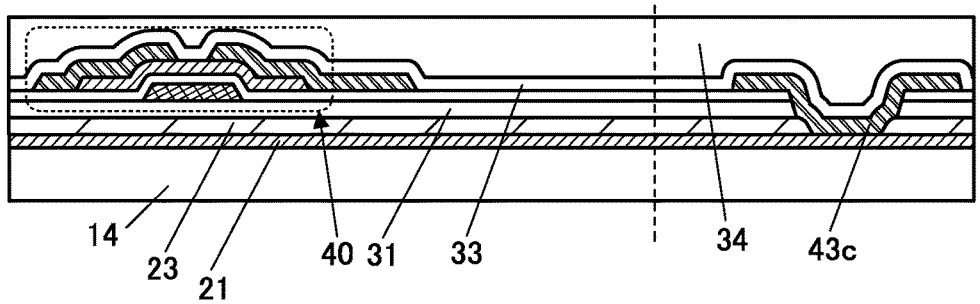
FIGS. 2A to 2D illustrate an example of a manufacturing method of a flexible device.

Next, an insulating layer 33 that covers the transistor 40 is formed (FIG. 2A). The insulating layer 33 can be formed in a manner similar to that of the insulating layer 31.

It is preferable to use an oxide insulating film, such as a silicon oxide film or a silicon oxynitride film, formed at a low temperature in the above range in an atmosphere containing oxygen for the insulating layer 33. An insulating film with low oxygen diffusibility and oxygen permeability, such as a silicon nitride film, is preferably stacked over the silicon oxide film or the silicon oxynitride film. The oxide insulating film formed at low temperatures in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the oxide semiconductor layer 44. As a result, oxygen vacancies in the oxide semiconductor layer 44 can be filled and defects at the interface between the oxide semiconductor layer 44 and the insulating layer 33 can be repaired, leading to a reduction in defect levels. Accordingly, an extremely highly reliable flexible device can be fabricated.

Through the above steps, the insulating layer 31, the transistor 40, and the insulating layer 33 can be formed over the resin layer 23 (FIG. 2A).

If the formation substrate 14 and the transistor 40 are separated from each other at this stage by a method described later, a flexible device including no display element can be fabricated. Forming the transistor 40 or forming a capacitor, a resistor, a wiring, and the like in addition to the transistor 40, and separating the formation substrate 14 and the transistor 40 from each other by the method described later can provide a flexible device including a semiconductor circuit, for example.

Then, an insulating layer 34 is formed over the insulating layer 33 (FIG. 2A). The display element is formed on the insulating layer 34 in a later step; thus, the insulating layer 34 preferably functions as a planarization layer. For the insulating layer 34, the description of the organic insulating film or the inorganic insulating film that can be used for the insulating layer 31 can be referred to.

The insulating layer 34 is formed at a temperature lower than or equal to the allowable temperature limit of the resin layer 23. The insulating layer 34 is preferably formed at a temperature lower than or equal to the heating temperature in the above-described post-baking.

In the case of using an organic insulating film for the insulating layer 34, a temperature applied to the resin layer 23 at the formation of the insulating layer 34 is preferably higher than or equal to room temperature and lower than or equal to 350° C. and further preferably higher than or equal to room temperature and lower than or equal to 300° C.

In the case of using an inorganic insulating film for the insulating layer 34, the substrate temperature during the deposition is preferably higher than or equal to room temperature and lower than or equal to 350° C. and further preferably higher than or equal to 100° C. and lower than or equal to 300° C.

Next, an opening that reaches the conductive layer 43b is formed in the insulating layer 34 and the insulating layer 33.

Figure 2B:
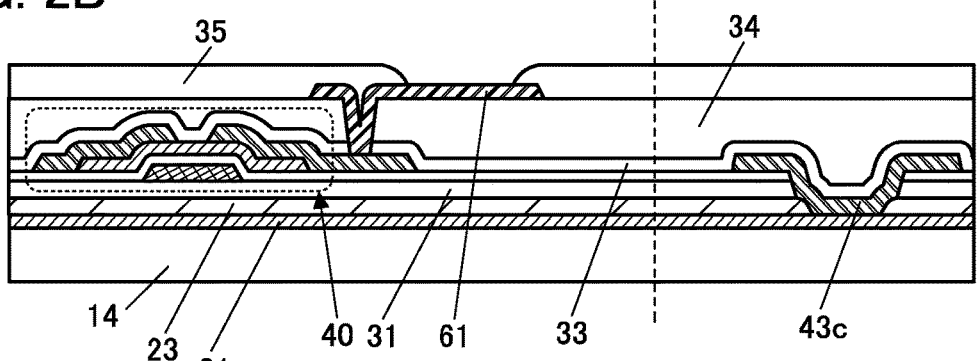

After that, a conductive layer 61 is formed (FIG. 2B). Part of the conductive layer 61 functions as a pixel electrode of a display element 60. The conductive layer 61 can be formed in the following manner: a conductive film is formed, a resist mask is formed, the conductive film is etched, and the resist mask is removed.

The conductive layer 61 is formed at a temperature lower than or equal to the allowable temperature limit of the resin layer 23. The conductive layer 61 is preferably formed at a temperature lower than or equal to the heating temperature in the above-described post-baking.

The substrate temperature during the deposition of the conductive film is preferably higher than or equal to room temperature and lower than or equal to 350° C. and further preferably higher than or equal to room temperature and lower than or equal to 300° C.

Subsequently, an insulating layer 35 that covers an end portion of the conductive layer 61 is formed (FIG. 2B). For the insulating layer 35, the description of the organic insulating film or the inorganic insulating film that can be used for the insulating layer 31 can be referred to.

The insulating layer 35 is formed at a temperature lower than or equal to the allowable temperature limit of the resin layer 23. The insulating layer 35 is preferably formed at a temperature lower than or equal to the heating temperature in the above-described post-baking.

In the case of using an organic insulating film for the insulating layer 35, a temperature applied to the resin layer 23 at the formation of the insulating layer 35 is preferably higher than or equal to room temperature and lower than or equal to 350° C. and further preferably higher than or equal to room temperature and lower than or equal to 300° C.

In the case of using an inorganic insulating film for the insulating layer 35, the substrate temperature during the deposition is preferably higher than or equal to room temperature and lower than or equal to 350° C. and further preferably higher than or equal to 100° C. and lower than or equal to 300° C.

Figure 2C:
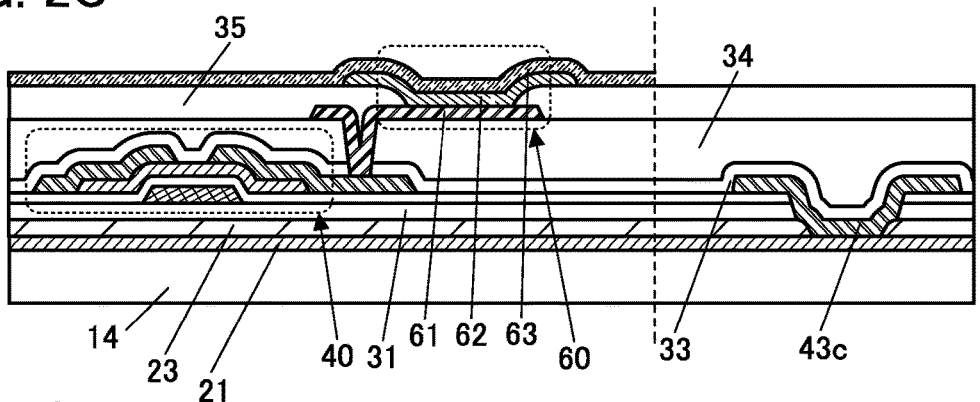

Then, an EL layer 62 and a conductive layer 63 are formed (FIG. 2C). Part of the conductive layer 63 functions as a common electrode of the display element 60.

The EL layer 62 can be formed by an evaporation method, a coating method, a printing method, a discharge method, or the like. In the case where the EL layer 62 is formed for each individual pixel, an evaporation method using a blocking mask such as a metal mask, an ink-jet method, or the like can be used. In the case of sharing the EL layer 62 by some pixels, an evaporation method not using a metal mask can be used.

Either a low molecular compound or a high molecular compound can be used for the EL layer 62, and an inorganic compound may also be included.

The conductive layer 63 can be formed by an evaporation method, a sputtering method, or the like.

The EL layer 62 and the conductive layer 63 are each formed at a temperature lower than or equal to the allowable temperature limit of the resin layer 23. The EL layer 62 and the conductive layer 63 are each preferably formed at a temperature lower than or equal to the heating temperature in the above-described post-baking. The conductive layer 63 is formed at a temperature lower than or equal to the allowable temperature limit of the EL layer 62.

Specifically, the EL layer 62 and the conductive layer 63 are each preferably formed at a temperature higher than or equal to room temperature and lower than or equal to 350° C. and further preferably higher than or equal to room temperature and lower than or equal to 300° C.

In the above manner, the display element 60 can be obtained (FIG. 2C). In the display element 60, the conductive layer 61 part of which functions as a pixel electrode, the EL layer 62, and the conductive layer 63 part of which functions as a common electrode are stacked.

Although a top-emission light-emitting element is formed as the display element 60 here, one embodiment of the present invention is not limited thereto.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

Figure 2D:
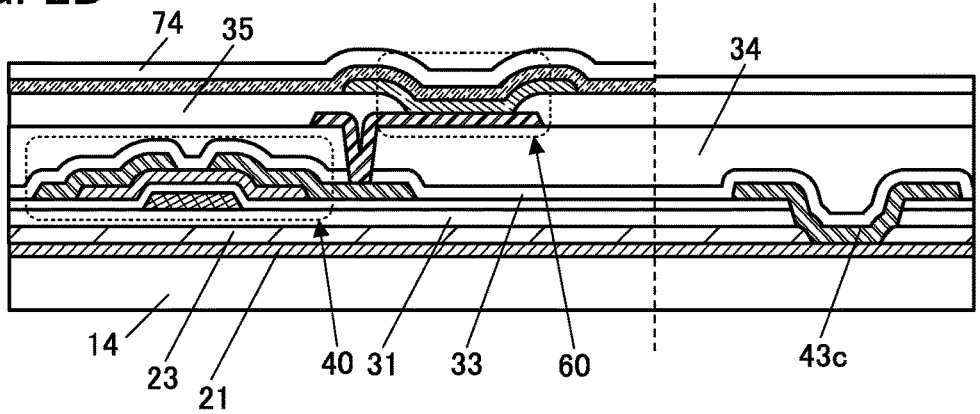

Next, an insulating layer 74 is formed so as to cover the conductive layer 63 (FIG. 2D). The insulating layer 74 functions as a protective layer that suppresses diffusion of impurities such as water into the display element 60. The display element 60 is sealed with the insulating layer 74.

The insulating layer 74 is formed at a temperature lower than or equal to the allowable temperature limit of the resin layer 23 and lower than or equal to the allowable temperature limit of the display element 60. The insulating layer 74 is preferably formed at a temperature lower than or equal to the heating temperature in the above-described post-baking.

The insulating layer 74 preferably includes an inorganic insulating film with a high barrier property that can be used for the insulating layer 31. A stack including an inorganic insulating film and an organic insulating film can also be used.

Figure 3A:
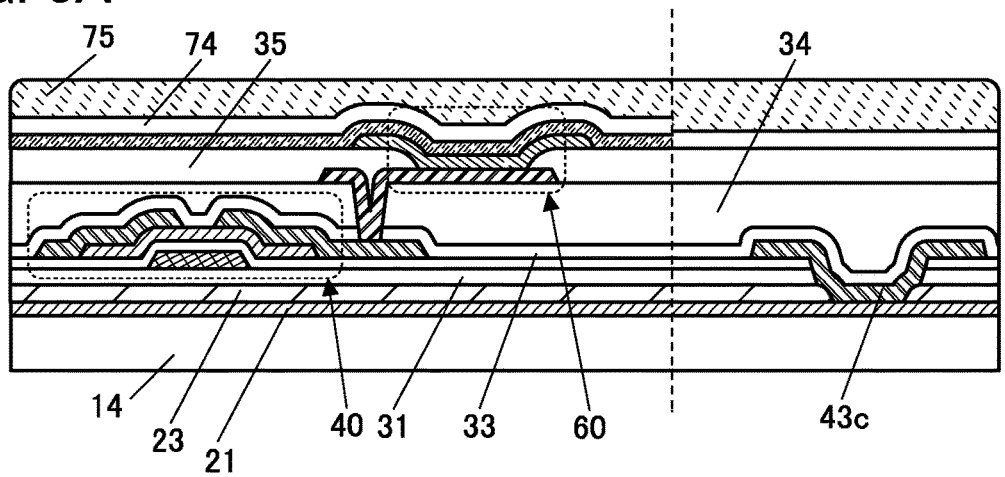
FIGS. 3A and 3B each illustrate an example of a manufacturing method of a flexible device.

Then, a protective layer 75 is formed over the insulating layer 74 (FIG. 3A). The protective layer 75 can be used as a layer positioned on the outermost surface of a display device 10. The protective layer 75 preferably has a high visible-light transmitting property.

The above-described organic insulating film that can be used for the insulating layer 31 is preferably used for the protective layer 75 because damage or crack of the surface of the display device can be suppressed. In the protective layer 75, the organic insulating film and a hard coat layer (e.g., a silicon nitride layer) for protecting a surface from damage or the like, a layer formed of a material that can disperse pressure (e.g., an aramid resin layer), or the like may be stacked.

Figure 3B:
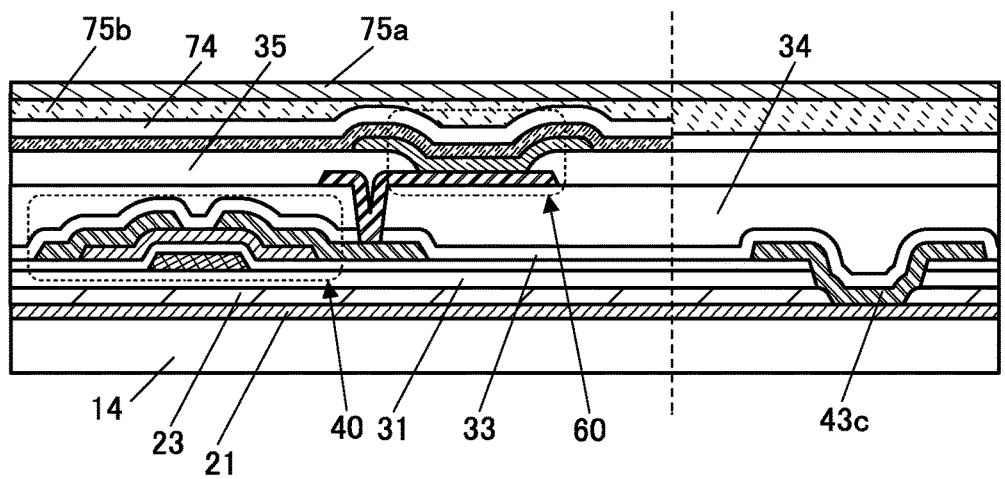

FIG. 3B illustrates an example in which a substrate 75a is attached to the insulating layer 74 with a bonding layer 75b. Examples of the substrate 75a include a resin and the like. The substrate 75a preferably has flexibility.

As the bonding layer 75b, any of a variety of curable adhesives such as a reactive curable adhesive, a thermosetting adhesive, an anaerobic adhesive, and a photocurable adhesive such as an ultraviolet curable adhesive can be used. Alternatively, an adhesive sheet or the like may be used.

For the substrate 75a, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example.

Figure 4A:
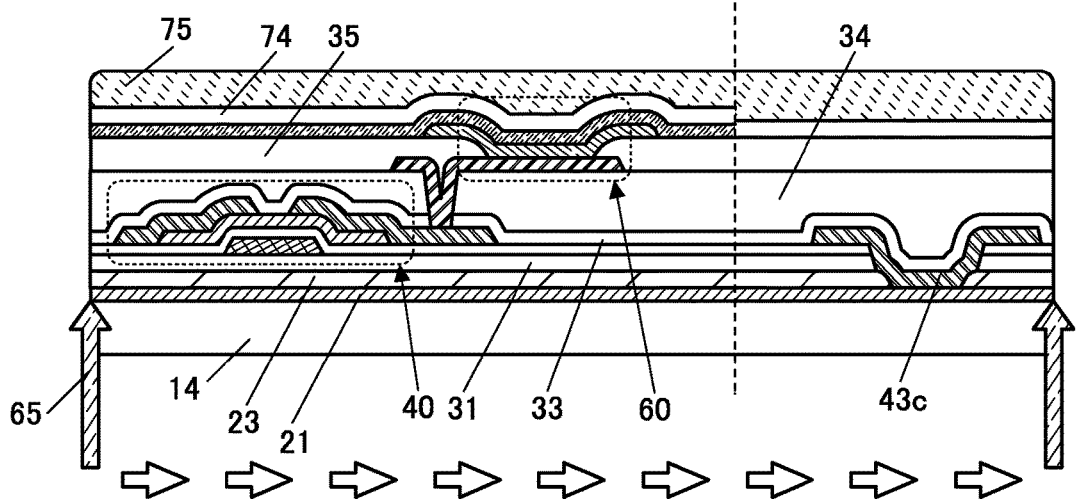
FIGS. 4A to 4C illustrate examples of a manufacturing method of a flexible device.

Next, the oxide layer 21 is irradiated with laser light 65 through the formation substrate 14 (FIG. 4A). The laser light 65 is, for example, a linear laser beam with which scanning is performed from the left side to the right side in FIG. 4A, and the major axis is perpendicular to the scanning direction and the incident direction (from bottom to top).

By irradiation with the laser light 65, the oxide layer 21 is heated and oxygen is released from the oxide layer 21 in some cases. At this time, oxygen is released in a gaseous state, for example. The released gas remains near the interface between the oxide layer 21 and the resin layer 23 (the conductive layer 43c in the opening of the resin layer 23) or near the interface between the oxide layer 21 and the formation substrate 14; thus, the force of peeling is generated therebetween. Consequently, the adhesion between the oxide layer 21 and the resin layer 23 (the conductive layer 43c in the opening of the resin layer 23) or the adhesion between the oxide layer 21 and the formation substrate 14 is reduced and a state where peeling is easily performed can be formed.

Part of the oxygen released from the oxide layer 21 remains in the oxide layer 21 in some cases. Thus, the oxide layer 21 is embrittled and separation is likely to occur inside the oxide layer 21 in some cases.

As the laser light 65, light having a wavelength by which at least part of the laser light 65 is transmitted through the formation substrate 14 and absorbed by the oxide layer 21 is selected. The laser light 65 is preferably light having a wavelength which is absorbed by the resin layer 23. The laser light 65 is preferably light having a wavelength range from visible light to ultraviolet light. For example, light having a wavelength of greater than or equal to 200 nm and less than or equal to 400 nm, preferably greater than or equal to 250 nm and less than or equal to 350 nm, can be used. In particular, an excimer laser having a wavelength of 308 nm is preferably used because the productivity is increased. The excimer laser is preferable because the excimer laser can be used also for laser crystallization of LTPS, so that the existing LTPS production line device can be used and newly capital investment is not necessary. Alternatively, a solid-state UV laser (also referred to as a semiconductor UV laser), such as a UV laser having a wavelength of 355 nm which is the third harmonic of an Nd:YAG laser, may be used. A solid-state laser is preferable because the solid-state laser does not use a gas and thus the running cost can be reduced to approximately ⅓ of the case of an excimer laser. Further alternatively, a pulsed laser such as a picosecond laser may be used.

In the case where linear laser light is used as the laser light 65, the laser light 65 is scanned and a region to be peeled is entirely irradiated with the laser light 65 by relatively moving the formation substrate 14 and a light source.

The resin layer 23 might absorb part of the laser light 65. Thus, an element such as a transistor is irradiated with the laser light 65 which is transmitted through the oxide layer 21 and an adverse effect on the characteristics of the element can be suppressed.

Figure 4B:
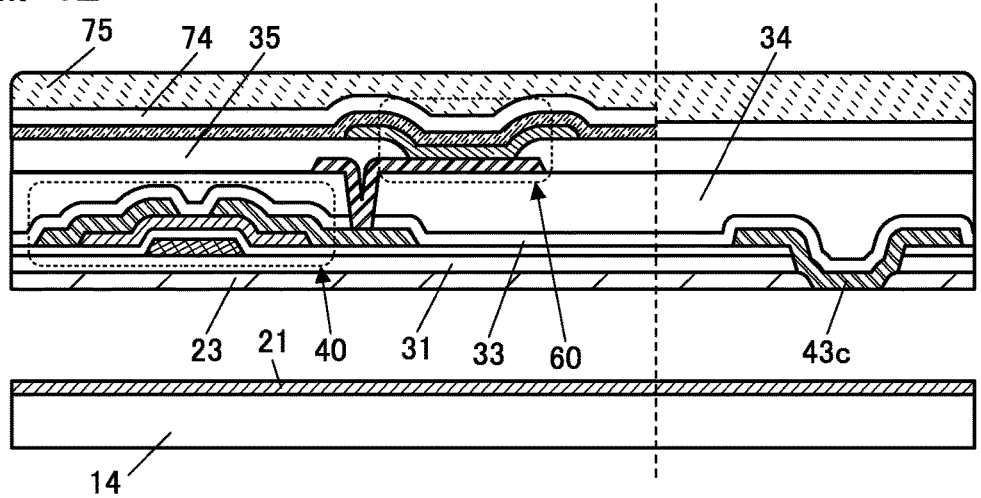
Figure 4C:
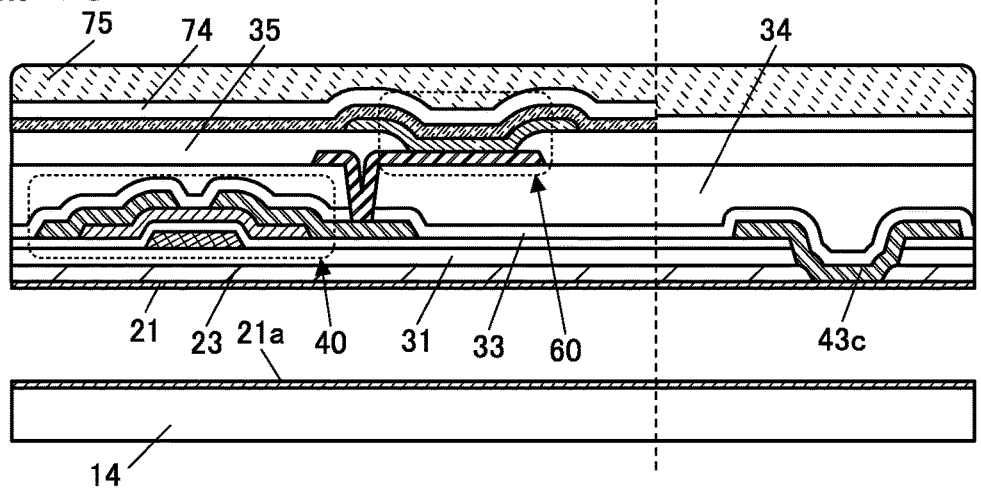

Next, the formation substrate 14 and the transistor 40 are separated from each other (FIG. 4B or 4C).

FIG. 4B illustrates an example in which separation occurs at the interface between the oxide layer 21 and the resin layer 23 and the interface between the oxide layer 21 and the conductive layer 43*c*.

FIG. 4C illustrates an example in which separation occurs in the oxide layer 21. Part of the oxide layer (an oxide layer 21*a*) remains over the formation substrate 14. The thickness of the oxide layer 21 remaining on the resin layer 23 side and the conductive layer 43*c* side is reduced as compared with that in FIG. 4A.

In the case where the oxide layer 21 remains on the resin layer 23 side and the conductive layer 43*c* side, the remaining oxide layer 21 is preferably removed. For example, the oxide layer 21 can be removed by etching such as plasma etching or wet etching.

The formation substrate 14 can be reused by removing the oxide layer 21*a* remaining on the formation substrate 14 side.

The formation substrate 14 can be peeled by applying a perpendicular tensile force to the oxide layer 21, for example. Specifically, the formation substrate 14 can be peeled by attaching a mechanism to part of the top surface of the protective layer 75 and pulling up the protective layer 75.

The separation trigger is preferably formed by inserting a sharp instrument such as a knife between the formation substrate 14 and the insulating layer 31.

Figure 5:
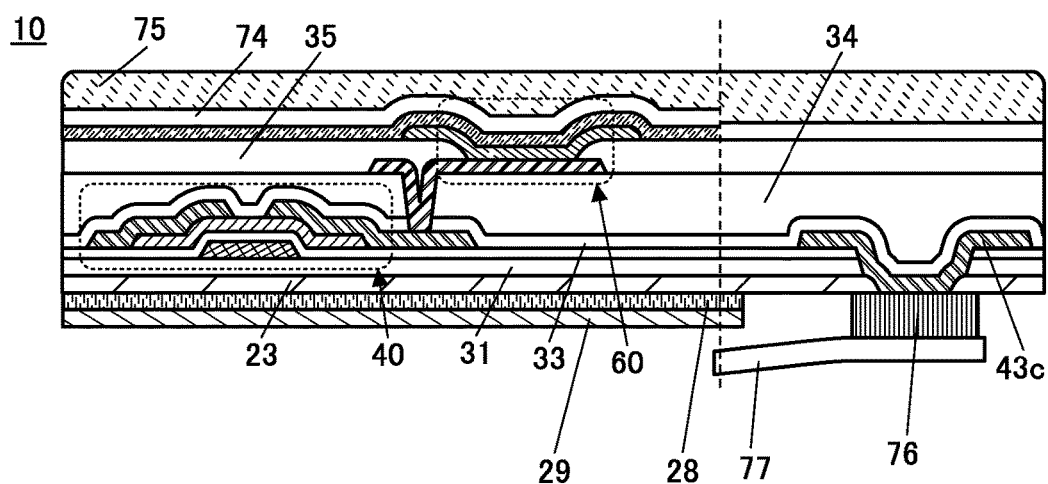
FIG. 5 illustrates an example of a flexible device.

The separation of the formation substrate 14 and the transistor 40 can obtain the display device 10 (FIG. 5). The display device 10 can remain being bent or can be bent repeatedly, for example.

As illustrated in FIG. 5, a substrate 29 may be attached to the surface of the resin layer 23 that is exposed by the separation, with a bonding layer 28. Note that the substrate 29 and the bonding layer 28 are provided in a position that does not overlap with the conductive layer 43*c*. The substrate 29 can function as a supporting substrate of the flexible device. FIG. 5 illustrates an example in which the substrate 29 is attached to the resin layer 23 with the bonding layer 28.

The material that can be used for the substrate 75*a* can be used for the substrate 29.

Then, the conductive layer 43*c* and an FPC 77 are electrically connected to each other through a connector 76 (FIG. 5).

As the connector 76, any of various anisotropic conductive films (ACF), anisotropic conductive pastes (ACP), and the like can be used.

In this embodiment, an example using a top-emission light-emitting element is described. In the case where the conductive layer 43*c* is exposed from the protective layer 75 side and electrically connected to the FPC 77, a display region cannot overlap with the FPC 77 because the protective layer 75 is on the display surface side, and thus a region of the display device that overlaps with the FPC 77 is limited. In contrast, in one embodiment of the present invention, the conductive layer 43*c* can be exposed from the side opposite to the display surface by using the photosensitive material for the resin layer 23. Therefore, the conductive layer 43*c* and the FPC 77 can be electrically connected to each other through the opening provided in the resin layer 23. Such a structure allows the FPC 77 to be positioned on the side opposite to the display surface. Thus, a space for bending the FPC 77 in incorporating the display device in an electronic device can be saved, which enables the electronic device to be smaller.

Through the above steps, the display device using an oxide semiconductor for the transistor and a separate coloring method for an EL element can be fabricated (FIG. 5).

Manufacturing Method Example 2A

Figure 6A:
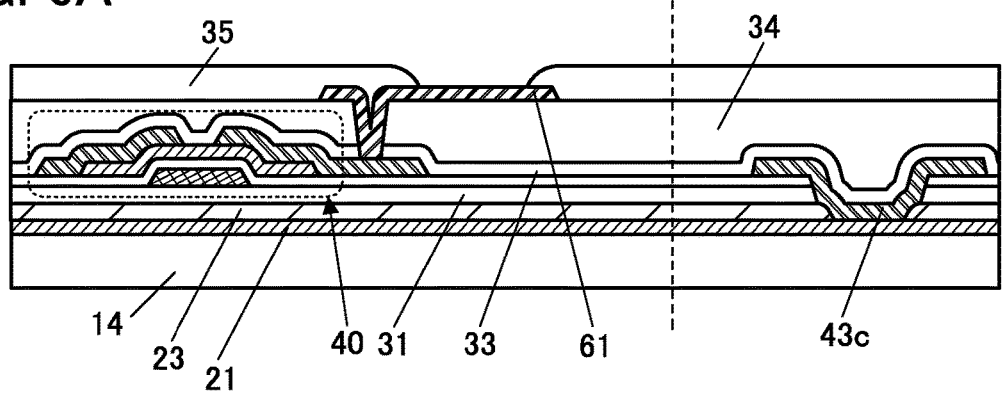
FIGS. 6A to 6C illustrate an example of a manufacturing method of a flexible device.

First, components from the oxide layer 21 to the insulating layer 35 are formed in this order over the formation substrate 14 in a manner similar to that in the manufacturing method example 1A (FIG. 6A).

Figure 6B:
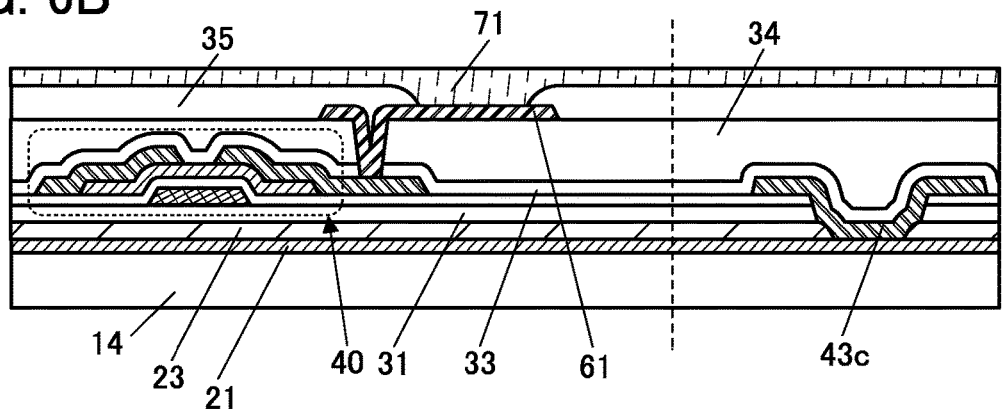

Then, a protective layer 71 is formed as illustrated in FIG. 6B.

The protective layer 71 has a function of protecting surfaces of the insulating layer 35 and the conductive layer 61 in a peeling step. The protective layer 71 can be formed using a material that can be easily removed.

For the protective layer 71 that can be removed, a water-soluble resin can be used, for example. A water-soluble resin is applied to an uneven surface to cover the unevenness, which facilitates the protection of the surface. A stack of a water-soluble resin and an adhesive that can be peeled by light or heat may be used for the protective layer 71 that can be removed.

Alternatively, for the protective layer 71 that can be removed, a base material having a property in which adhesion is strong in a normal state but weakened when irradiated with light or heated may be used. For example, a thermal peeling tape whose adhesion is weakened by heat, a UV-peeling tape whose adhesion is weakened by ultraviolet irradiation, or the like may be used. Alternatively, a weak adhesion tape with weak adhesion in a normal state or the like can be used.

Figure 6C:
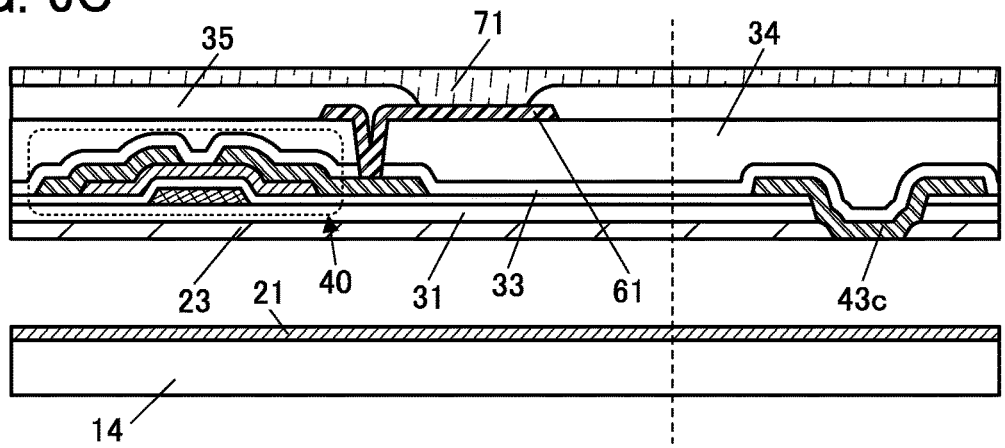

Next, the formation substrate 14 and the transistor 40 are separated from each other in a manner similar to that in the manufacturing method example 1A (FIG. 6C). FIG. 6C illustrates an example in which separation occurs at the interface between the oxide layer 21 and the resin layer 23 and the interface between the oxide layer 21 and the conductive layer 43*c*. The resin layer 23 and the conductive layer 43*c* are exposed by the separation.

After the formation substrate 14 and transistor 40 are separated from each other, the protective layer 71 is removed.

Then, the EL layer 62 and the conductive layer 63 are formed, whereby the display element 60 is obtained. Thus, by sealing the display element 60, the display device 10 can be obtained. For sealing of the display element 60, one or more of the insulating layer 74, the protective layer 75, the substrate 75a, the bonding layer 75b, and the like can be used.

The EL layer 62 and the conductive layer 63 may be formed while the resin layer 23 and the conductive layer 43c are fixed to a stage of a deposition apparatus, but are preferably formed while the resin layer 23 and the conductive layer 43c are fixed to a supporting substrate by a tape or the like and the supporting substrate is placed on the stage. Fixing the resin layer 23 and the conductive layer 43c to the supporting substrate facilitates the transfer of the stacked-layer structure including the resin layer 23.

In the manufacturing method example 2A, after a layer is peeled from the formation substrate 14, the EL layer 62 and the conductive layer 63 can be formed over the layer. In the case where a region having low adhesion is generated in a stack including the EL layer 62 and the like, the stack is formed after peeling so that a decrease in the yield of peeling can be suppressed. With the use of the manufacturing method example 2A, a material can be selected more freely, leading to fabrication of a highly reliable display device at lower cost.

Manufacturing Method Example 3A

Next, the case of fabricating a display device with a color filter method that uses an oxide semiconductor for a transistor will be described as an example. A flexible device of one embodiment of the present invention and a manufacturing method thereof will be specifically described below with reference to FIGS. 7A to 7E, FIGS. 8A to 8C, FIGS. 9A and 9B, FIGS. 10A and 10B, FIGS. 11A and 11B, FIGS. 12A and 12B, and FIGS. 13A and 13B.

Figure 7A:
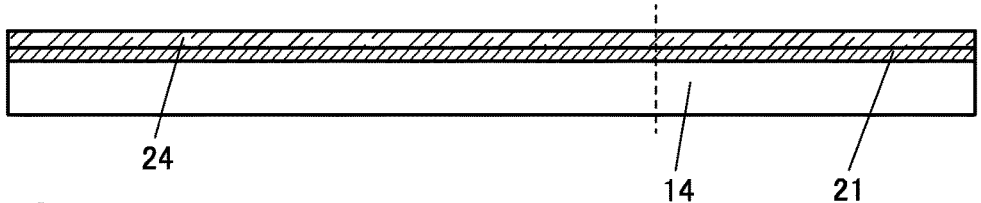
FIGS. 7A to 7E illustrate an example of a manufacturing method of a flexible device.

First, the oxide layer 21 is formed over the formation substrate 14 in a manner similar to that in the manufacturing method example 1A (FIG. 7A).

Next, the first layer 24 is formed using a photosensitive and thermosetting material in a manner similar to that in the manufacturing method example 1A (FIG. 7A).

Figure 7B:
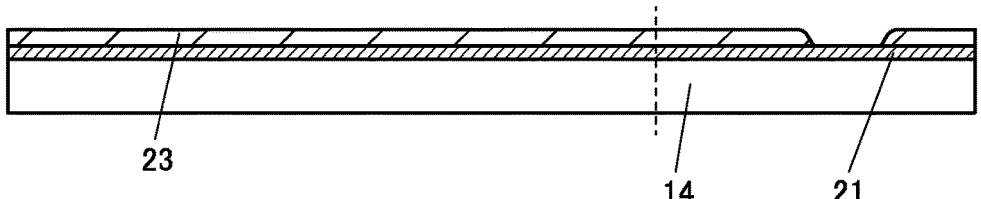

Next, the film processed into a desired shape is heated in a manner similar to that in the manufacturing method example 1A, whereby the resin layer 23 is formed (FIG. 7B). FIG. 7B illustrates an example in which the opening that reaches the oxide layer 21 is provided in the resin layer 23.

Figure 7C:
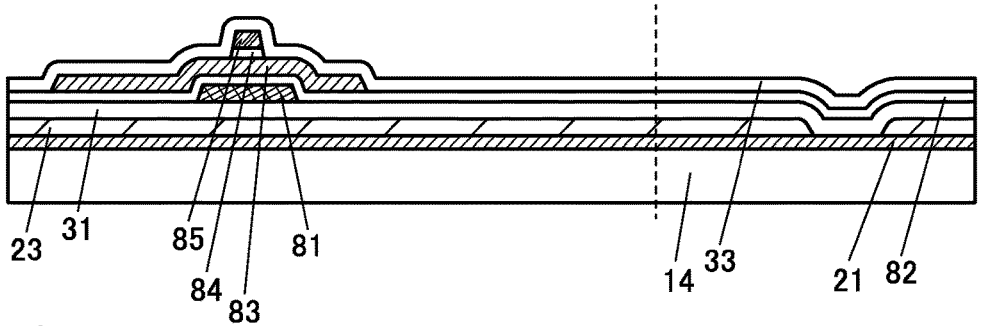

Next, the insulating layer 31 is formed over the resin layer 23 in a manner similar to that in the manufacturing method example 1A (FIG. 7C).

Figure 7D:
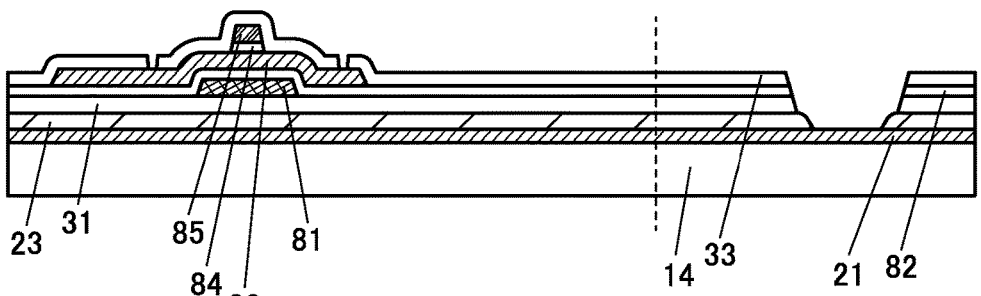
Figure 7E:
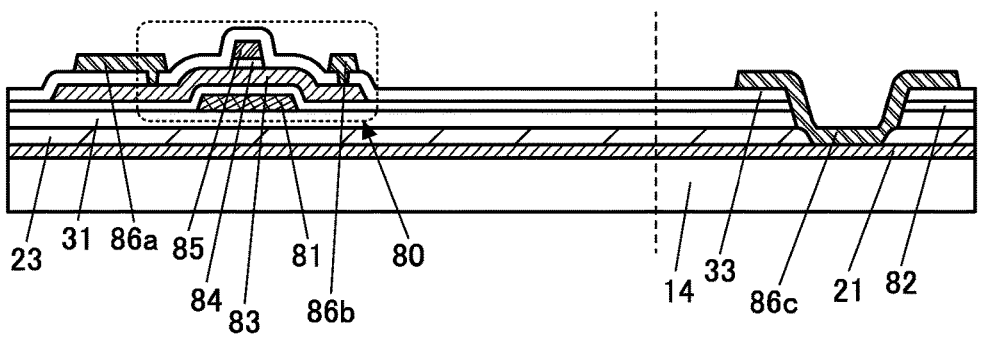

Next, a transistor 80 is formed over the insulating layer 31 (FIGS. 7C to 7E).

Here, the case where a transistor including an oxide semiconductor layer 83 and two gates is formed as the transistor 80 is shown.

The transistor 80 is formed at a temperature lower than or equal to the allowable temperature limit of the resin layer 23. The transistor 80 is preferably formed at a temperature lower than or equal to the heating temperature in the above-described post-baking.

Specifically, first, a conductive layer 81 is formed over the insulating layer 31 (FIG. 7C). The conductive layer 81 can be formed in the following manner: a conductive film is formed, a resist mask is formed, the conductive film is etched, and the resist mask is removed.

Next, an insulating layer 82 is formed (FIG. 7C). For the insulating layer 82, the description of the inorganic insulating film that can be used for the insulating layer 31 can be referred to.

Then, the oxide semiconductor layer 83 is formed (FIG. 7C). The oxide semiconductor layer 83 can be formed in the following manner: an oxide semiconductor film is formed, a resist mask is formed, the oxide semiconductor film is etched, and the resist mask is removed. For the oxide semiconductor layer 83, the description of the material that can be used for the oxide semiconductor layer 44 can be referred to.

Then, an insulating layer 84 and a conductive layer 85 are formed (FIG. 7C). For the insulating layer 84, the description of the inorganic insulating film that can be used for the insulating layer 31 can be referred to. The insulating layer 84 and the conductive layer 85 can be formed in the following manner: an insulating film to be the insulating layer 84 and a conductive film to be the conductive layer 85 are formed, a resist mask is formed, the insulating film and the conductive film are etched, and the resist mask is removed.

Next, the insulating layer 33 that covers the oxide semiconductor layer 83, the insulating layer 84, and the conductive layer 85 is formed (FIG. 7C). The insulating layer 33 can be formed in a manner similar to that of the insulating layer 31.

An opening of the insulating layer 31, an opening of the insulating layer 82, and an opening of the insulating layer 33 are provided in a region overlapping with the opening of the resin layer 23 (FIG. 7D). The oxide layer 21 is exposed by providing the openings. Here, an example in which the openings of the insulating layer 31, the insulating layer 82, and the insulating layer 33 are formed at a time is shown. The openings of the insulating layer 31, the insulating layer 82, and the insulating layer 33 may be formed in separate steps. In addition, the openings may be formed in two or more of the insulating layers at the same time. For example, the opening of the insulating layer 31 may be formed before the conductive layer 81 is formed. For example, the opening of the insulating layer 82 may be formed before the oxide semiconductor layer 83 is formed. For example, the opening of the insulating layer 33 may be provided in the region overlapping with the opening of the resin layer 23 in a step of forming openings that reach the oxide semiconductor layer 83.

Next, a conductive layer 86a, a conductive layer 86b, and a conductive layer 86c are formed (FIG. 7E). The conductive layers 86a, 86b, and 86c can be formed in the following manner: a conductive film is formed, a resist mask is formed, the conductive film is etched, and the resist mask is removed. The conductive layers 86a and 86b are electrically connected to the oxide semiconductor layer 83 through the openings of the insulating layer 33. The conductive layer 86c is connected to the oxide layer 21 through the openings provided in the resin layer 23, the insulating layer 31, the insulating layer 82, and the insulating layer 33.

In the above manner, the transistor 80 can be formed (FIG. 7E). In the transistor 80, part of the conductive layer 81 functions as a gate, part of the insulating layer 84 functions as a gate insulating layer, part of the insulating layer 82 functions as a gate insulating layer, and part of the conductive layer 85 functions as a gate. The oxide semiconductor layer 83 includes a channel region and a low-resistance region. The channel region overlaps with the conductive layer 85 with the insulating layer 84 provided therebetween.

The low-resistance region includes a region connected to the conductive layer 86a and a region connected to the conductive layer 86b.

Figure 8A:
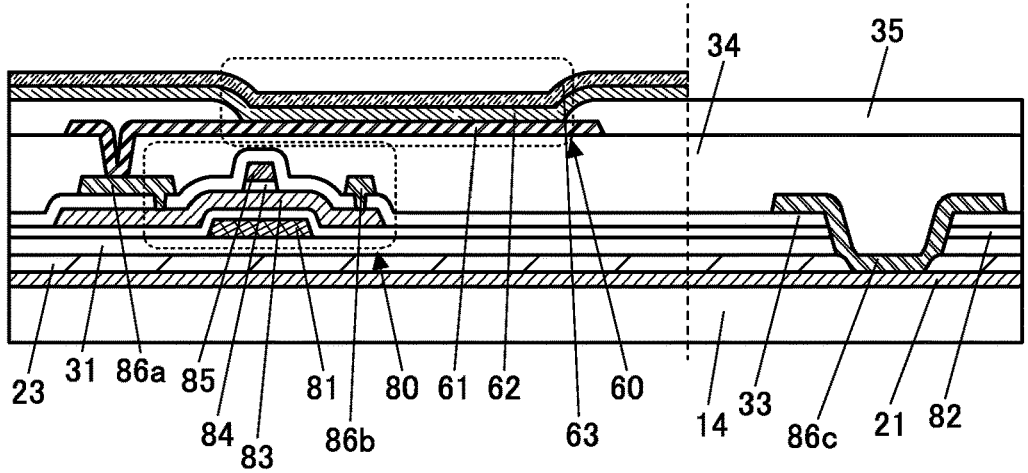
FIGS. 8A to 8C illustrate an example of a manufacturing method of a flexible device.

Next, components from the insulating layer 34 to the display element 60 are formed over the insulating layer 33 (FIG. 8A). For these steps, the description of the manufacturing method example 1A can be referred to.

Figure 8B:
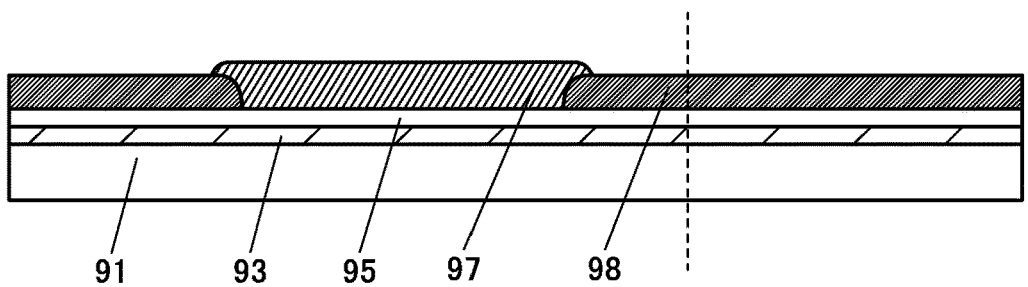

A resin layer 93 is formed over a formation substrate 91 using a photosensitive and thermosetting material (FIG. 8B).

The resin layer 93 has flexibility. The formation substrate 91 has lower flexibility than the resin layer 93 does. Since the resin layer 93 is formed over the formation substrate 91, the resin layer 93 can be transferred easily.

For the resin layer 93, a polyimide resin is preferably used. For the material and formation method of the resin layer 93, the description of the resin layer 23 can be referred to.

The resin layer 93 preferably has a thickness greater than or equal to 0.01 μm and less than 10 μm, further preferably greater than or equal to 0.1 μm and less than or equal to 5 μm, still further preferably greater than or equal to 0.1 μm and less than or equal to 3 μm, and yet still further preferably greater than or equal to 0.5 μm and less than or equal to 1 μm. With a solution having low viscosity, the resin layer 93 having a small thickness can be easily formed. By forming the resin layer 93 thin, the display device can be fabricated at low cost. The display device can be light-weight and thin. The display device can have higher flexibility. The thickness of the resin layer 93 is not limited thereto, and may be greater than or equal to 10 μm. For example, the resin layer 93 may have a thickness greater than or equal to 10 μm and less than or equal to 200 μm. The resin layer 93 having a thickness greater than or equal to 10 μm is favorable because the rigidity of the display device can be increased.

In the case where the resin layer 93 is positioned on the display surface side of the display device, the resin layer 93 preferably has a high visible-light transmitting property.

For the formation substrate 91, the description of the formation substrate 14 can be referred to.

Next, an insulating layer 95 is formed over the resin layer 93. Then, a coloring layer 97 and a light-blocking layer 98 are formed over the insulating layer 95 (FIG. 8B).

For the insulating layer 95, the description of the insulating layer 31 can be referred to.

A color filter or the like can be used as the coloring layer 97. The coloring layer 97 is provided to overlap with the display region of the display element 60.

A black matrix or the like can be used as the light-blocking layer 98. The light-blocking layer 98 is provided to overlap with the insulating layer 35.

Figure 8C:
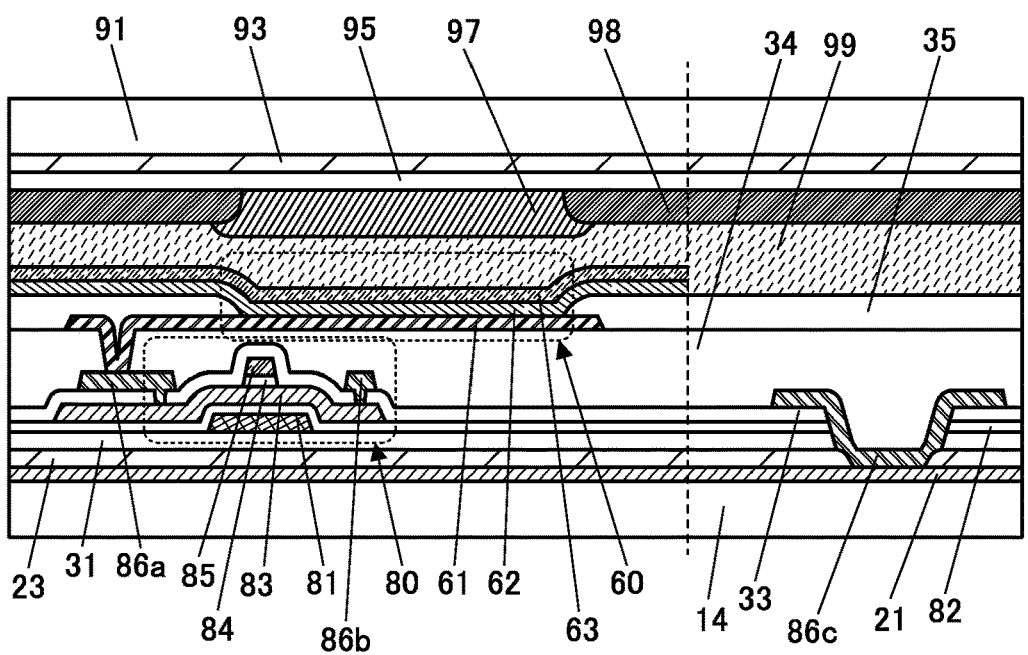

Next, a surface of the formation substrate 14 on which the oxide layer 21 and the like are formed and a surface of the formation substrate 91 on which the resin layer 93 and the like are formed are attached to each other with a bonding layer 99 (FIG. 8C).

Figure 9A:
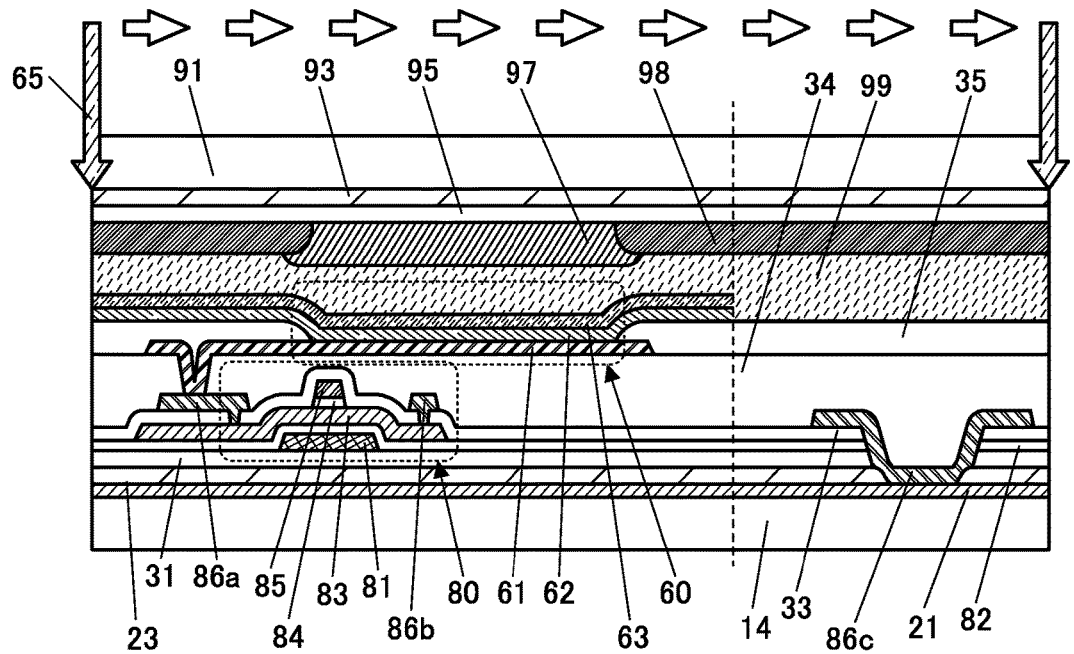
FIGS. 9A and 9B illustrate an example of a manufacturing method of a flexible device.

Next, the resin layer 93 is irradiated with the laser light 65 through the formation substrate 91 (FIG. 9A). Note that either the formation substrate 14 or the formation substrate 91 may be separated first. Here, an example in which the formation substrate 91 is separated ahead of the formation substrate 14 is shown.

Figure 9B:
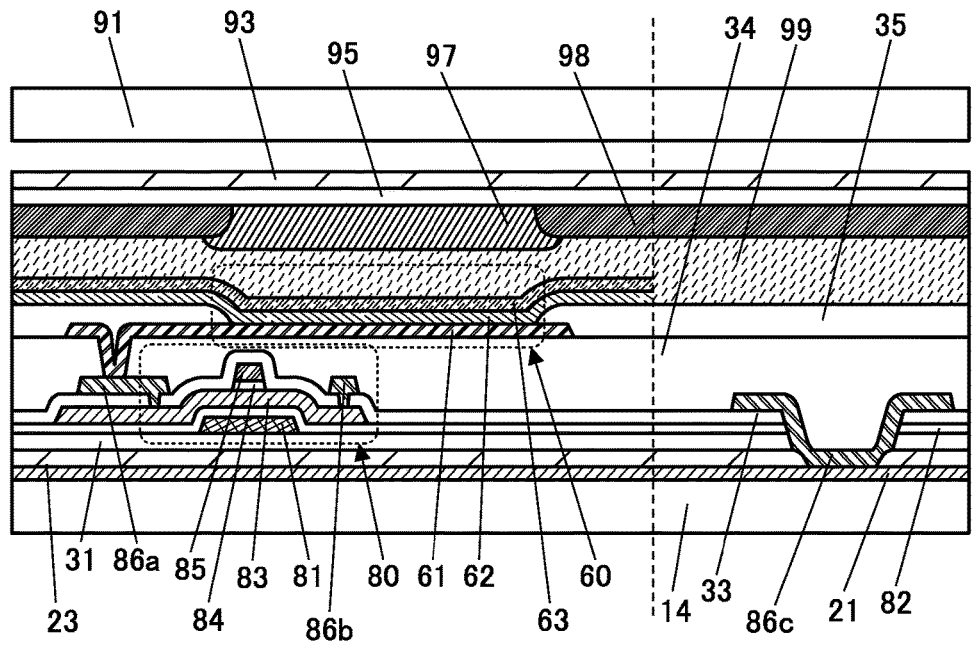

Then, the formation substrate 91 and the insulating layer 95 are separated from each other (FIG. 9B). FIG. 9B illustrates an example in which separation occurs at the interface between the formation substrate 91 and the resin layer 93.

Note that separation occurs in the resin layer 93 in some cases. At this time, part of the resin layer remains over the formation substrate 91 and thus the thickness of the resin layer 93 remaining on the insulating layer 95 side is reduced as compared with that in FIG. 9A.

Figure 10A:
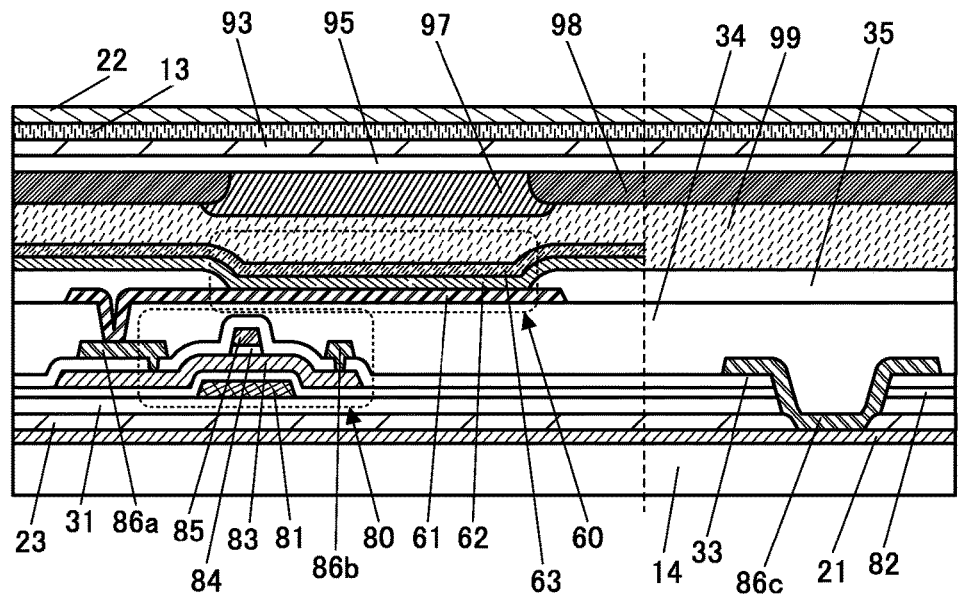
FIGS. 10A and 10B illustrate an example of a manufacturing method of a flexible device.

Then, the exposed resin layer 93 (or insulating layer 95) and the substrate 22 are attached to each other with a bonding layer 13 (FIG. 10A).

In FIG. 10A, light emitted from the display element 60 is extracted to the outside of the display device through the coloring layer 97 and the resin layer 93. Thus, the resin layer 93 preferably has high visible-light transmittance. In the peeling method of one embodiment of the present invention, the thickness of the resin layer 93 can be reduced. Therefore, the visible-light transmittance of the resin layer 93 can be increased.

In addition, the resin layer 93 may be removed, and the substrate 22 may be attached to the insulating layer 95 with the bonding layer 13. As a method for removing the resin layer 93, ashing or the like can be used.

The material that can be used for the bonding layer 75b can be used for the bonding layer 13.

The material that can be used for the substrate 75a can be used for the substrate 22.

Figure 10B:
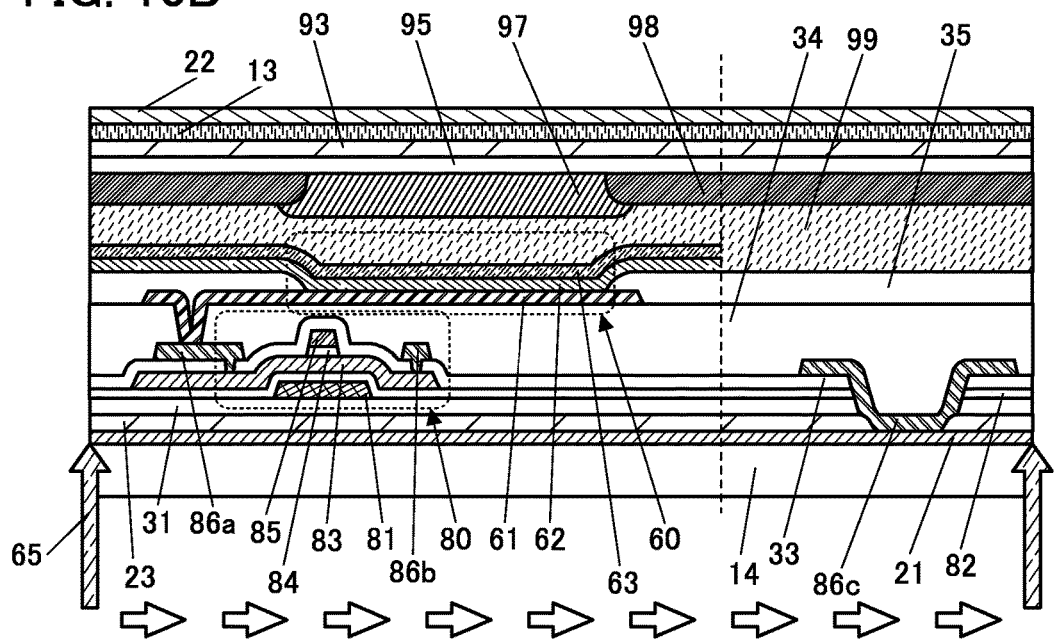

Next, the oxide layer 21 is irradiated with the laser light 65 through the formation substrate 14 (FIG. 10B).

By irradiation with the laser light 65, the oxide layer 21 is heated and oxygen is released from the oxide layer 21.

Figure 11A:
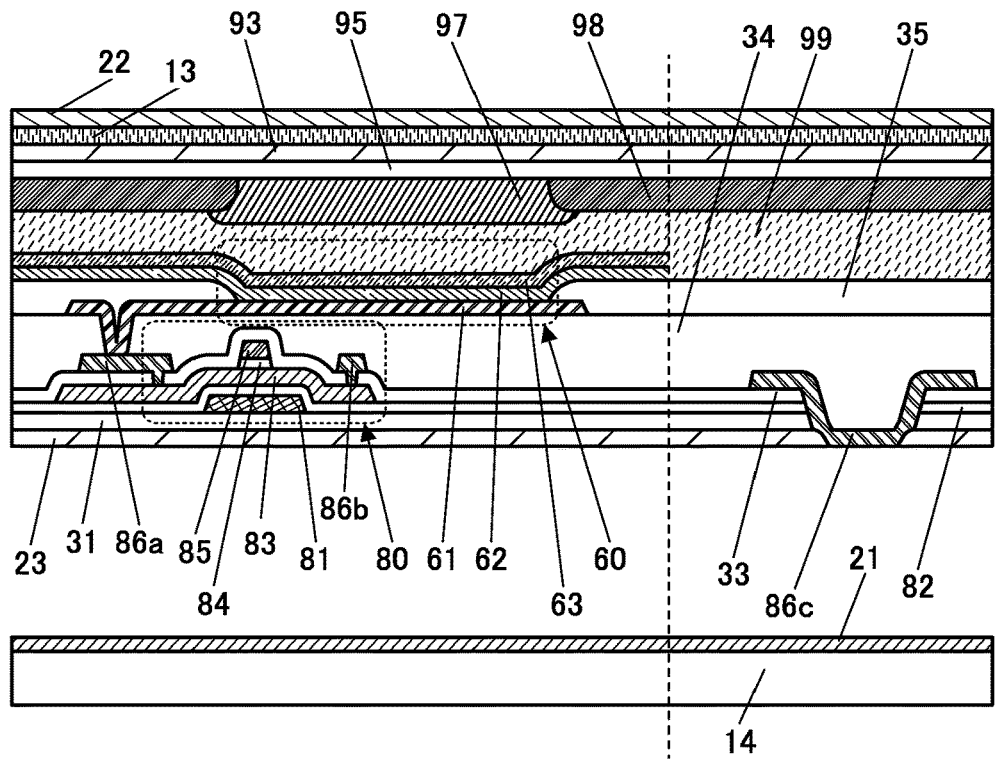
FIGS. 11A and 11B each illustrate an example of a manufacturing method of a flexible device.
Figure 11B:
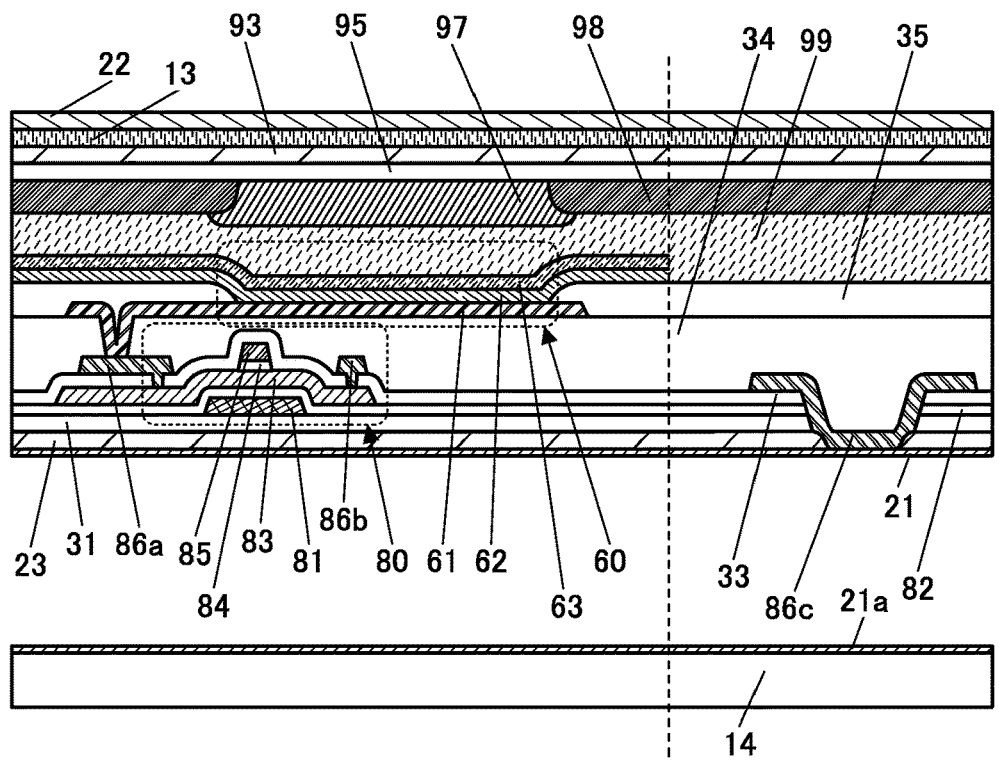

Then, the formation substrate 14 and the insulating layer 31 are separated from each other (FIG. 11A or 11B).

FIG. 11A illustrates an example in which separation occurs at the interface between the oxide layer 21 and the resin layer 23 and the interface between the oxide layer 21 and the conductive layer 86c.

FIG. 11B illustrates an example in which separation occurs in the oxide layer 21. Part of the oxide layer (oxide layer 21a) remains over the formation substrate 14. The thickness of the oxide layer 21 remaining on the resin layer 23 side and the conductive layer 86c side is reduced as compared with that in FIG. 10B.

In the case where the oxide layer 21 remains on the resin layer 23 side and the conductive layer 86c side, the remaining oxide layer 21 is preferably removed.

Figure 12A:
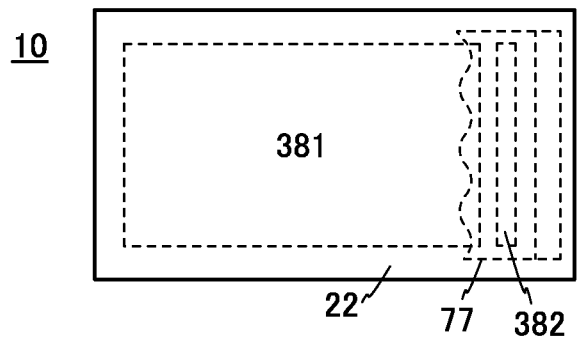
FIGS. 12A and 12B illustrate an example of a flexible device.
Figure 12B:
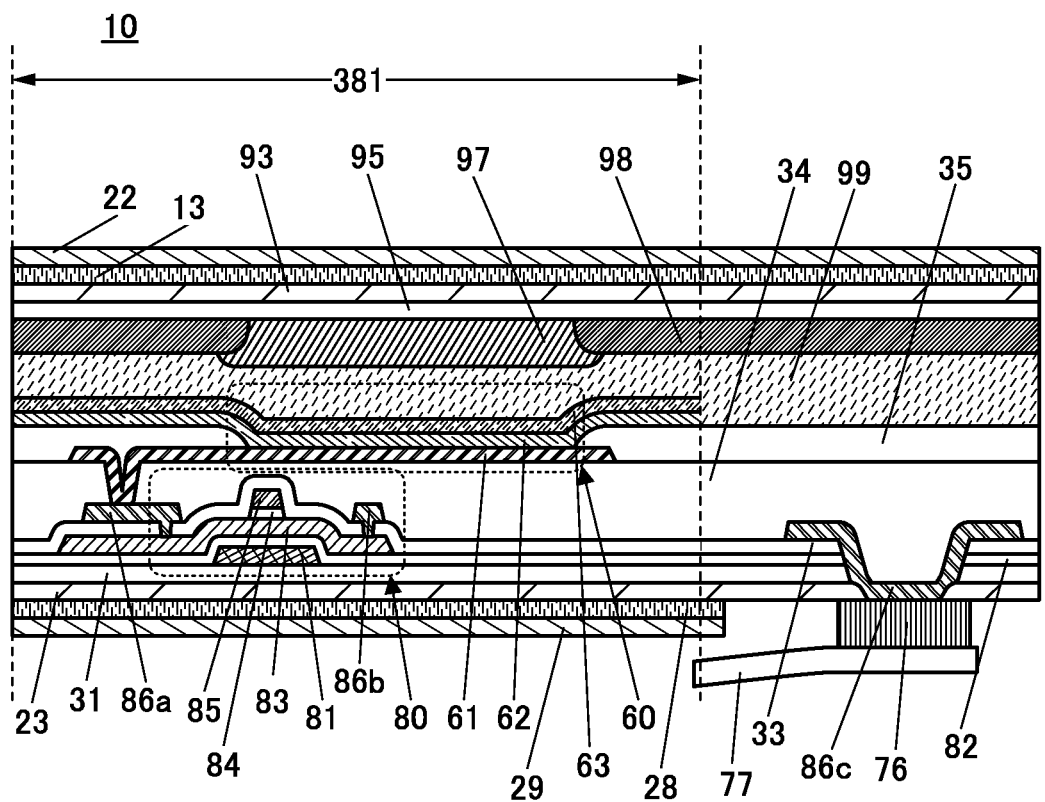

The separation of the formation substrate 14 and the transistor 80 can obtain the display device 10 (FIGS. 12A and 12B). The display device 10 can remain being bent or can be bent repeatedly, for example.

FIG. 12A is a top view of the display device 10. FIG. 12B is a cross-sectional view of a display portion 381 of the display device 10 and a cross-sectional view of a connection portion for connection to the FPC 77.

The display device 10 in FIGS. 12A and 12B includes a pair of substrates (the substrate 22 and the substrate 29). The substrate 22 side corresponds to a display surface side. The display device includes the display portion 381 and a driver circuit portion 382. The FPC 77 is attached to the display device.

As illustrated in FIG. 12B, the substrate 29 may be attached to the surface of the resin layer 23 that is exposed by the separation, with the bonding layer 28. Note that the substrate 29 and the bonding layer 28 are provided in a position that does not overlap with the conductive layer 86c.

Then, the conductive layer 86c and the FPC 77 are electrically connected to each other through the connector 76 (FIG. 12B).

In this embodiment, an example using a top-emission light-emitting element is described. In the case where the conductive layer 86c is exposed from the substrate 22 side and electrically connected to the FPC 77, the display region cannot overlap with the FPC 77 because the substrate 22 is on the display surface side, and thus a region of the display device that overlaps with the FPC 77 is limited. In contrast, in one embodiment of the present invention, the conductive layer 86c can be exposed from the side opposite to the display surface by using the photosensitive material for the resin layer 23. Therefore, the conductive layer 86c and the FPC 77 can be electrically connected to each other through the opening provided in the resin layer 23. Such a structure allows the FPC 77 to be positioned on the side opposite to the display surface. Thus, a space for bending the FPC 77 in incorporating the display device in an electronic device can be saved, which enables the electronic device to be smaller.

The manufacturing method example 3A is an example in which the peeling method of one embodiment of the present invention is performed twice to fabricate a flexible device. In one embodiment of the present invention, each of the functional elements and the like included in the flexible device is formed over the formation substrate; thus, even in the case where a high-resolution display device is manufactured, high alignment accuracy of the flexible substrate is not required. It is thus easy to attach the flexible substrate.

Modification Example 1A

In one embodiment of the present invention, a display device having a bottom-emission structure can be fabricated.

Figure 13A:
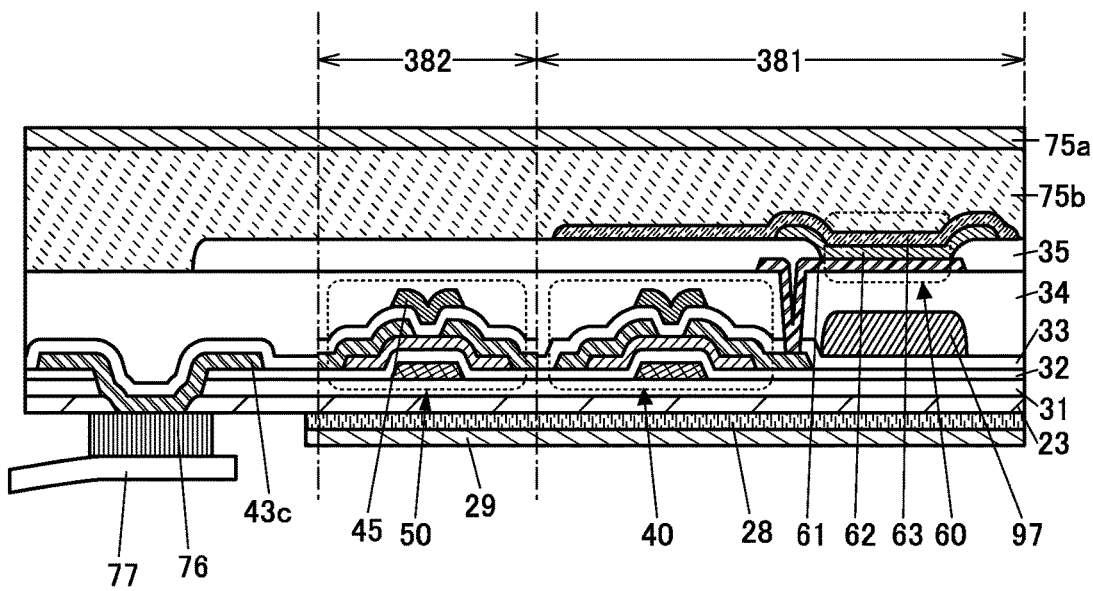
FIGS. 13A and 13B each illustrate an example of a flexible device.

The display device in FIG. 13A is a bottom-emission display device using a color filter method. FIG. 13A is a cross-sectional view of the display portion 381 of the display device, a cross-sectional view of the driver circuit portion 382, and a cross-sectional view of a connection portion for connection to the FPC 77.

The display device in FIG. 13A includes the substrate 29, the bonding layer 28, the resin layer 23, the insulating layer 31, the transistor 40, a transistor 50, the conductive layer 43c, the insulating layer 33, the insulating layer 34, the insulating layer 35, the display element 60, the bonding layer 75b, the substrate 75a, and the coloring layer 97.

FIG. 13A is an example including the transistor 40 and the transistor 50 which are each a transistor in which a conductive layer 45 functioning as a gate is added to the components of the transistor 40 in FIG. 5.

The display element 60 emits light to the coloring layer 97 side.

The FPC 77 and the conductive layer 43c are electrically connected to each other through the connector 76. In the cross-sectional view of a connection portion for connection to the FPC 77, an example in which the end portion of the insulating layer 35 is not exposed at the end portion of the display device is shown.

Modification Example 2A

Figure 13B:
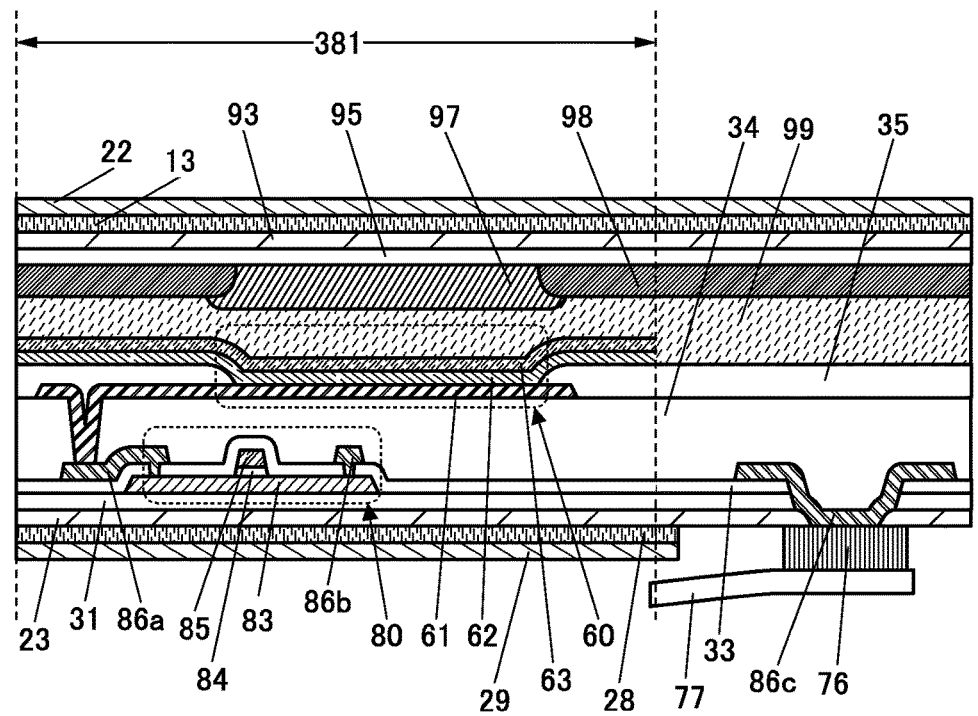

The display device in FIG. 13B is different from the display device in FIG. 12B in that the conductive layer 81 and the insulating layer 82 are not provided in the transistor 80.

As described above, in one embodiment of the present invention, a flexible device can be fabricated by separating the transistor or the like from the formation substrate using the oxide layer having a function of releasing oxygen.

In one embodiment of the present invention, the resin layer is formed using the photosensitive material; thus, the resin layer with a desired shape can be easily formed. Thus, the external connection terminal and the circuit board can be electrically connected to each other on the surface opposite to the display surface. Thus, a space for bending the FPC and the like in incorporating the display device in an electronic device can be saved, which enables the electronic device to be smaller.

In one embodiment of the present invention, the fabrication process of the transistor can be performed at a low temperature with the use of an oxide semiconductor in the channel formation region of the transistor. Furthermore, the resin layer can have a small thickness and low heat resistance. Thus, there are advantages in that the material of the resin layer can be selected from a wide range, high mass productivity can be obtained at low cost, and peeling and fabrication of a flexible device can be performed using a large-sized substrate, for example.

This embodiment can be combined with any of the other embodiments as appropriate.

Embodiment 2

In this embodiment, a peeling method and a manufacturing method of a flexible device of embodiments of the present invention will be described.

In the peeling method of one embodiment of the present invention, first, an island-shaped oxide layer is formed over a formation substrate. Next, a resin layer having an opening is formed in such a manner that a first layer is formed over the formation substrate and the oxide layer using a photosensitive material and then an opening is formed in a portion of the first layer that overlaps with the oxide layer by a photolithography method. Then, a transistor including an oxide semiconductor in a channel formation region is formed over the resin layer. Then, a conductive layer is formed to overlap with the opening of the resin layer and the oxide layer. After that, the oxide layer and the resin layer are irradiated with light using a laser and then the transistor and the formation substrate are separated from each other.

In one embodiment of the present invention, the resin layer is formed using a photosensitive material. With the photosensitive material, a resin layer with a desired shape can be easily formed. For example, an opening can be easily formed in the resin layer.

However, in the case where separation is made to occur at the interface between the resin layer and the formation substrate or in the resin layer, the formation of the opening in the resin layer makes the separation of the formation substrate difficult in some cases.

Thus, in one embodiment of the present invention, the island-shaped oxide layer is formed and the opening of the resin layer is formed in a portion overlapping with the oxide layer. Then, the resin layer and the oxide layer are irradiated with light using a laser.

When the oxide layer is heated by absorbing light, oxygen is released in some cases. For example, oxygen might be released in a gaseous state. Oxygen in a gaseous state might form a bubble-form region in the oxide layer or on the surface of the oxide layer.

The oxide layer is irradiated with light to release oxygen therefrom. This reduces the adhesion between the oxide layer and the layer in contact with the oxide layer and separation can be performed at the interface between the two layers. Alternatively, by releasing oxygen from the oxide layer, the oxide layer itself is damaged, so that separation can be performed in the oxide layer.

Accordingly, the formation substrate can be easily separated from the resin layer, so that the resin layer can be exposed in a portion where the resin layer is provided and the oxide layer or a layer having been in contact with the oxide layer can be exposed in the opening of the resin layer.

The oxide layer separated and exposed from the formation substrate can be used as a rear electrode or a through electrode. The oxide layer can be used as an external connection terminal, for example. The exposed oxide layer can be electrically connected to a circuit board such as an FPC. When the conductive layer electrically connected to the oxide layer through the opening of the resin layer is provided, the conductive layer can be electrically connected to the circuit board through the oxide layer.

Since the oxide layer is used as an electrode in one embodiment of the present invention, the resistivity of the oxide layer is preferably low. Specifically, an oxide conductive layer is preferably formed as the oxide layer. Alternatively, it is preferable to form an oxide semiconductor layer as the oxide layer and reduce the resistance of the oxide semiconductor layer (or form an oxide conductive layer).

An oxide semiconductor is a semiconductor material whose resistance can be controlled by oxygen vacancies in the film of the semiconductor material and/or the concentration of impurities such as hydrogen or water in the film of the semiconductor material. Thus, the resistivity of the oxide semiconductor layer or the oxide conductive layer can be controlled by selecting treatment for increasing oxygen vacancies and/or impurity concentration on the oxide semiconductor layer or treatment for reducing oxygen vacancies and/or impurity concentration on the oxide semiconductor layer.

Specifically, the resistivity of the oxide semiconductor can be controlled by plasma treatment. For example, plasma treatment using a gas containing one or more kinds selected from a rare gas (He, Ne, Ar, Kr, or Xe), hydrogen, boron, phosphorus, and nitrogen can be employed. For example, plasma treatment can be performed in an Ar atmosphere, a mixed gas atmosphere of Ar and nitrogen, a mixed gas atmosphere of Ar and hydrogen, an ammonia atmosphere, a mixed gas atmosphere of Ar and ammonia, or a nitrogen atmosphere. Thus, the oxide semiconductor layer can have a high carrier density and a low resistivity.

Hydrogen, boron, phosphorus, or nitrogen is injected into the oxide semiconductor layer by an ion implantation method, an ion doping method, a plasma immersion ion implantation method, or the like, so that the resistivity of the oxide semiconductor layer can be reduced.

Alternatively, a method in which a film containing hydrogen and/or nitrogen is formed in contact with the oxide semiconductor layer and hydrogen and/or nitrogen are/is diffused from the film into the oxide semiconductor layer can be employed. Thus, the oxide semiconductor layer can have a high carrier density and a low resistivity.

In the case where heat treatment is performed in the fabrication process of a flexible device, oxygen is released from the oxide semiconductor layer by heating the oxide semiconductor layer, so that oxygen vacancies might be increased. Thus, the oxide semiconductor layer can have a low resistivity.

By irradiating the oxide semiconductor layer with laser light in order to peel the oxide semiconductor layer from the formation substrate, oxygen is released from the oxide semiconductor layer and oxygen vacancies are increased in some cases. Thus, the oxide semiconductor layer can have a low resistivity.

Note that such an oxide conductive layer formed using an oxide semiconductor layer can be referred to as an oxide semiconductor layer having a high carrier density and a low resistance, an oxide semiconductor layer having conductivity, or an oxide semiconductor layer having high conductivity.

In one embodiment of the present invention, an oxide semiconductor is used for the channel formation region of the transistor. As described in Embodiment 1, with the use of an oxide semiconductor, the maximum manufacturing process temperature of the display device can be lowered, the manufacturing cost of the display device can be reduced, and the manufacturing process of the display device can be simplified, as compared with the case of using LTPS. In addition, with the use of an oxide semiconductor, heat resistance of the resin layer can be reduced, the material of the resin layer can be selected from a wide range, and the resin layer can be reduced in thickness, as compared with the case of using LTPS.

In one embodiment of the present invention, the transistor or the like is formed at a temperature lower than or equal to the allowable temperature limit of the resin layer.

In one embodiment of the present invention, irradiation with laser light is performed with a linear laser. A laser apparatus used in a manufacturing line for LTPS or the like can be effectively used. The linear laser condenses laser light in a long rectangular shape (the laser light is shaped into a linear laser beam) so that the oxide layer and the resin layer are irradiated with light.

A flexible device can be manufactured using a peeling method of one embodiment of the present invention. A flexible device of one embodiment of the present invention and a manufacturing method thereof will be specifically described below with reference to FIGS. 14A to 14F, FIGS. 15A to 15C, FIGS. 16A and 16B, FIGS. 17A to 17C, and FIGS. 18A to 18C. Here, an example in which a display device including an active matrix organic EL display device is fabricated as the flexible device will be described. Note that descriptions of portions similar to those in Embodiment 1 might be omitted.

Manufacturing Method Example 1B

Figure 14A:
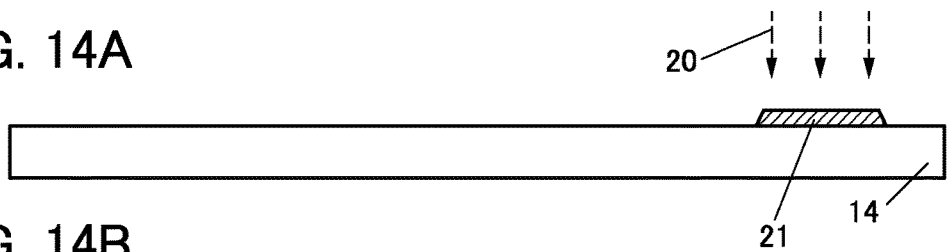
FIGS. 14A to 14F illustrate an example of a manufacturing method of a flexible device.

First, an island-shaped oxide layer 21 is formed over the formation substrate 14 (FIG. 14A).

For the material that can be used for the formation substrate 14, the description of the manufacturing method example 1A in Embodiment 1 can be referred to.

The oxide layer 21 preferably has a function of releasing oxygen when the oxide layer 21 generates heat by absorbing light.

As the oxide layer 21, an oxide layer from which oxygen is released by heating can be used, for example. Examples of the oxide layer 21 include an oxide conductive layer (including an oxide semiconductor layer in which the density of defect states or the density of impurity states are increased), and an oxide semiconductor layer. Note that an oxide insulating layer can be used as the oxide layer 21 in the case where the oxide layer 21 does not remain in a flexible device, for example.

For the oxide layer 21, for example, an oxide semiconductor that can be used for a semiconductor layer of a transistor, an oxide conductor that can be used for a conductive layer of a transistor, and an oxide insulator that can be used for an insulating layer of a transistor can be used.

For the oxide layer 21, for example, an In-M-Zn-based oxide layer (M is Al, Ga, Y, or Sn) can be used. It is particularly preferable to use an In—Ga—Zn-based oxide layer.

In the case where the oxide layer 21 includes an In-M-Zn oxide, it is preferable that the atomic ratio of metal elements of a sputtering target used to deposit a film of the In-M-Zn oxide be In:M:Zn=4:2:3, In:M:Zn=4:2:4.1, In:M:Zn=5:1:6, In:M:Zn=5:1:7, In:M:Zn=5:1:8, or the like. When a material with a high proportion of In is used, the energy gap of the oxide layer 21 can be made small and sufficient light can be absorbed by the oxide layer 21. This can improve the yield of peeling. In addition, when the above-described material with a high proportion of In is used, the conductivity of the oxide layer 21 can be increased. Note that the atomic ratio of metal elements in the formed oxide layer 21 varies from the above atomic ratios of metal elements of the sputtering targets in a range of ±40%.

For the material and formation method that can be used for the oxide layer 21, the description of the manufacturing method example 1A in Embodiment 1 can be referred to.

Plasma treatment or the like may be performed after the oxide layer 21 is formed to reduce the resistivity of the oxide layer 21. FIG. 14A illustrates an example in which the island-shaped oxide layer 21 is irradiated with plasma 20. The plasma treatment may be performed before the oxide layer 21 is processed into an island shape.

Note that by heat treatment in the following steps, oxygen and/or moisture are/is released from the oxide layer 21, oxygen vacancies are caused, and the resistivity of the oxide layer 21 is reduced in some cases.

The manufacturing cost can be reduced by forming the oxide layer 21 and the semiconductor layer of the transistor using the same metal element. For example, the use of metal oxide targets with the same metal composition can reduce the manufacturing cost. By using the metal oxide target with the same metal composition, an etching gas or an etchant used in the processing of the oxide semiconductor layer can also be used for processing of the oxide layer 21. Note that even when the oxide layer 21 and the semiconductor layer of the transistor include the same metal elements, they have different compositions in some cases. For example, a metal element in a film is released during the fabrication process of the device, which might result in different metal compositions.

Figure 14B:
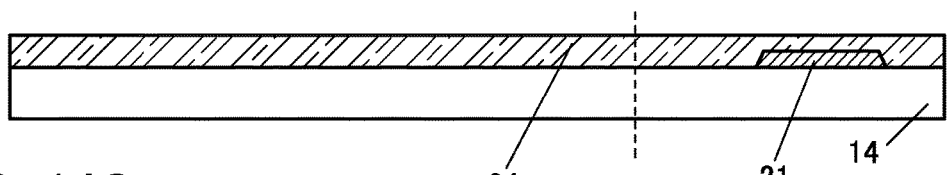

Next, the first layer 24 is formed using a photosensitive material (FIG. 14B).

In particular, a photosensitive and thermosetting material is preferably used. In this embodiment, an example of using a photosensitive and thermosetting material is shown.

Figure 14C:
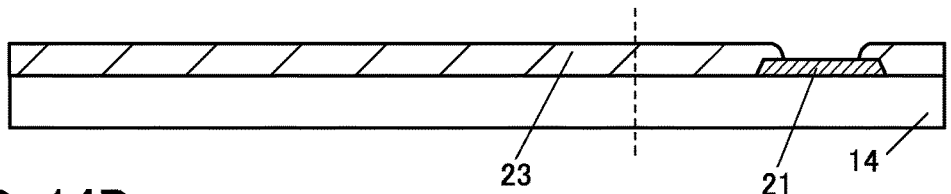

Since the first layer 24 is formed using the photosensitive material in one embodiment of the present invention, part of the first layer 24 can be removed by a photolithography method. Specifically, after the material is deposited, pre-baking is performed, and then light exposure is performed using a photomask. Next, development is performed, whereby an unnecessary portion can be removed. Then, the first layer 24 processed into a desired shape is subjected to post-baking so that the resin layer 23 is formed (FIG. 14C). FIG. 14C illustrates an example in which an opening that reaches the oxide layer 21 is provided in the resin layer 23.

By post-baking, released gas components (e.g., hydrogen and/or water) in the resin layer 23 can be reduced. It is particularly preferable that heating be performed at a temperature higher than or equal to the formation temperature of each layer formed over the resin layer 23. For example, in the case where the formation temperature of the transistor is below 350° C., the film to be the resin layer 23 is preferably heated at a temperature higher than or equal to 350° C. and lower than or equal to 450° C., further preferably higher than or equal to 350° C. and lower than 400° C., still further preferably higher than or equal to 350° C. and lower than 400° C., and yet still further preferably higher than or equal to 350° C. and lower than 375° C. Thus, a gas released from the resin layer 23 in the fabrication process of the transistor can be significantly reduced.

In the post-baking, heating is preferably performed at a temperature at which oxygen is less likely to be released from the oxide layer 21. Accordingly, a defect such as peeling of the oxide layer 21 before irradiation with laser light can be prevented and thus a decrease in yield can be suppressed. Note that the steps performed before the oxide layer 21 is irradiated with laser light, which will be described later, are preferably performed at a temperature at which oxygen is less likely to be released from the oxide layer 21.

For the material and formation method that can be used for the resin layer 23 (first layer 24), the description of the manufacturing method example 1A can be referred to.

The resin layer 23 preferably has a thickness greater than or equal to 0.01 μm and less than 10 μm, further preferably greater than or equal to 0.1 μm and less than or equal to 3 μm, and still further preferably greater than or equal to 0.5 μm and less than or equal to 1 μm. It is preferable that the resin layer 23 be formed thicker than the oxide layer 21.

Figure 14D:
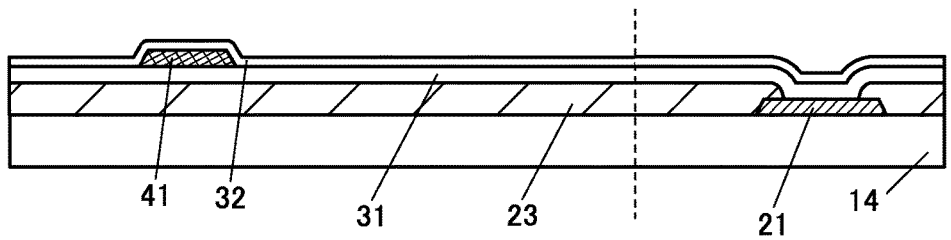

Next, the insulating layer 31 is formed over the resin layer 23 (FIG. 14D). For the material and formation method of the insulating layer 31, the description of the manufacturing method example 1A can be referred to.

Figure 14E:
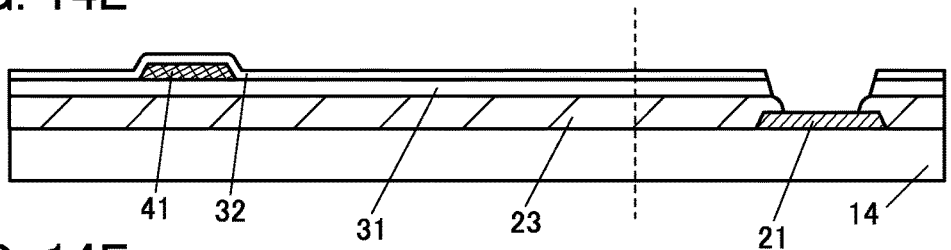
Figure 14F:
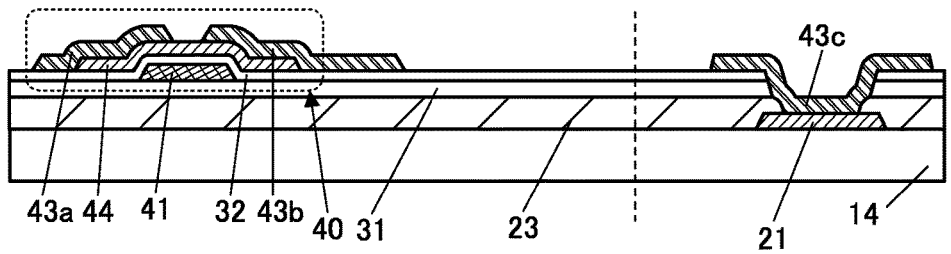

Next, the transistor 40 is formed over the insulating layer 31 (FIGS. 14D to 14F). For the material and formation method of the transistor 40, the description of the manufacturing method example 1A can be referred to.

Specifically, first, the conductive layer 41 is formed over the insulating layer 31 (FIG. 14D).

Next, the insulating layer 32 is formed (FIG. 14D).

Next, an opening of the insulating layer 31 and an opening of the insulating layer 32 are provided in a region overlapping with the opening of the resin layer 23 (FIG. 14E). Here, an example in which the openings of the insulating layer 31 and the insulating layer 32 are formed at a time is shown. The oxide layer 21 is exposed by providing the openings.

Then, the oxide semiconductor layer 44 is formed (FIG. 14F).

Next, the conductive layer 43a, the conductive layer 43b, and the conductive layer 43c are formed (FIG. 14F). The conductive layers 43a and 43b are connected to the oxide semiconductor layer 44. The conductive layer 43c is connected to the oxide layer 21 through the openings provided in the resin layer 23, the insulating layer 31, and the insulating layer 32.

Hydrogen and/or nitrogen might be supplied to the oxide layer 21 when the conductive layer 43c is formed, which might reduce the resistivity of the oxide layer 21. In addition, the resistivity of the oxide layer 21 might be reduced by extraction of oxygen in the oxide layer 21 by the conductive layer 43c.

In the above manner, the transistor 40 can be formed (FIG. 14F).

Figure 15A:
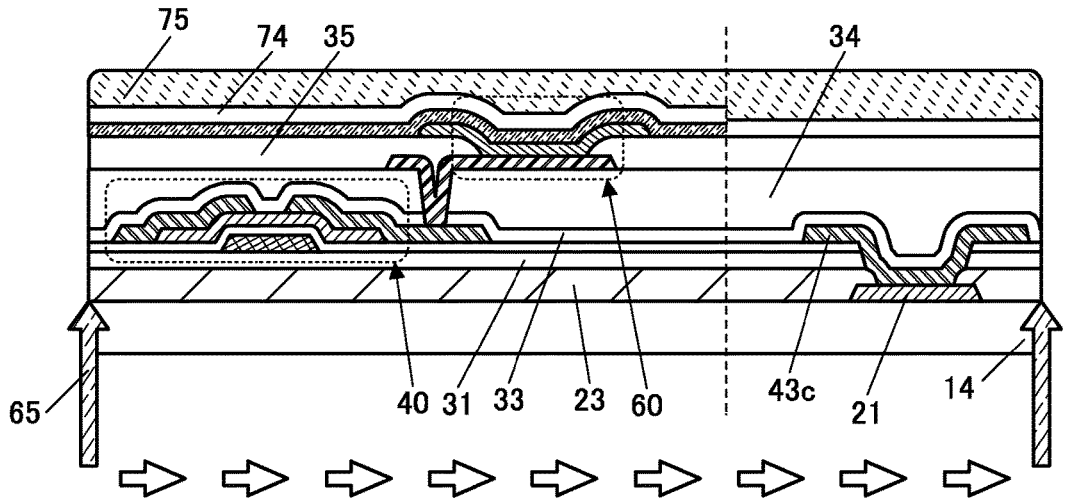
FIGS. 15A to 15C illustrate examples of a manufacturing method of a flexible device.

Next, components from the insulating layer 33 to the protective layer 75 are formed in this order in a manner similar to that in the manufacturing method example 1A (FIG. 15A).

Next, the resin layer 23 and the oxide layer 21 are irradiated with the laser light 65 through the formation substrate 14 (FIG. 15A). The laser light 65 is, for example, a linear laser beam with which scanning is performed from the left side to the right side in FIG. 15A, and the major axis is perpendicular to the scanning direction and the incident direction (from bottom to top).

The resin layer 23 and the oxide layer 21 absorb the laser light 65.

With irradiation with the laser light 65, the resin layer 23 is embrittled. Alternatively, with irradiation with the laser light 65, the adhesion between the resin layer 23 and the formation substrate 14 is decreased.

With irradiation with the laser light 65, the oxide layer 21 is embrittled. Alternatively, with irradiation with the laser light 65, the adhesion between the oxide layer 21 and the conductive layer 43c or the adhesion between the oxide layer 21 and the formation substrate 14 is decreased.

By irradiation with the laser light 65, the oxide layer 21 is heated and oxygen is released from the oxide layer 21 in some cases. At this time, oxygen is released in a gaseous state, for example. The released gas remains near the interface between the oxide layer 21 and the conductive layer 43c or near the interface between the oxide layer 21 and the formation substrate 14; thus, the force of peeling is generated therebetween. Consequently, adhesion between the oxide layer 21 and the conductive layer 43c or adhesion between the oxide layer 21 and the formation substrate 14 is reduced and a state where peeling is easily performed can be formed.

Part of the oxygen released from the oxide layer 21 remains in the oxide layer 21 in some cases. Thus, the oxide layer 21 is embrittled and separation is likely to occur inside the oxide layer 21 in some cases.

As the laser light 65, light having a wavelength by which at least part of the laser light 65 is transmitted through the formation substrate 14 and absorbed by the resin layer 23 and the oxide layer 21 is selected. The laser light 65 is preferably light having a wavelength which is absorbed by the resin layer 23. The laser light 65 is preferably light having a wavelength range from visible light to ultraviolet light. For example, light having a wavelength of greater than or equal to 200 nm and less than or equal to 400 nm, preferably greater than or equal to 250 nm and less than or equal to 350 nm, can be used. In particular, an excimer laser having a wavelength of 308 nm is preferably used because the productivity is increased. The excimer laser is preferable because the excimer laser can be used also for laser crystallization of LTPS, so that the existing LTPS production line device can be used and newly capital investment is not necessary. Alternatively, a solid-state UV laser (also referred to as a semiconductor UV laser), such as a UV laser having a wavelength of 355 nm which is the third harmonic of an Nd:YAG laser, may be used. A solid-state laser is preferable because the solid-state laser does not use a gas and thus the running cost can be reduced to approximately ⅓ of the case of an excimer laser. Further alternatively, a pulsed laser such as a picosecond laser may be used.

In the case where linear laser light is used as the laser light 65, the laser light 65 is scanned and a region to be peeled is entirely irradiated with the laser light 65 by relatively moving the formation substrate 14 and a light source.

Note that by irradiation of the oxide layer 21 with the laser light 65, oxygen and/or moisture are/is released from the oxide layer 21, oxygen vacancies are caused, and the resistivity of the oxide layer 21 is reduced in some cases.

Next, the formation substrate 14 and the transistor 40 are separated from each other (FIG. 15B, 15C, 16A, or 16B).

The position of the separation surface may vary depending on materials and the formation methods of the oxide layer 21, the resin layer 23, the conductive layer 43c, the formation substrate 14, and the like, conditions of light irradiation, and the like.

Figure 15B:
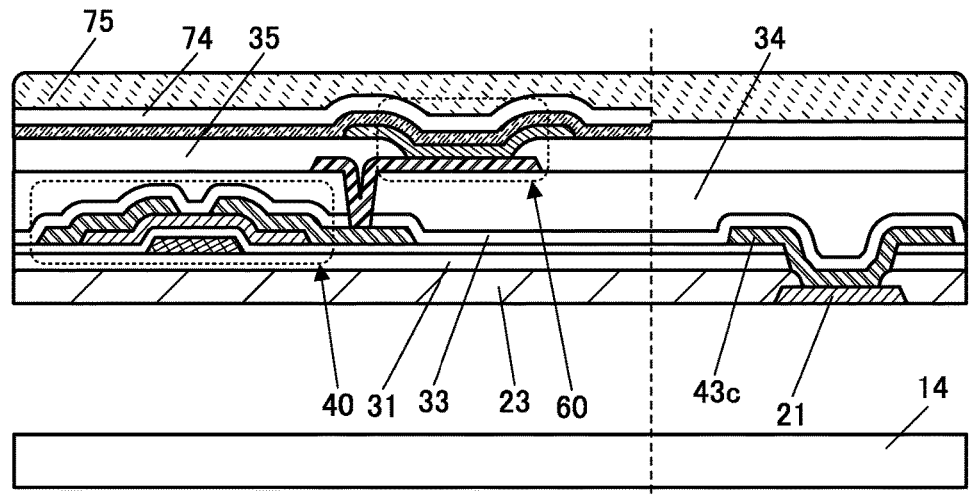

FIG. 15B illustrates an example in which separation occurs at the interface between the formation substrate 14 and the oxide layer 21 and the interface between the formation substrate 14 and the resin layer 23. The resin layer 23 and the oxide layer 21 are exposed by the separation.

Figure 15C:
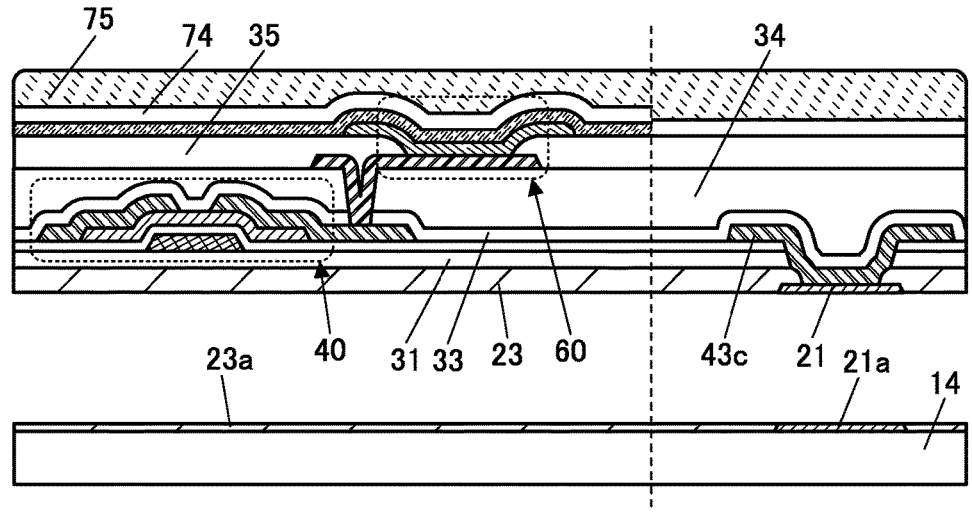

FIG. 15C illustrates an example in which separation occurs in the resin layer 23 and the oxide layer 21. Part of the resin layer (a resin layer 23a) and part of the oxide layer (an oxide layer 21a) remain over the formation substrate 14. The thicknesses of the resin layer 23 and the oxide layer 21 remaining on the insulating layer 31 side are reduced as compared with that in FIG. 15A.

Figure 16A:
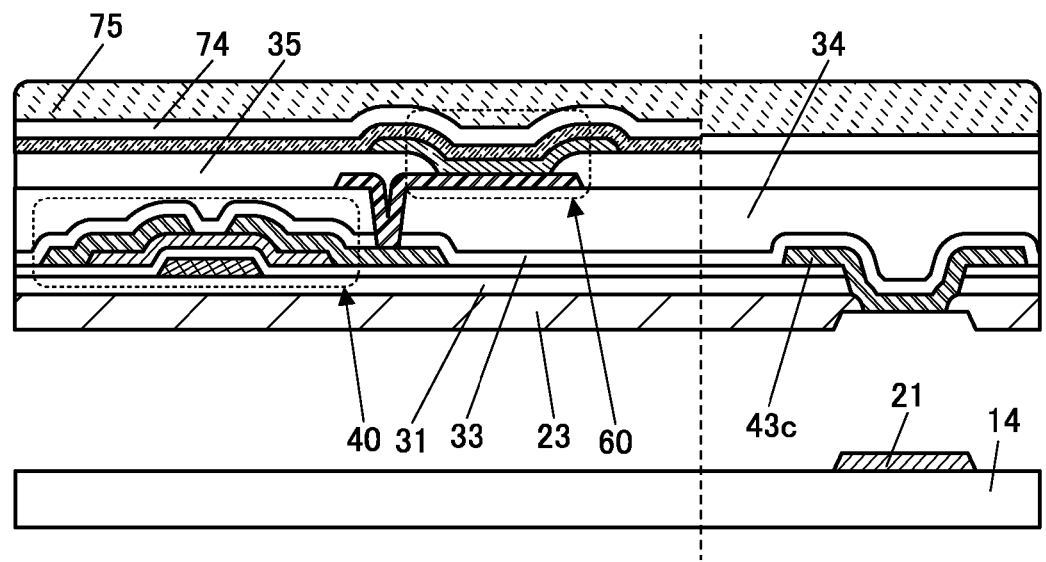
FIGS. 16A and 16B each illustrate an example of a manufacturing method of a flexible device.
Figure 16B:
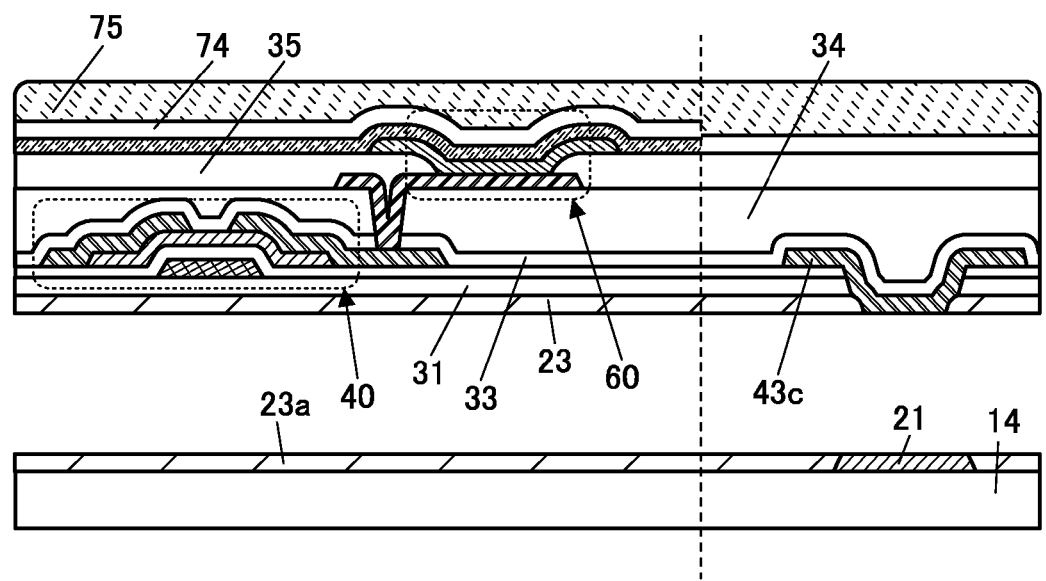

FIGS. 16A and 16B each illustrate an example in which separation occurs at the interface between the oxide layer 21 and the conductive layer 43c. At this time, the conductive layer 43c is exposed on the insulating layer 31 side and the oxide layer 21 remains over the formation substrate 14. FIG. 16A illustrates an example in which separation occurs at the interface between the formation substrate 14 and the resin layer 23. FIG. 16B illustrates an example in which separation occurs in the resin layer 23.

The formation substrate 14 can be reused by removing the resin layer 23a and the oxide layer 21a remaining on the formation substrate 14 side.

The formation substrate 14 can be peeled by applying a perpendicular tensile force to the resin layer 23 and the oxide layer 21, for example. Specifically, the formation substrate 14 can be peeled by attaching a mechanism to part of the top surface of the protective layer 75 and pulling up the protective layer 75.

The separation trigger is preferably formed by inserting a sharp instrument such as a knife between the formation substrate 14 and the insulating layer 31.

Figure 17A:
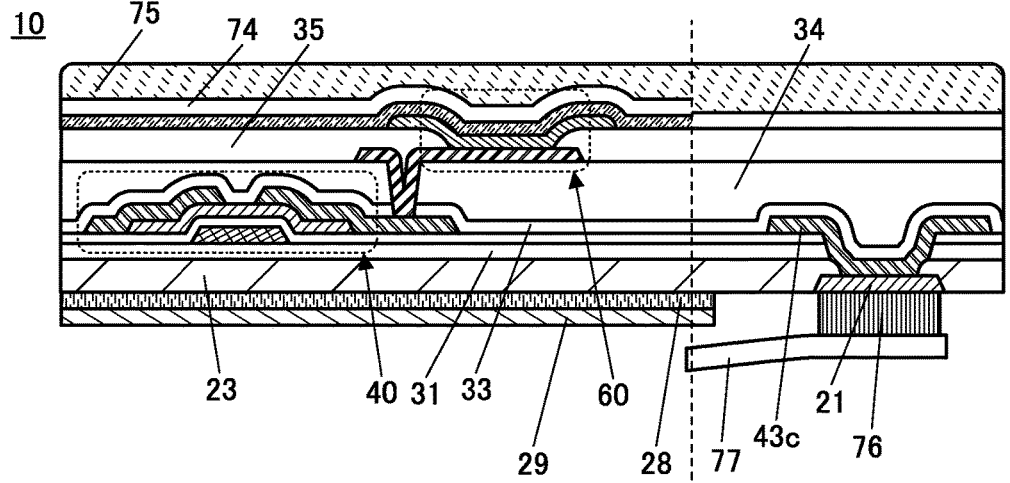
FIGS. 17A to 17C each illustrate an example of a flexible device.
Figure 17B:
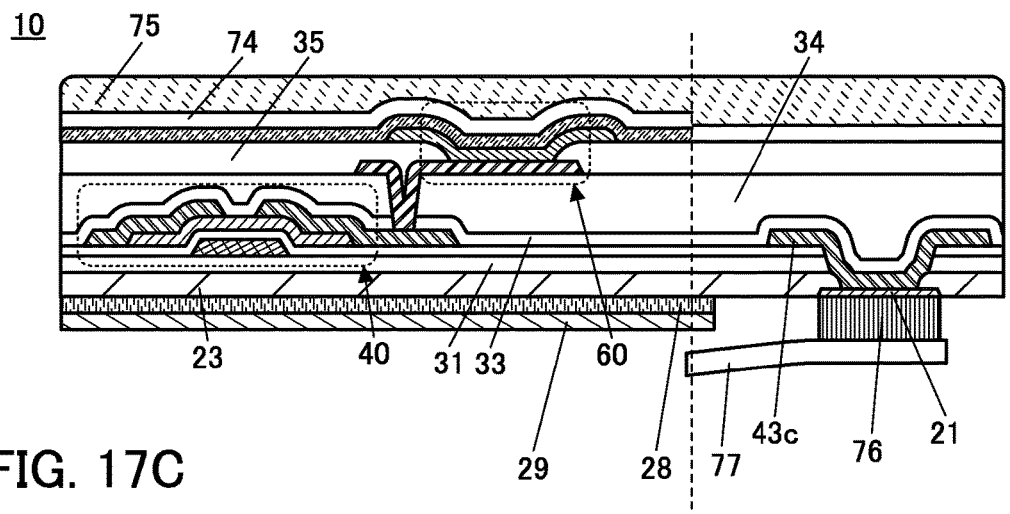
Figure 17C:
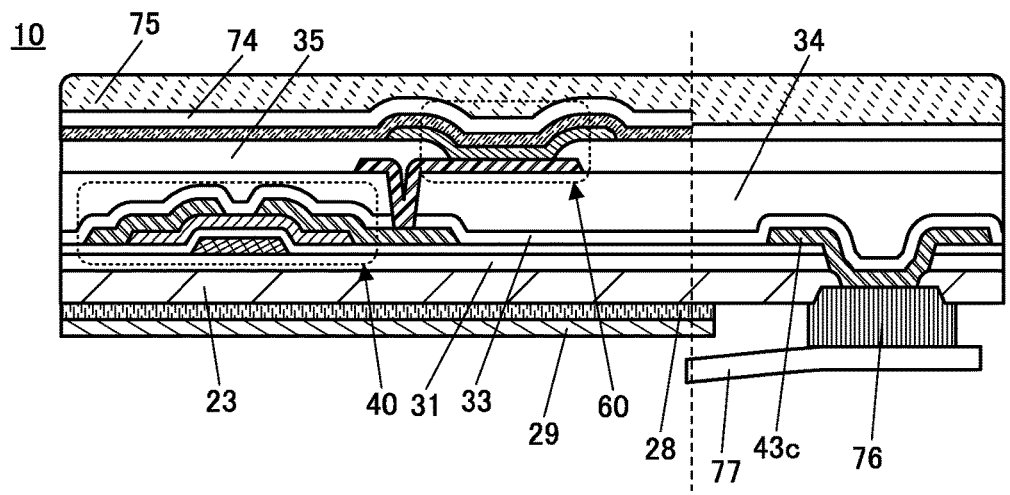

The separation of the formation substrate 14 and the transistor 40 can obtain the display device 10. FIG. 17A illustrates the display device 10 that can be obtained in the case where separation occurs at the interface indicated in FIG. 15B. FIG. 17B illustrates the display device 10 that can be obtained in the case where separation occurs at the interface indicated in FIG. 15C. FIG. 17C illustrates the display device 10 that can be obtained in the case where separation occurs at the interface indicated in FIG. 16A. The display device 10 can remain being bent or can be bent repeatedly, for example.

As illustrated in FIGS. 17A to 17C, the substrate 29 may be attached to the surface of the resin layer 23 that is exposed by the separation, with the bonding layer 28. Note that the substrate 29 and the bonding layer 28 are provided in a position that does not overlap with the oxide layer 21. The substrate 29 can function as a supporting substrate of the flexible device.

The material that can be used for the substrate 75a can be used for the substrate 29.

Then, the oxide layer 21 and the FPC 77 are electrically connected to each other through the connector 76 (FIGS. 17A and 17B). Accordingly, the conductive layer 43c and the FPC 77 can be electrically connected to each other. Alternatively, the conductive layer 43c and the FPC 77 are electrically connected to each other through the connector 76 as illustrated in FIG. 17C.

In this embodiment, an example using a top-emission light-emitting element is shown. In the case where an external connection terminal is exposed from the protective layer 75 side and electrically connected to the FPC 77, a display region cannot overlap with the FPC 77 because the protective layer 75 is on the display surface side, and thus a region of the display device that overlaps with the FPC 77 is limited. In contrast, in one embodiment of the present invention, the conductive layer 43c and the oxide layer 21 can be connected to each other through the opening of the resin layer 23 by using the photosensitive material for the resin layer 23. Then, the oxide layer 21 or the conductive layer 43c can be exposed from the side opposite to the display surface by peeling the formation substrate 14 and, after that, the FPC 77 can be electrically connected to the oxide layer 21 or the conductive layer 43c. As described above, in one embodiment of the present invention, an oxide semiconductor layer or an oxide conductive layer is formed as the oxide layer 21. In one embodiment of the present invention, even in the case where an oxide semiconductor layer is used as the oxide layer 21, the resistivity of the oxide layer 21 can be sufficiently reduced by performing at least one of a plasma treatment step, a heat treatment step, a formation step of a layer over the oxide layer 21, a laser light irradiation step, and the like. Thus, the conductive layer 43c and the FPC 77 can be electrically connected to each other without fail through the oxide layer 21. Such a structure allows the FPC 77 to be positioned on the side opposite to the display surface. Thus, a space for bending the FPC 77 in incorporating the display device in an electronic device can be saved, which enables the electronic device to be smaller.

Through the above steps, the display device using an oxide semiconductor for the transistor and a separate coloring method for an EL element can be fabricated (FIGS. 17A to 17C).

Manufacturing Method Example 2B

Figure 18A:
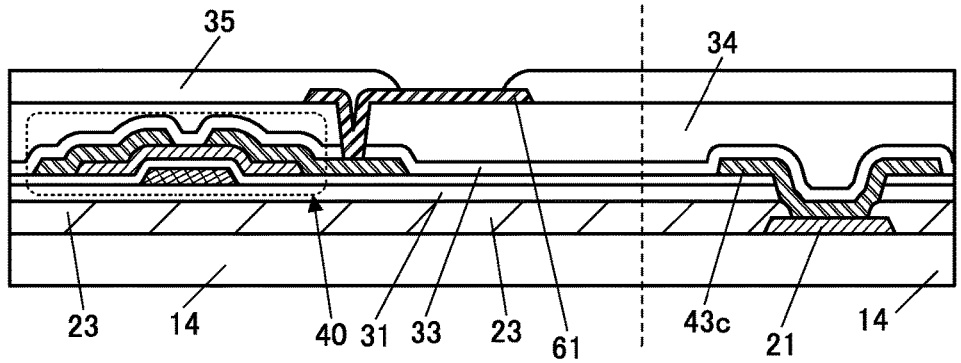
FIGS. 18A to 18C illustrate an example of a manufacturing method of a flexible device.

First, components from the oxide layer 21 to the insulating layer 35 are formed in this order over the formation substrate 14 in a manner similar to that in the manufacturing method example 1B (FIG. 18A).

Figure 18B:
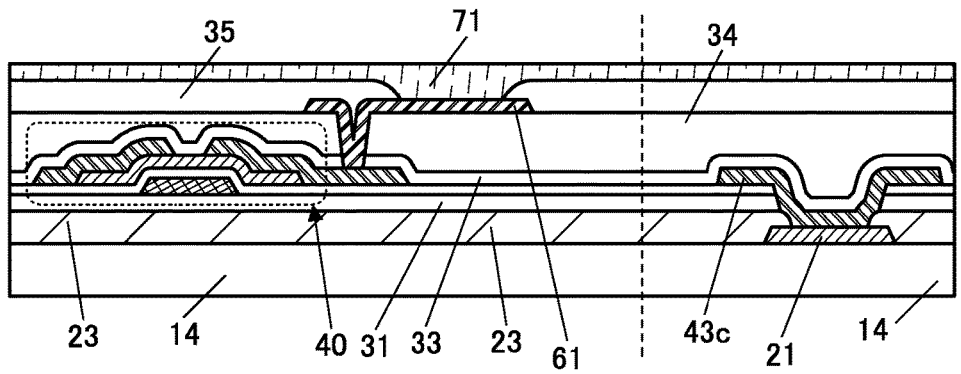

Then, the protective layer 71 is formed as illustrated in FIG. 18B. For the material and formation method of the protective layer 71, the description of the manufacturing method example 1B in Embodiment 1 can be referred to.

Figure 18C:
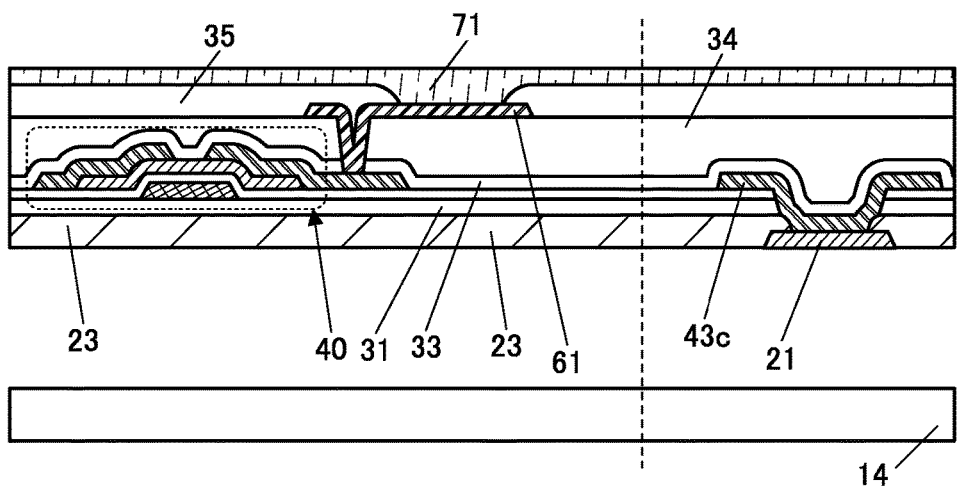

Next, the formation substrate 14 and the transistor 40 are separated from each other in a manner similar to that in the manufacturing method example 1B (FIG. 18C). FIG. 18C illustrates an example in which separation occurs at the interface between the formation substrate 14 and the oxide layer 21 and the interface between the formation substrate 14 and the resin layer 23. The resin layer 23 and the oxide layer 21 are exposed by the separation.

After the formation substrate 14 and transistor 40 are separated from each other, the protective layer 71 is removed.

Then, the EL layer 62 and the conductive layer 63 are formed, whereby the display element 60 is obtained. Thus, by sealing the display element 60, the display device 10 can be obtained. For sealing of the display element 60, one or more of the insulating layer 74, the protective layer 75, the substrate 75a, the bonding layer 75b, and the like can be used.

The EL layer 62 and the conductive layer 63 may be formed while the resin layer 23 and the conductive layer 43c are fixed to a stage of a deposition apparatus, but are preferably formed while the resin layer 23 and the conductive layer 43c are fixed to a supporting substrate by a tape or the like and the supporting substrate is placed on the stage. Fixing the resin layer 23 and the conductive layer 43c to the supporting substrate facilitates the transfer of the stacked-layer structure including the resin layer 23.

In the manufacturing method example 2B, after the formation substrate 14 is peeled, the EL layer 62 and the conductive layer 63 can be formed. In the case where a region having low adhesion is generated in a stack including the EL layer 62 and the like, the stack is formed after peeling so that a decrease in the yield of peeling can be suppressed. With the use of the manufacturing method example 2B, a material can be selected more freely, leading to fabrication of a highly reliable display device at lower cost.

Manufacturing Method Example 3B

Next, the case of fabricating a display device with a color filter method that uses an oxide semiconductor for a transistor will be described as an example. A flexible device of one embodiment of the present invention and a manufacturing method thereof will be specifically described below with reference to FIGS. 19A to 19E, FIGS. 20A to 20C, FIGS. 21A and 21B, FIGS. 22A and 22B, FIGS. 23A and 23B, FIGS. 24A to 24C, and FIGS. 25A and 25B.

Figure 19A:
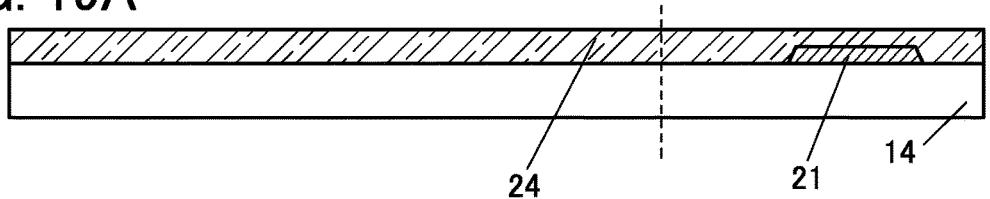
FIGS. 19A to 19E illustrate an example of a manufacturing method of a flexible device.

First, the island-shaped oxide layer 21 is formed over the formation substrate 14 in a manner similar to that in the manufacturing method example 1B (FIG. 19A). Note that plasma treatment or the like may be performed after the oxide layer 21 is formed to reduce the resistivity of the oxide layer 21.

Next, the first layer 24 is formed using a photosensitive material in a manner similar to that in the manufacturing method example 1B (FIG. 19A).

Figure 19B:
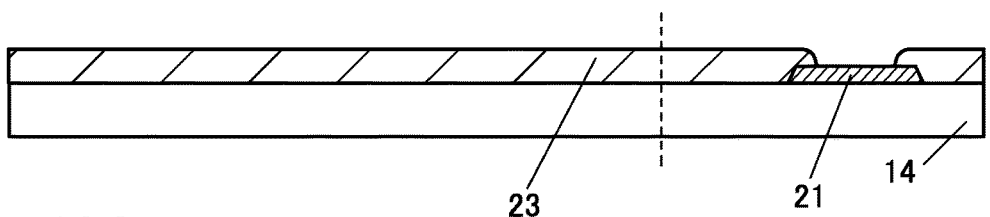

Next, the first layer 24 processed into a desired shape is heated in a manner similar to that in the manufacturing method example 1B, whereby the resin layer 23 is formed (FIG. 19B). FIG. 19B illustrates an example in which the opening that reaches the oxide layer 21 is provided in the resin layer 23.

Figure 19C:
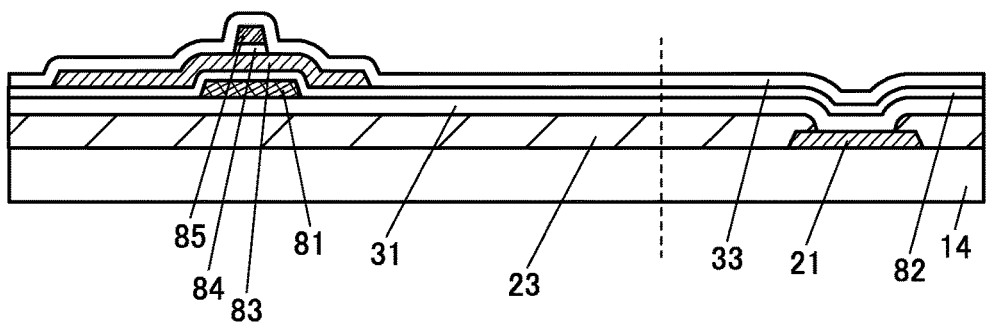

Next, the insulating layer 31 is formed over the resin layer 23 in a manner similar to that in the manufacturing method example 1B (FIG. 19C).

Figure 19D:
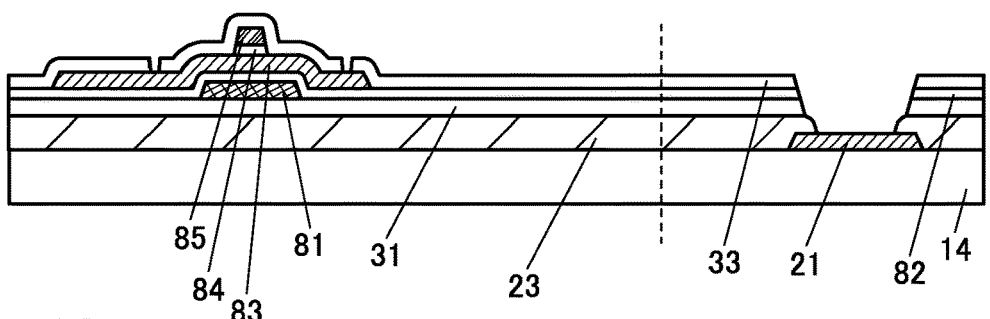
Figure 19E:
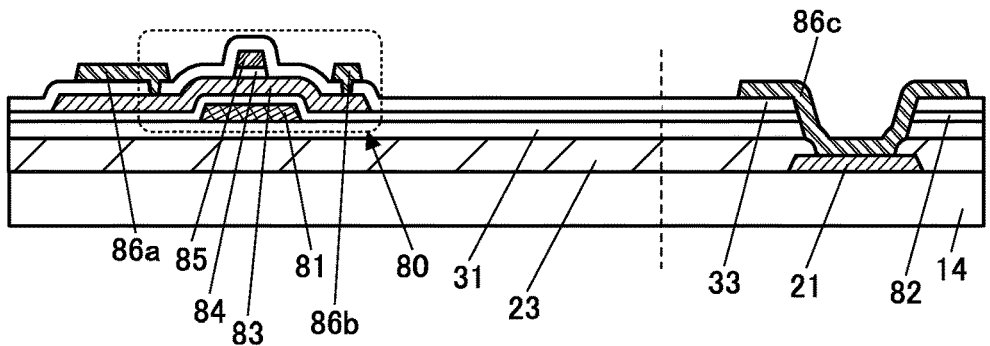

Next, the transistor 80 is formed over the insulating layer 31 (FIGS. 19C to 19E). For the material and formation method of the transistor 80, the description of the manufacturing method example 3A in Embodiment 1 can be referred to.

Specifically, first, the conductive layer 81 is formed over the insulating layer 31 (FIG. 19C).

Next, the insulating layer 82 is formed (FIG. 19C).

Then, the oxide semiconductor layer 83 is formed (FIG. 19C).

Then, the insulating layer 84 and the conductive layer 85 are formed (FIG. 19C).

Next, the insulating layer 33 that covers the oxide semiconductor layer 83, the insulating layer 84, and the conductive layer 85 is formed (FIG. 19C).

An opening of the insulating layer 31, an opening of the insulating layer 82, and an opening of the insulating layer 33 are provided in a region overlapping with the opening of the resin layer 23 (FIG. 19D). The oxide layer 21 is exposed by providing the openings. Here, an example in which the openings of the insulating layer 31, the insulating layer 82, and the insulating layer 33 are formed at a time is shown.

Next, the conductive layers 86a, 86b, and 86c are formed (FIG. 19E). The conductive layers 86a and 86b are electrically connected to the oxide semiconductor layer 83 through the openings of the insulating layer 33. The conductive layer 86c is connected to the oxide layer 21 through the openings provided in the resin layer 23, the insulating layer 31, the insulating layer 82, and the insulating layer 33.

In the above manner, the transistor 80 can be formed (FIG. 19E).

Figure 20A:
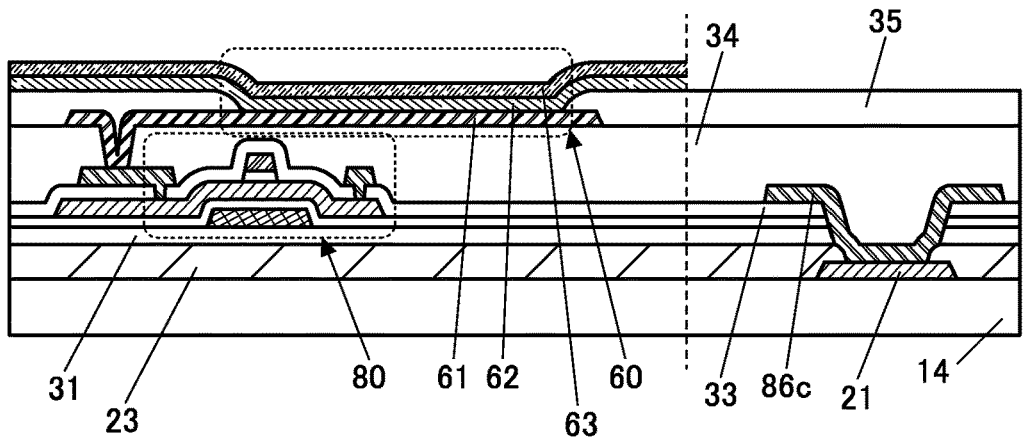
FIGS. 20A to 20C illustrate an example of a manufacturing method of a flexible device.

Next, components from the insulating layer 34 to the display element 60 are formed over the insulating layer 33 (FIG. 20A). For these steps, the description of the manufacturing method example 1A can be referred to.

Figure 20B:
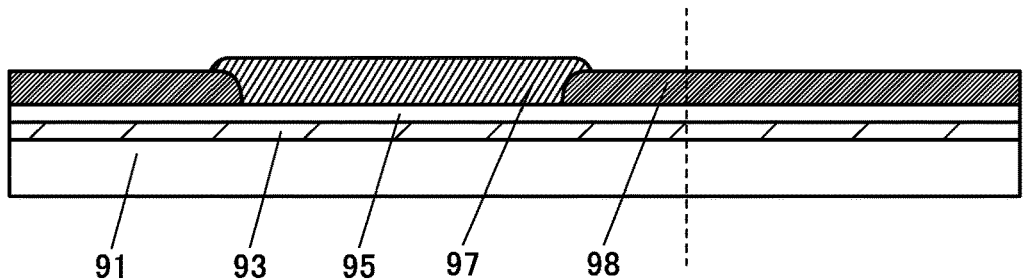
Figure 20C:
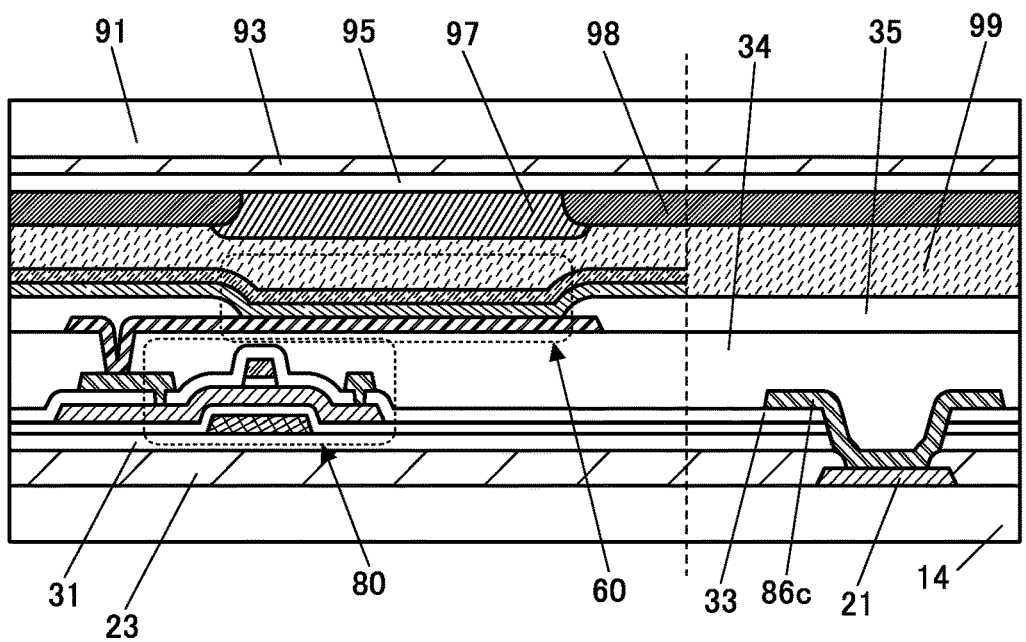

In a manner similar to that in the manufacturing method example 3A, the resin layer 93, the insulating layer 95, the coloring layer 97, and the light-blocking layer 98 are formed over the formation substrate 91 (FIG. 20B). Then, a surface of the formation substrate 14 on which the oxide layer 21 and the like are formed and a surface of the formation substrate 91 on which the resin layer 93 and the like are formed are attached to each other with the bonding layer 99 (FIG. 20C).

Figure 21A:
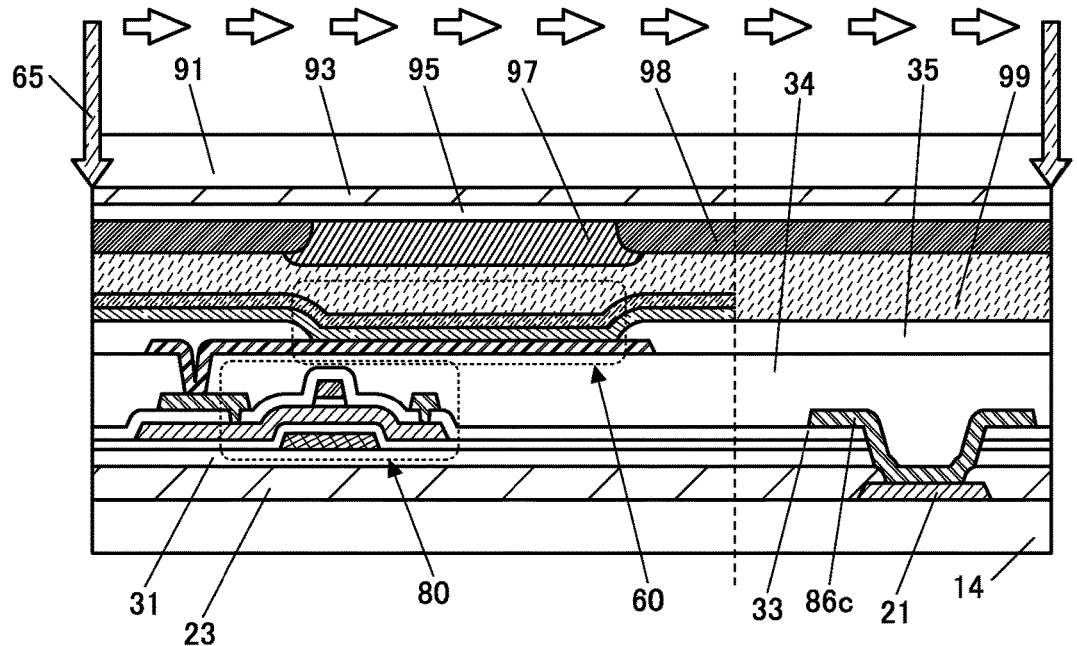
FIGS. 21A and 21B illustrate an example of a manufacturing method of a flexible device.

Next, the resin layer 93 is irradiated with the laser light 65 through the formation substrate 91 (FIG. 21A). Here, an example in which the formation substrate 91 is separated ahead of the formation substrate 14 is shown.

With irradiation with the laser light 65, the resin layer 93 is embrittled. Alternatively, with irradiation with the laser light 65, the adhesion between the resin layer 93 and the formation substrate 91 is decreased.

Figure 21B:
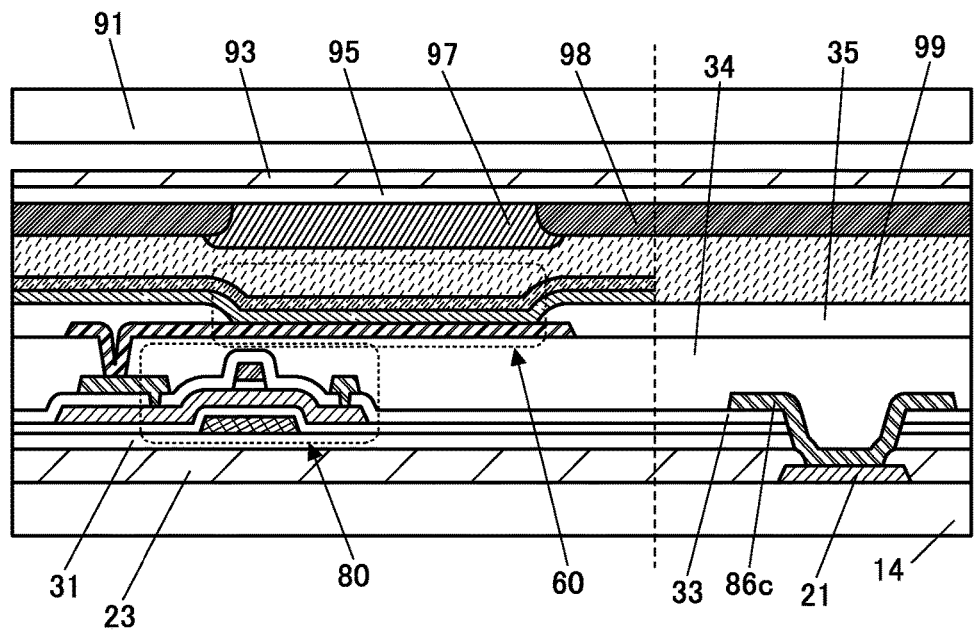

Then, the formation substrate 91 and the insulating layer 95 are separated from each other (FIG. 21B). FIG. 21B illustrates an example in which separation occurs at the interface between the formation substrate 91 and the resin layer 93.

Note that separation occurs in the resin layer 93 in some cases. At this time, part of the resin layer remains over the formation substrate 91 and thus the thickness of the resin layer 93 remaining on the insulating layer 95 side is reduced as compared with that in FIG. 21A.

Figure 22A:
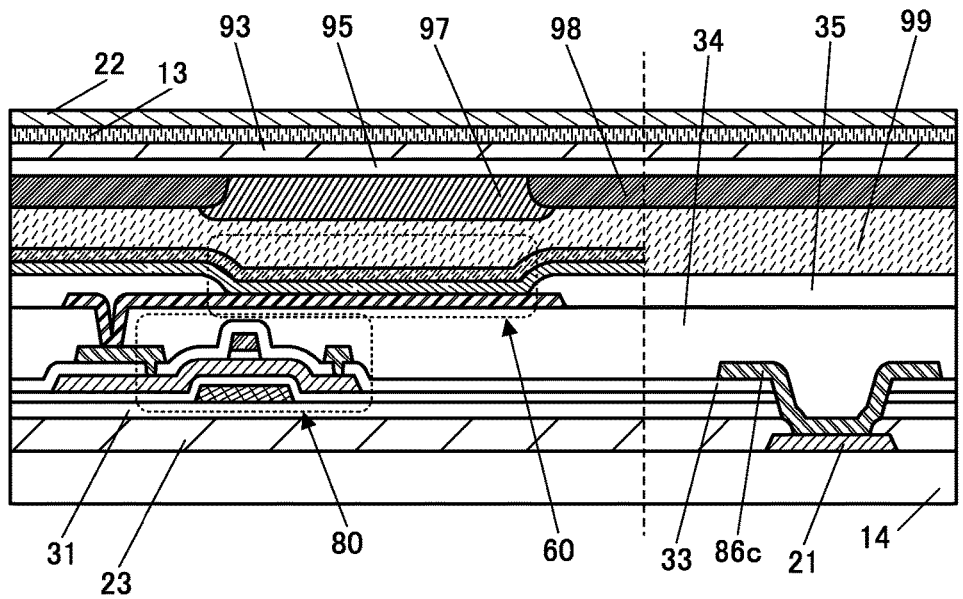
FIGS. 22A and 22B illustrate an example of a manufacturing method of a flexible device.

Then, the exposed resin layer 93 (or insulating layer 95) and the substrate 22 are attached to each other with the bonding layer 13 (FIG. 22A).

In FIG. 22A, light emitted from the display element 60 is extracted to the outside of the display device through the coloring layer 97 and the resin layer 93. Thus, the resin layer 93 preferably has high visible-light transmittance. In the peeling method of one embodiment of the present invention, the thickness of the resin layer 93 can be reduced. Therefore, the visible-light transmittance of the resin layer 93 can be increased.

In addition, the resin layer 93 may be removed, and the substrate 22 may be attached to the insulating layer 95 with the bonding layer 13.

Figure 22B:
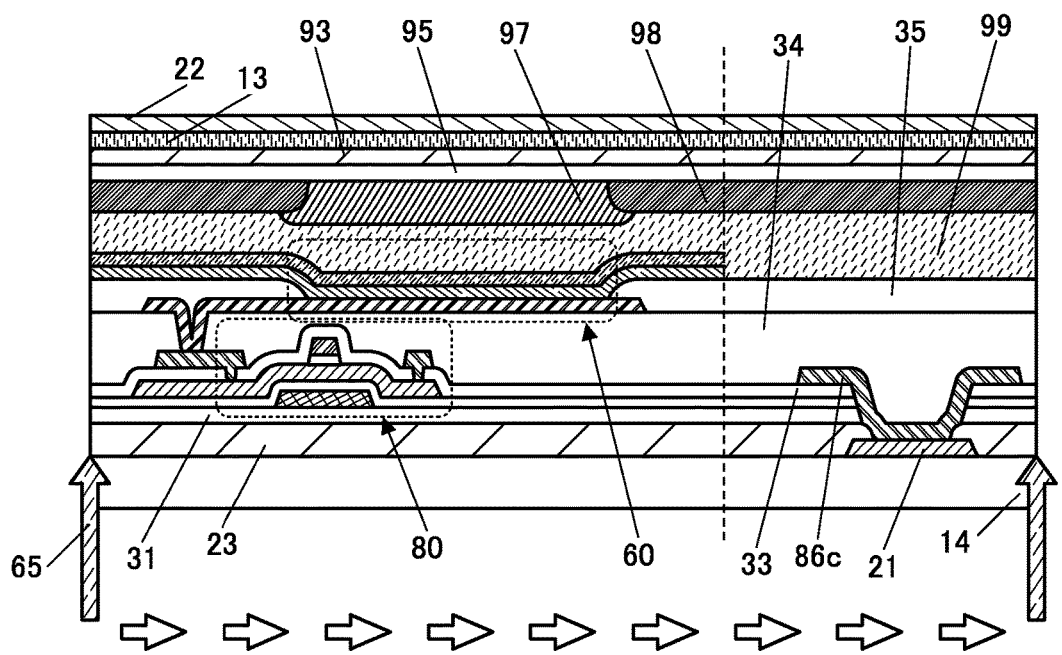

Next, the resin layer 23 and the oxide layer 21 are irradiated with the laser light 65 through the formation substrate 14 (FIG. 22B).

With irradiation with the laser light 65, the resin layer 23 is embrittled. Alternatively, with irradiation with the laser light 65, the adhesion between the resin layer 23 and the formation substrate 14 is decreased.

With irradiation with the laser light 65, the oxide layer 21 is embrittled. Alternatively, with irradiation with the laser light 65, the adhesion between the oxide layer 21 and the conductive layer 86c or the adhesion between the oxide layer 21 and the formation substrate 14 is decreased.

Figure 23A:
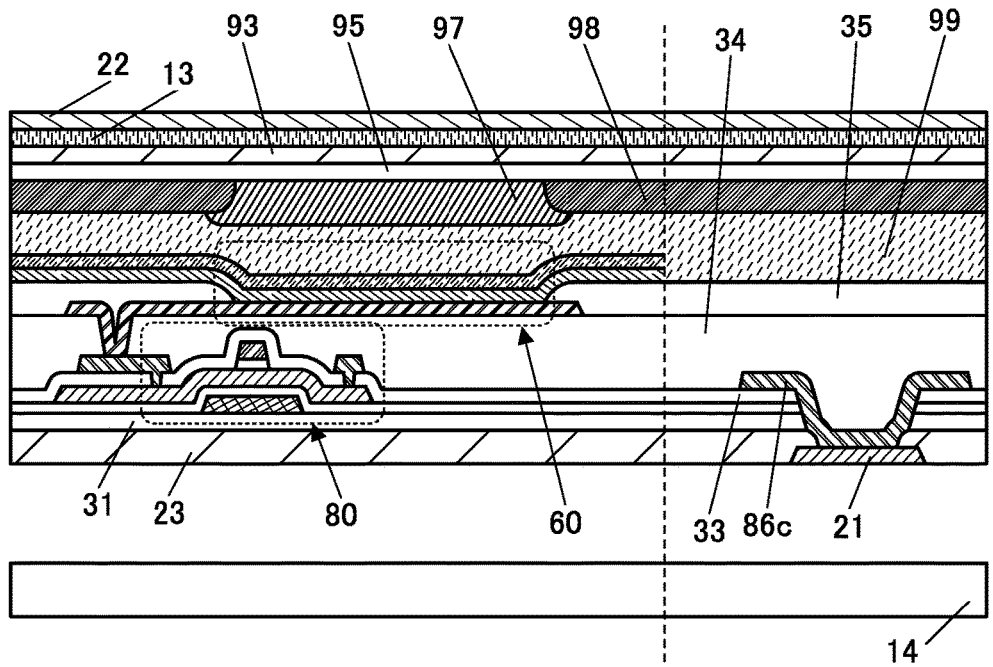
FIGS. 23A and 23B each illustrate an example of a manufacturing method of a flexible device.
Figure 23B:
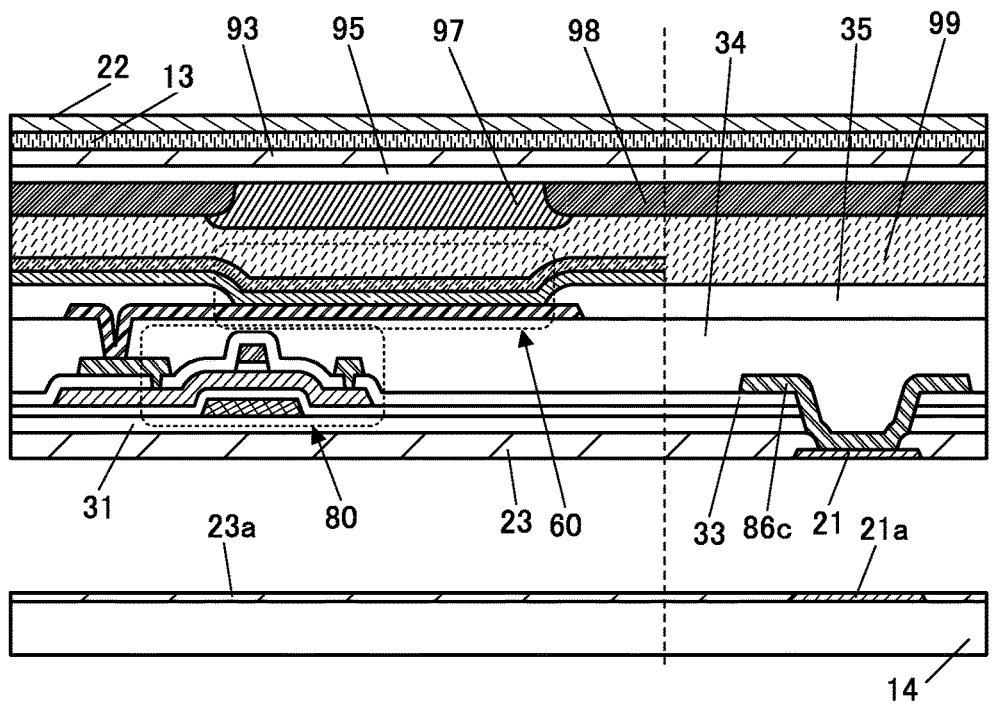

Then, the formation substrate 14 and the insulating layer 31 are separated from each other (FIG. 23A or 23B).

FIG. 23A illustrates an example in which separation occurs at the interface between the formation substrate 14 and the oxide layer 21 and the interface between the formation substrate 14 and the resin layer 23. The resin layer 23 and the oxide layer 21 are exposed by the separation.

FIG. 23B illustrates an example in which separation occurs in the resin layer 23 and the oxide layer 21. Part of the resin layer (resin layer 23a) and part of the oxide layer (oxide layer 21a) remain over the formation substrate 14. The thicknesses of the resin layer 23 and the oxide layer 21 remaining on the insulating layer 31 side are reduced as compared with that in FIG. 22B.

Note that separation might occur at the interface between the oxide layer 21 and the conductive layer 86c in a manner similar to that in the manufacturing method example 1B (see FIGS. 16A and 16B).

Figure 24A:
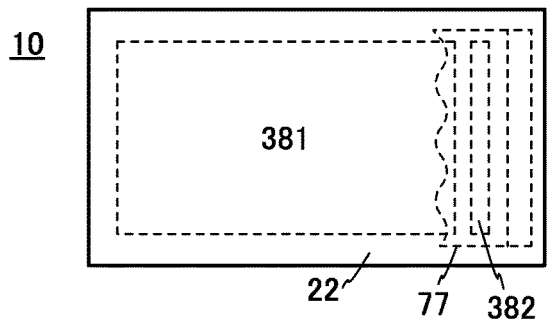
FIGS. 24A to 24C illustrate examples of a flexible device.
Figure 24B:
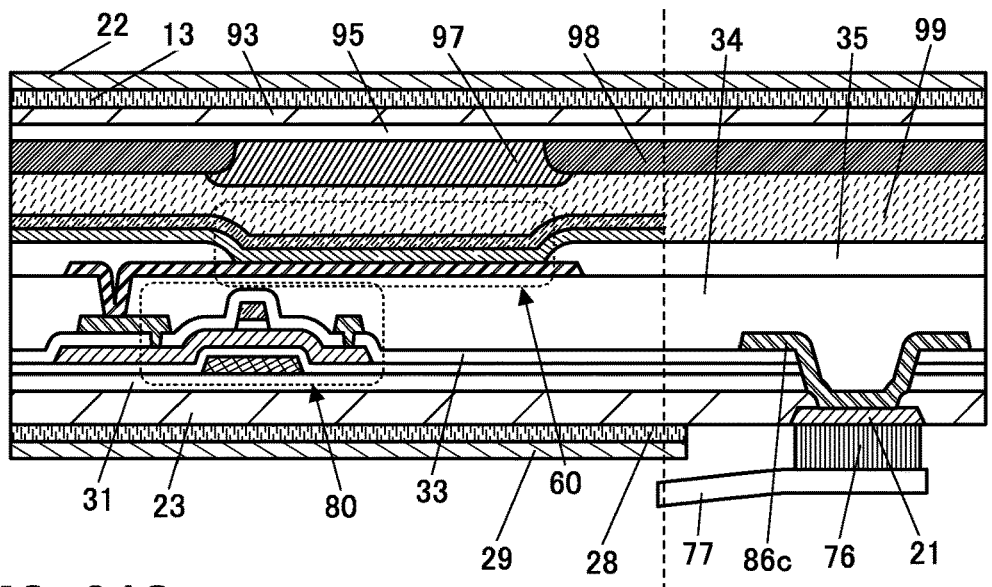
Figure 24C:
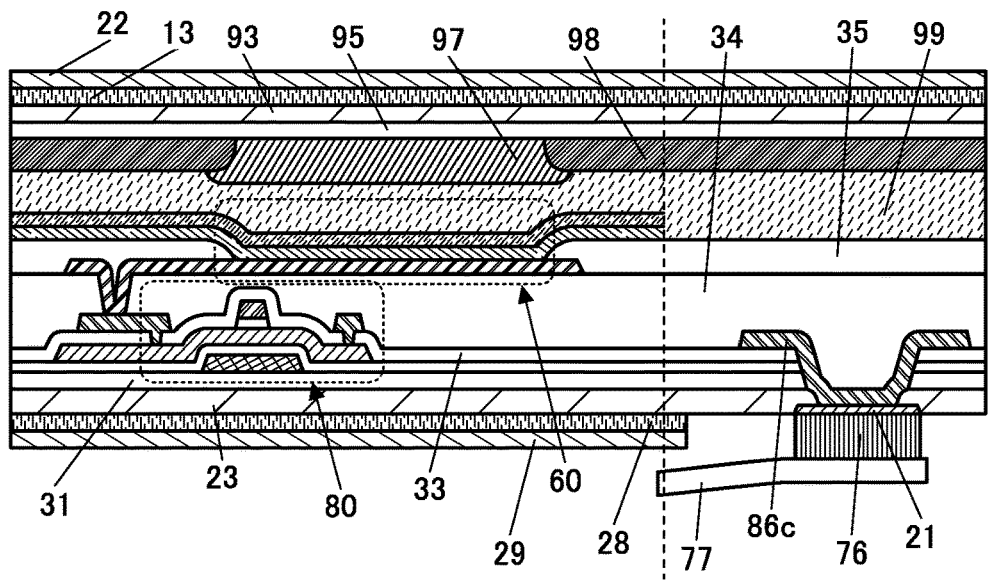

The separation of the formation substrate 14 and the transistor 80 can obtain the display device 10 (FIGS. 24A to 24C). The display device 10 can remain being bent or can be bent repeatedly, for example.

FIG. 24A is a top view of the display device 10. FIGS. 24B and 24C are each a cross-sectional view of the display portion 381 of the display device 10 and a cross-sectional view of a connection portion for connection to the FPC 77. FIG. 24B illustrates the display device 10 that can be obtained in the case where separation occurs at the interface indicated in FIG. 23A. FIG. 24C illustrates the display device 10 that can be obtained in the case where separation occurs at the interface indicated in FIG. 23B.

The display device 10 includes a pair of substrates (the substrate 22 and the substrate 29). The substrate 22 side corresponds to a display surface side. The display device includes the display portion 381 and the driver circuit portion 382. The FPC 77 is attached to the display device.

As illustrated in FIGS. 24B and 24C, the substrate 29 may be attached to the surface of the resin layer 23 that is exposed by the separation, with the bonding layer 28. Note that the substrate 29 and the bonding layer 28 are provided in a position that does not overlap with the oxide layer 21.

Then, the oxide layer 21 and the FPC 77 are electrically connected to each other through the connector 76 (FIGS. 24B and 24C). Accordingly, the conductive layer 86c and the FPC 77 can be electrically connected to each other.

In this embodiment, an example using a top-emission light-emitting element is described. In the case where an external connection terminal is exposed from the substrate 22 side and electrically connected to the FPC 77, a display region cannot overlap with the FPC 77 because the substrate 22 is on the display surface side, and thus a region of the display device that overlaps with the FPC 77 is limited. In contrast, in one embodiment of the present invention, the conductive layer 86c and the oxide layer 21 can be connected to each other through the opening of the resin layer 23 by using the photosensitive material for the resin layer 23. Then, the oxide layer 21 or the conductive layer 86c can be exposed from the side opposite to the display surface by peeling the formation substrate 14 and, after that, the FPC 77 can be electrically connected to the oxide layer 21 or the conductive layer 86c. Therefore, the conductive layer 86c and the FPC 77 can be electrically connected to each other through the opening provided in the resin layer 23. Such a structure allows the FPC 77 to be positioned on the side opposite to the display surface. Thus, a space for bending the FPC 77 in incorporating the display device in an electronic device can be saved, which enables the electronic device to be smaller.

The manufacturing method example 3B is an example in which the peeling method of one embodiment of the present invention is performed twice to fabricate a flexible device. In one embodiment of the present invention, each of the functional elements and the like included in the flexible device is formed over the formation substrate; thus, even in the case where a high-resolution display device is manufactured, high alignment accuracy of the flexible substrate is not required. It is thus easy to attach the flexible substrate.

Modification Example 1B

In one embodiment of the present invention, a display device having a bottom-emission structure can be fabricated.

Figure 25A:
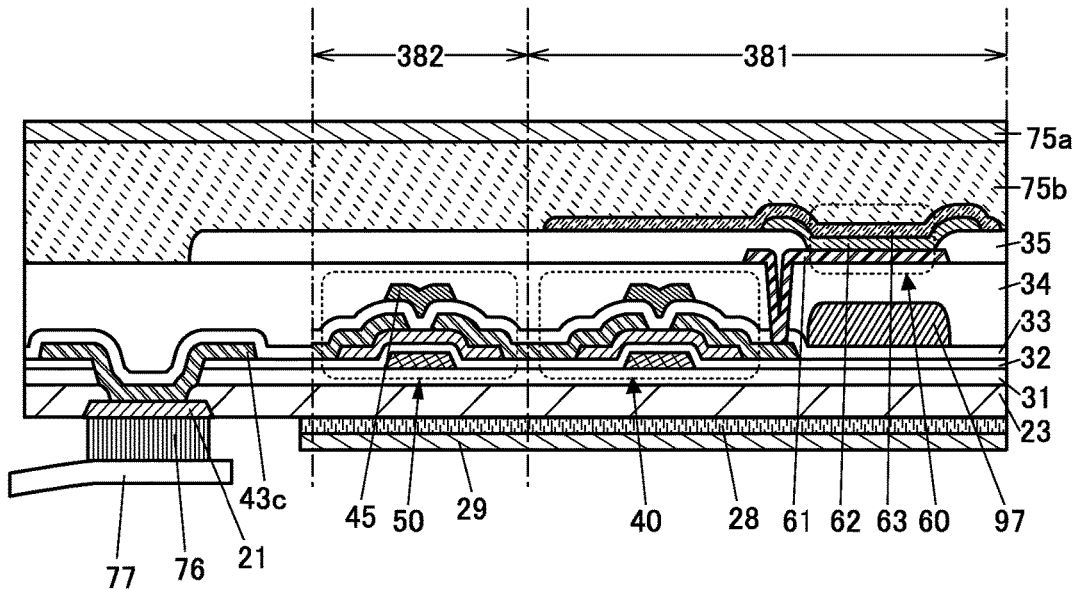
FIGS. 25A and 25B each illustrate an example of a flexible device.

The display device in FIG. 25A is a bottom-emission display device using a color filter method. FIG. 25A is a cross-sectional view of the display portion 381 of the display device, a cross-sectional view of the driver circuit portion 382, and a cross-sectional view of a connection portion for connection to the FPC 77.

The display device in FIG. 25A includes the substrate 29, the bonding layer 28, the resin layer 23, the oxide layer 21, the insulating layer 31, the transistor 40, the transistor 50, the conductive layer 43c, the insulating layer 33, the insulating layer 34, the insulating layer 35, the display element 60, the bonding layer 75b, the substrate 75a, and the coloring layer 97.

FIG. 25A is an example including the transistor 40 and the transistor 50 which are each a transistor in which the conductive layer 45 functioning as a gate is added to the components of the transistor 40 in FIG. 17A.

The display element 60 emits light to the coloring layer 97 side.

The FPC 77 and the oxide layer 21 are electrically connected to each other through the connector 76. In the cross-sectional view of the connection portion for connection to the FPC 77, an example in which the end portion of the insulating layer 35 is not exposed at the end portion of the display device is shown.

Modification Example 2B

Figure 25B:
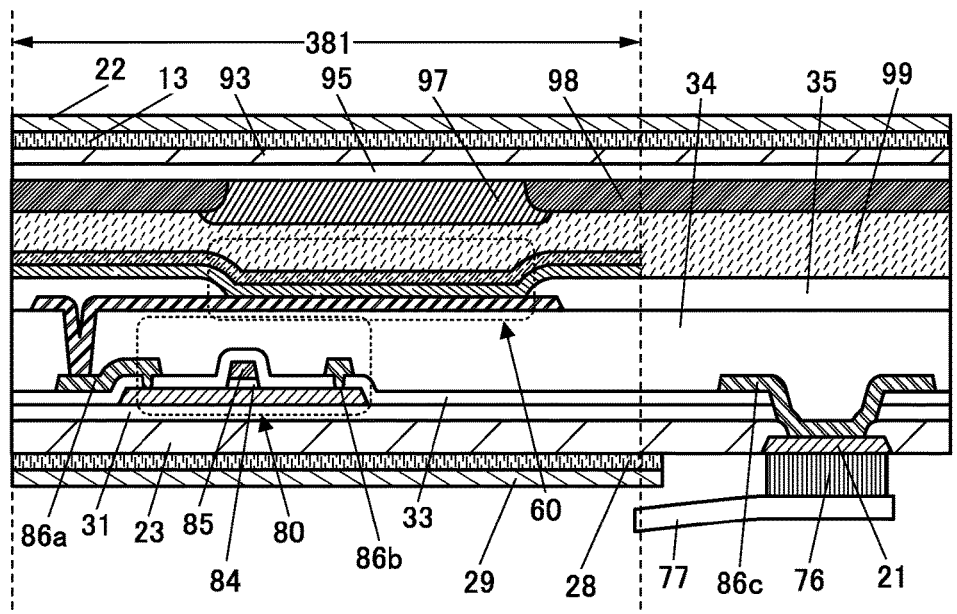

The display device in FIG. 25B is different from the display device in FIG. 24B in that the conductive layer 81 and the insulating layer 82 are not provided in the transistor 80.

As described above, in one embodiment of the present invention, a flexible device can be fabricated by separating the transistor or the like from the formation substrate using the resin layer and the oxide layer.

In one embodiment of the present invention, the resin layer is formed using the photosensitive material; thus, the resin layer with a desired shape can be easily formed. When the conductive layer electrically connected to the oxide layer through the opening of the resin layer is provided, the conductive layer can be electrically connected to the circuit board. The external connection terminal and the circuit board can be electrically connected to each other on the surface opposite to the display surface. Thus, a space for bending the FPC and the like in incorporating the display device in an electronic device can be saved, which enables the electronic device to be smaller.

In one embodiment of the present invention, the fabrication process of the transistor can be performed at a low temperature with the use of an oxide semiconductor in the channel formation region of the transistor. Furthermore, the resin layer can have a small thickness and low heat resistance. Thus, there are advantages in that the material of the resin layer can be selected from a wide range, high mass productivity can be obtained at low cost, and peeling and fabrication of a flexible device can be performed using a large-sized substrate, for example.

This embodiment can be combined with any of the other embodiments as appropriate.

Embodiment 3

In this embodiment, a display module and electronic devices that can be fabricated using one embodiment of the present invention will be described with reference to FIG. 26 and FIGS. 27A to 27F.

Figure 26:
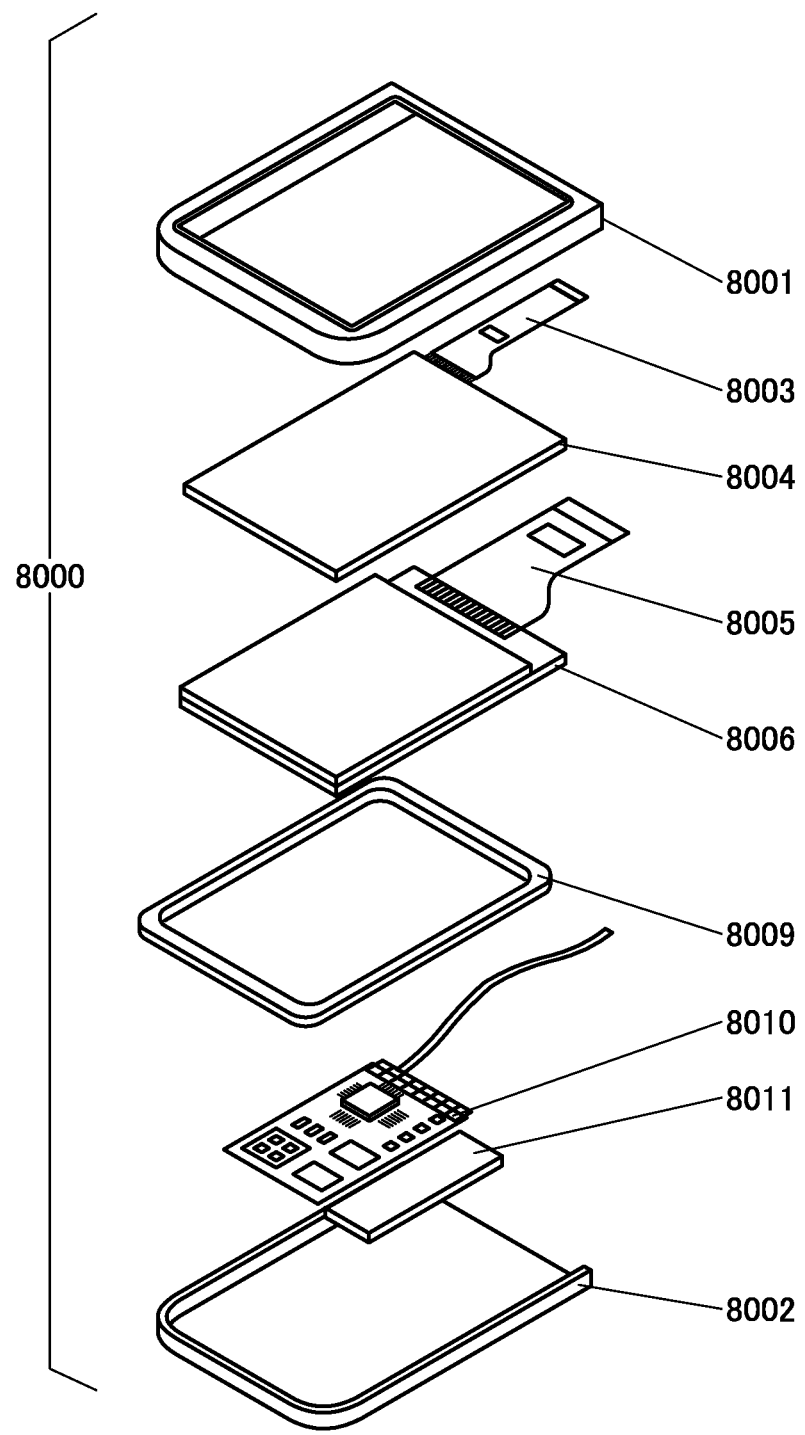
FIG. 26 illustrates an example of a display module.

In a display module 8000 in FIG. 26, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device fabricated using one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. Instead of providing the touch panel 8004, the display panel 8006 can have a touch panel function.

The frame 8009 protects the display panel 8006 and also functions as an electromagnetic shield for blocking electromagnetic waves generated by the operation of the printed circuit board 8010. The frame 8009 may function as a radiator plate.

The printed circuit board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

Highly reliable electronic devices with curved surfaces can be fabricated by one embodiment of the present invention. In addition, flexible and highly reliable electronic devices can be fabricated by one embodiment of the present invention.

Examples of electronic devices include a television set, a desktop or notebook personal computer, a monitor of a computer or the like, a digital camera, a digital video camera, a digital photo frame, a mobile phone, a portable game machine, a portable information terminal, an audio reproducing device, and a large game machine such as a pachinko machine.

The electronic device of one embodiment of the present invention can be incorporated along a curved inside/outside wall surface of a house or a building or a curved interior/exterior surface of a car.

Furthermore, the electronic device of one embodiment of the present invention may include a secondary battery. Preferably, the secondary battery is capable of being charged by contactless power transmission.

Examples of the secondary battery include a lithium-ion secondary battery such as a lithium polymer battery (lithium ion polymer battery) using a gel electrolyte, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, an image, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays).

The electronic device of one embodiment of the present invention can have a variety of functions, for example, a function of displaying a variety of information (e.g., a still image, a moving image, and a text image) on a display portion, a touch panel function, a function of displaying a calendar, date, time, and the like, a function of executing a variety of software (programs), a wireless communication function, and a function of reading a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of taking a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic device of one embodiment of the present invention are not limited thereto, and the electronic devices can have a variety of functions.

Figure 27A:
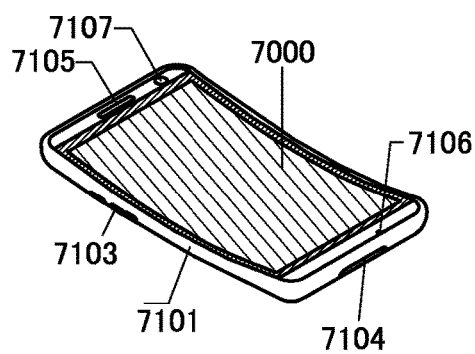
FIGS. 27A to 27F each illustrate an example of an electronic device.
Figure 27B:
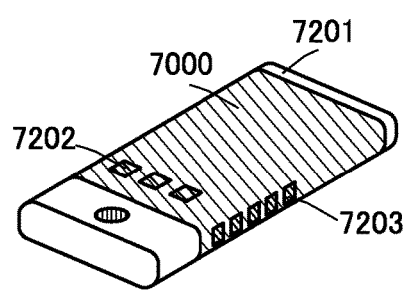
Figure 27C:
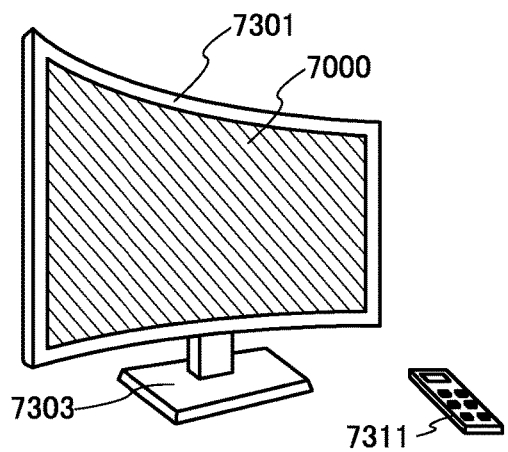

FIGS. 27A to 27C illustrate examples of an electronic device including a display portion 7000 with a curved surface. The display surface of the display portion 7000 is bent, and images can be displayed on the bent display surface. The display portion 7000 may have flexibility.

The display portion 7000 can be formed using the display device of one embodiment of the present invention. One embodiment of the present invention makes it possible to provide a highly reliable electronic device having a curved display portion.

FIG. 27A illustrates an example of a mobile phone. A mobile phone 7110 illustrated in FIG. 27A includes a housing 7101, the display portion 7000, operation buttons 7103, an external connection port 7104, a speaker 7105, a microphone 7106, a camera 7107, and the like.

The mobile phone 7110 includes a touch sensor in the display portion 7000. Operations such as making a call and inputting text can be performed by touch on the display portion 7000 with a finger, a stylus, or the like.

With the operation buttons 7103, power can be on or off. In addition, types of images displayed on the display portion 7000 can be switched; for example, switching from a mail creation screen to a main menu screen can be performed.

When a detection device such as a gyroscope sensor or an acceleration sensor is provided inside the mobile phone, the direction of display on the screen of the display portion 7000 can be automatically changed by determining the orientation of the mobile phone (whether the mobile phone is placed horizontally or vertically). Furthermore, the direction of display on the screen can be changed by touch on the display portion 7000, operation with the operation button 7103, sound input using the microphone 7106, or the like.

FIG. 27B illustrates an example of a portable information terminal. A portable information terminal 7210 illustrated in FIG. 27B includes a housing 7201 and the display portion 7000. The portable information terminal 7210 may also include an operation button, an external connection port, a speaker, a microphone, an antenna, a camera, a battery, or the like. The display portion 7000 is provided with a touch sensor. The operation of the portable information terminal can be performed by touching the display portion 7000 with a finger, a stylus, or the like.

The portable information terminal illustrated in this embodiment functions as, for example, one or more of a telephone set, a notebook, and an information browsing system. Specifically, the portable information terminals each can be used as a smartphone. The portable information terminal illustrated in this embodiment is capable of executing, for example, a variety of applications such as mobile phone calls, e-mailing, reading and editing texts, music reproduction, Internet communication, and a computer game.

The portable information terminal 7210 can display characters, image information, and the like on its plurality of surfaces. For example, three operation buttons 7202 can be displayed on one surface, and information 7203 indicated by a rectangle can be displayed on another surface. FIG. 27B illustrates an example in which the operation buttons 7202 are displayed at the top of the portable information terminal 7210 and the information 7203 is displayed on the side of the portable information terminal 7210. Note that the operation buttons 7202 may be displayed on the side of the portable information terminal 7210 and the information 7203 may be displayed at the top of the portable information terminal 7210, for example. Information may be displayed on three or more surfaces of the portable information terminal 7210.

Examples of the information 7203 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information 7203.

FIG. 27C illustrates an example of a television set. In a television set 7300, the display portion 7000 is incorporated into a housing 7301. Here, the housing 7301 is supported by a stand 7303.

The television set 7300 illustrated in FIG. 27C can be operated with an operation switch of the housing 7301 or a separate remote controller 7311. The display portion 7000 may include a touch sensor, and can be operated by touch on the display portion 7000 with a finger or the like. The remote controller 7311 may be provided with a display portion for displaying data output from the remote controller 7311. With operation keys or a touch panel of the remote controller 7311, channels and volume can be controlled and images displayed on the display portion 7000 can be controlled.

Note that the television set 7300 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

Figure 27D:
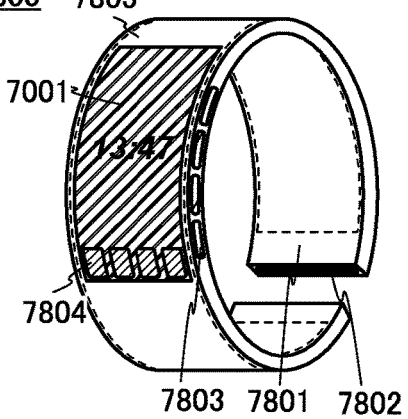
Figure 27E:
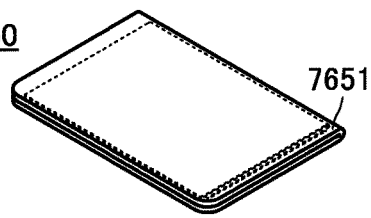
Figure 27F:
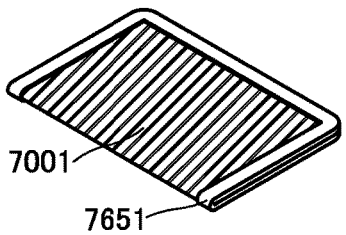

FIGS. 27D to 27F each illustrate an example of a portable information terminal including a flexible and bendable display portion 7001.

The display portion 7001 is fabricated using the display device or the like of one embodiment of the present invention. For example, a display device that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a flexible display portion.

FIG. 27D illustrates an example of a wrist-watch-type portable information terminal. A portable information terminal 7800 includes a band 7801, the display portion 7001, an input/output terminal 7802, operation buttons 7803, and the like. The band 7801 functions as a housing. A flexible battery 7805 can be included in the portable information terminal 7800. The battery 7805 may be arranged to overlap with the display portion 7001, or the band 7801 and the like, for example.

The band 7801, the display portion 7001, and the battery 7805 have flexibility. Thus, the portable information terminal 7800 can be easily curved to have a desired shape.

With the operation buttons 7803, a variety of functions such as time setting, turning on or off of the power, turning on or off of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, an application can be started.

The portable information terminal 7800 can employ near field communication conformable to a communication standard. For example, mutual communication between the portable information terminal and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

FIGS. 27E and 27F illustrate an example of a foldable portable information terminal. FIG. 27E illustrates a portable information terminal 7650 that is folded so that the display portion 7001 is on the inside. FIG. 27F illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged. Note that although FIGS. 27E and 27F illustrate an example of the portable information terminal 7650 that is folded in two, the portable information terminal 7650 may be folded in three, four, or more. The portable information terminal 7650 may include an operation button, an external connection port, a speaker, a microphone, an antenna, a camera, a battery, or the like.

This embodiment can be combined with any of the other embodiments as appropriate.

This application is based on Japanese Patent Application serial no. 2016-079826 filed with Japan Patent Office on Apr. 12, 2016 and Japanese Patent Application serial no. 2016-083657 filed with Japan Patent Office on Apr. 19, 2016, the entire contents of which are hereby incorporated by reference.

What is claimed is:

1. A peeling method comprising the steps of:
    forming an oxide layer over a formation substrate;
    forming a first layer over the oxide layer using a photosensitive material;
    forming an opening in a portion of the first layer by a photolithography method to form a resin layer having the opening, the opening overlapping with the oxide layer;
    forming a transistor including an oxide semiconductor in a channel formation region over the resin layer;
    forming a conductive layer overlapping with the opening and the oxide layer;
    irradiating the oxide layer with light using a laser; and
    separating the transistor and the formation substrate from each other,
    wherein an oxide semiconductor layer or an oxide conductive layer is formed as the oxide layer.

2. The peeling method according to claim 1, wherein the oxide layer releases oxygen by irradiation with the light.

3. The peeling method according to claim 1, wherein the oxide layer contains at least one of indium, zinc, aluminum, gallium, yttrium, and tin.

4. The peeling method according to claim 1, wherein the laser is a linear laser.

5. The peeling method according to claim 1, wherein the conductive layer is formed using a same material and a same fabrication step as an electrode included in the transistor.

6. The peeling method according to claim 1, wherein the first layer is formed using a solution having a viscosity of greater than or equal to 5 cP and less than 100 cP.

7. The peeling method according to claim 1, wherein the first layer is formed with a spin coater.

8. The peeling method according to claim 1, wherein the first layer is formed using a thermosetting material.

9. The peeling method according to claim 8, wherein the resin layer is formed by heating the first layer at a first temperature, and
    wherein the transistor is formed at a temperature lower than the first temperature.

10. The peeling method according to claim 1, wherein the resin layer is formed to have a thickness greater than or equal to 0.1 μm and less than or equal to 3 μm.

11. The peeling method according to claim 1, wherein the oxide layer is irradiated with the light from the formation substrate.

12. A method for manufacturing a flexible device comprising the steps of:

exposing the conductive layer by separating the transistor and the formation substrate from each other using the peeling method according to claim 1; and
electrically connecting the conductive layer and a circuit board to each other through the opening.

13. A method for manufacturing a flexible device comprising the steps of:
exposing the oxide layer by separating the transistor and the formation substrate from each other using the peeling method according to claim 1;
exposing the conductive layer by removing the oxide layer by etching; and
electrically connecting the conductive layer and a circuit board to each other through the opening.

14. A peeling method comprising the steps of:
forming an island-shaped oxide layer over a formation substrate;
forming a first layer over the formation substrate and the island-shaped oxide layer using a photosensitive material;
forming an opening in a portion of the first layer by a photolithography method to form a resin layer having the opening, the opening overlapping with the island-shaped oxide layer;
forming a transistor including an oxide semiconductor in a channel formation region over the resin layer;
forming a conductive layer overlapping with the opening and the island-shaped oxide layer;
irradiating the island-shaped oxide layer and the resin layer with light using a laser; and
separating the transistor and the formation substrate from each other,
wherein an oxide semiconductor layer or an oxide conductive layer is formed as the island-shaped oxide layer.

15. The peeling method according to claim 14,
wherein the resin layer is formed to have a thickness greater than a thickness of the island-shaped oxide layer and less than or equal to 3 μm.

16. The peeling method according to claim 14,
wherein, after the island-shaped oxide layer is formed, plasma treatment is performed on the island-shaped oxide layer using a gas containing one or more kinds selected from a rare gas, hydrogen, boron, phosphorus, and nitrogen.

17. The peeling method according to claim 14,
wherein the island-shaped oxide layer releases oxygen by irradiation with the light.

18. The peeling method according to claim 14,
wherein the island-shaped oxide layer contains at least one of indium, zinc, aluminum, gallium, yttrium, and tin.

19. The peeling method according to claim 14,
wherein the laser is a linear laser.

20. The peeling method according to claim 14,
wherein the conductive layer is formed using a same material and a same fabrication step as an electrode included in the transistor.

21. The peeling method according to claim 14,
wherein the first layer is formed using a solution having a viscosity of greater than or equal to 5 cP and less than 100 cP.

22. The peeling method according to claim 14,
wherein the first layer is formed with a spin coater.

23. The peeling method according to claim 14,
wherein the first layer is formed using a thermosetting material.

24. The peeling method according to claim 23,
wherein the resin layer is formed by heating the first layer at a first temperature, and
wherein the transistor is formed at a temperature lower than the first temperature.

25. The peeling method according to claim 14,
wherein the resin layer is formed to have a thickness greater than or equal to 0.1 μm and less than or equal to 3 μm.

26. The peeling method according to claim 14,
wherein the island-shaped oxide layer is irradiated with the light from the formation substrate.

27. A method for manufacturing a flexible device comprising the steps of:
exposing the conductive layer by separating the transistor and the formation substrate from each other using the peeling method according to claim 14; and
electrically connecting the conductive layer and a circuit board to each other through the opening.

28. A method for manufacturing a flexible device comprising the steps of:
exposing the island-shaped oxide layer by separating the transistor and the formation substrate from each other using the peeling method according to claim 14; and
electrically connecting the island-shaped oxide layer and a circuit board to each other.

* * * * *